(12) United States Patent
Konishi et al.

(10) Patent No.: US 9,947,850 B2
(45) Date of Patent: Apr. 17, 2018

(54) SUBSTRATE FOR LIGHT EMITTING DEVICES AND LIGHT EMITTING DEVICE

(71) Applicant: Sharp Kabushiki Kaisha, Sakai, Osaka (JP)

(72) Inventors: Masahiro Konishi, Sakai (JP); Shin Itoh, Sakai (JP); Hiroyuki Nokubo, Sakai (JP); Yoshiaki Itakura, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/124,724

(22) PCT Filed: Feb. 27, 2015

(86) PCT No.: PCT/JP2015/055950
§ 371 (c)(1),
(2) Date: Sep. 9, 2016

(87) PCT Pub. No.: WO2015/151686
PCT Pub. Date: Oct. 8, 2015

(65) Prior Publication Data
US 2017/0018697 A1  Jan. 19, 2017

(30) Foreign Application Priority Data

Apr. 4, 2014 (JP) ................. 2014-078142
Apr. 23, 2014 (JP) ................. 2014-089621

(51) Int. Cl.
*H01L 29/49* (2006.01)
*H01L 33/64* (2010.01)
(Continued)

(52) U.S. Cl.
CPC ........ *H01L 33/642* (2013.01); *H01L 25/0753* (2013.01); *H01L 33/56* (2013.01);
(Continued)

(58) Field of Classification Search
CPC .................... H01L 33/642; H01L 25/0753
See application file for complete search history.

(56) References Cited

U.S. PATENT DOCUMENTS

| | | | |
|---|---|---|---|
| 6,054,761 A * | 4/2000 | McCormack | ..... H01L 23/49883 174/262 |
| 2006/0108601 A1 | 5/2006 | Okamoto | |
| 2010/0072511 A1* | 3/2010 | Lin | ....... H01L 21/486 257/99 |
| 2010/0103680 A1 | 4/2010 | Oyaizu et al. | |

(Continued)

FOREIGN PATENT DOCUMENTS

| | | |
|---|---|---|
| JP | 59-149958 A | 8/1984 |
| JP | 2006-179856 A | 7/2006 |

(Continued)

OTHER PUBLICATIONS

Official Communication issued in International Patent Application No. PCT/JP2015/055950, dated May 26, 2015.

*Primary Examiner* — Michael Shingleton
(74) *Attorney, Agent, or Firm* — Keating & Bennett, LLP

(57) ABSTRACT

In order to provide a substrate for light emitting devices having high heat radiating properties, dielectric strength voltage properties, light reflectivity, and excellent mass productivity, a substrate (5) includes an intermediate layer (11) containing ceramic which is formed on the surface of the aluminum base (10) by using an aerosol deposition method.

4 Claims, 22 Drawing Sheets

(51) Int. Cl.
*H05K 1/05* (2006.01)
*H01L 25/075* (2006.01)
*H01L 33/56* (2010.01)
*H01L 33/60* (2010.01)
*H01L 33/62* (2010.01)
*F21K 9/00* (2016.01)
*F21V 29/77* (2015.01)
*H05K 3/44* (2006.01)
*F21Y 105/10* (2016.01)
*F21Y 115/10* (2016.01)

(52) U.S. Cl.
CPC .............. *H01L 33/60* (2013.01); *H01L 33/62* (2013.01); *H01L 33/641* (2013.01); *H05K 1/053* (2013.01); *F21K 9/00* (2013.01); *F21V 29/773* (2015.01); *F21Y 2105/10* (2016.08); *F21Y 2115/10* (2016.08); *H01L 2224/16225* (2013.01); *H01L 2933/005* (2013.01); *H01L 2933/0058* (2013.01); *H01L 2933/0066* (2013.01); *H01L 2933/0075* (2013.01); *H05K 3/44* (2013.01); *H05K 2201/0179* (2013.01); *H05K 2201/10106* (2013.01)

(56) References Cited

U.S. PATENT DOCUMENTS

| 2012/0113650 | A1 | 5/2012 | Inoue |
| 2013/0153945 | A1 | 6/2013 | Kobayashi et al. |
| 2014/0327024 | A1 | 11/2014 | Ishihara et al. |
| 2015/0084080 | A1 | 3/2015 | Kawakita et al. |
| 2015/0155459 | A1 | 6/2015 | Ishihara et al. |
| 2016/0351748 | A1* | 12/2016 | Park .................... H01L 33/007 |

FOREIGN PATENT DOCUMENTS

| JP | 2006-332382 A | 12/2006 |
| JP | 2007-096032 A | 4/2007 |
| JP | 2007-165507 A | 6/2007 |
| JP | 2007-317701 A | 12/2007 |
| JP | 2008-205453 A | 9/2008 |
| JP | 2010-135749 A | 6/2010 |
| JP | 2011-023475 A | 2/2011 |
| JP | 2011-249481 A | 12/2011 |
| JP | 2012-069749 A | 4/2012 |
| JP | 2012-102007 A | 5/2012 |
| JP | 2012-226227 A | 11/2012 |
| JP | 2013-128081 A | 6/2013 |
| WO | 2013/121787 A1 | 8/2013 |
| WO | 2013/183693 A1 | 12/2013 |

* cited by examiner

301: LIGHT EMITTING DEVICE
302: BASE
303: ELECTRODE PATTERN
304: LIGHT EMITTING ELEMENT
305: LIGHT-REFLECTING RESIN FRAME
306: PHOSPHOR-CONTAINING SEALING RESIN
307: ANODE ELECTRODE
308: CATHODE ELECTRODE
309: ANODE MARK
310: CATHODE MARK

302: BASE
303: ELECTRODE PATTERN
304: LIGHT EMITTING ELEMENT
311: INTERMEDIATE LAYER
312: REFLECTIVE LAYER
320: SUBSTRATE

302: BASE
303: ELECTRODE PATTERN
304: LIGHT EMITTING ELEMENT
311: INTERMEDIATE LAYER
312: REFLECTIVE LAYER
320: SUBSTRATE
250: BUFFER LAYER

SUBSTRATE FOR LIGHT EMITTING DEVICES AND LIGHT EMITTING DEVICE

TECHNICAL FIELD

The present invention relates to a substrate for light emitting devices, a light emitting device using the substrate for light emitting devices, and a manufacturing method of a substrate for light emitting devices. The invention particularly relates to a substrate for light emitting devices having high dielectric strength voltage properties and heat radiating properties.

BACKGROUND ART

High reflectivity, high heat radiating properties, dielectric strength voltage, and long-term reliability can be exemplified as basic properties necessary for a substrate for light emitting devices. High dielectric strength voltage properties are particularly necessary for a substrate for light emitting devices used in high-intensity lighting.

In the related art, a light emitting device including a ceramic substrate or a substrate including an organic resist layer on a metal base as an insulating layer has been known as a substrate for light emitting devices. Hereinafter, respective problems of a ceramic substrate and a substrate using a metal base will be described.

(Ceramic Substrate)

For example, a ceramic substrate is manufactured by forming an electrode pattern on a plate-like ceramic base. The brightness is required to be improved by arranging a plurality of light emitting elements on the substrate, in accordance with a tendency of realizing high output of a light emitting device, and therefore, ceramic substrates have been increasing in size every year.

Specifically, in a case of realizing a typical LED (light emitting diode) light emitting device using supplied power of 30 W by arranging, for example, face-up type (an active layer is positioned to be far from a mounting surface) blue LED elements having a dimension of 650 µm×650 µm or approximately the dimension thereof in one substrate classified as a medium-size substrate, approximately 100 blue LED elements are necessary. As a ceramic substrate in which approximately 100 blue LED elements are arranged, a ceramic substrate having a horizontal size of 20 mm×20 mm or larger and a thickness of approximately 1 mm is used, for example.

In a case where it is attempted to realize a light emitting device for brighter LED lighting using supplied power of 100 W or higher, a large-sized ceramic substrate having at least a horizontal size of 40 mm×40 mm or larger which can mount 400 or more blue LED elements at once is necessary, as a result of technological development based on an increase in size of a substrate.

However, increasing a size of a ceramic substrate has been attempted in order to realize a larger size on a commercial basis in accordance with the requirements of an increase in size of a ceramic substrate, but a larger size thereof is difficult to realize on a commercial basis due to three problems of strength, manufacturing precision, and manufacturing cost of a ceramic substrate.

Specifically, since a ceramic material is normally a piece of pottery, a problem regarding strength of a ceramic substrate occurs, when a size thereof is increased. When a thickness of a substrate is increased in order to solve this problem, new problems occur such that heat resistance increases (heat radiating properties are deteriorated) and a material cost of a ceramic substrate also increases. When a size of a ceramic substrate is increased, not only external dimensions of a ceramic substrate, but dimensions of an electrode pattern formed on a ceramic substrate are also likely changed, and this may easily result in a decrease in manufacturing yield of a ceramic substrate and an increase in manufacturing cost of a ceramic substrate.

An increase in the number of light emitting elements to be mounted on a ceramic substrate is also a problem along with the problems associated with an increase in size of a ceramic substrate. For example, in the light emitting device described above, the number of light emitting elements mounted on one ceramic substrate is extremely large, as much as 400 or more, and this is a reason for a decrease in manufacturing yield.

In addition, in a face-up type light emitting element, an active layer is positioned on a side far from a light emitting element mounting surface of a substrate for light emitting devices, and accordingly, heat resistance up to a portion of an active layer is high and an active layer temperature easily increases. In a high-output light emitting device having the large number of light emitting elements to be accumulated on one ceramic substrate, a substrate temperature which is a basic condition is high, an active layer temperature of a light emitting element is further increased, together with the substrate temperature, and a decrease in lifetime of a light emitting element becomes significant.

(Substrate Using Metal Base)

Meanwhile, a metal base having high thermal conductivity may be used as a substrate for high-output light emitting devices, in order to solve the problems in a ceramic substrate. Here, an insulating layer is provided on a metal base, in order to mount light emitting elements on a metal base and in order to form an electrode pattern connected to the light emitting elements.

In a substrate for light emitting devices, an organic resist is used as a material used as an insulating layer, in the related art.

In addition, it is necessary that the insulating layer has high light reflectivity, in order to improve light use efficiency in a substrate for high-output light emitting devices.

However, in a case of using an organic resist as an insulating layer in a substrate for light emitting devices in the related art, sufficient thermal conductivity, heat resistance, and light resistance are not obtained and dielectric strength voltage properties necessary for a substrate for high-output light emitting devices are not obtained. It is necessary that light leaked to a metal base side through an insulating layer is reflected, in order to improve light use efficiency, but sufficient light reflectivity is not obtained in a configuration in which an organic resist of the related art is used as an insulating layer.

Therefore, a substrate in which an insulator layer is formed on a substrate using a metal base, by using a ceramic coating material has been proposed.

It is possible to realize a substrate for light emitting devices having excellent reflectivity, heat resistance, and light resistance, in a substrate for light emitting devices in which a light reflecting layer which also serves as an insulator layer is formed on a metal base surface by using a ceramic coating material. PTL 1 discloses a forming method of the light reflecting layer which also serves as an insulator layer of applying a ceramic coating material onto a base.

PTL 5 below discloses a technology of forming an insulating layer formed of ceramic such as alumina on a metal base which is a base by plasma spraying, without using a coating material, and manufacturing a substrate for a light source, for example. In the substrate for a light source in which an alumina insulating layer is formed by plasma spraying as described above, it is possible to realize a substrate for a light source having excellent electrical dielectric strength voltage properties.

In addition, PTL 6 below discloses a technology of forming a ceramic layer on a surface of a metal substrate by using an aerosol deposition method (hereinafter, also referred to as an "AD method").

CITATION LIST

Patent Literature

PTL 1: Japanese Unexamined Patent Application Publication No. 59-149958 (published in Aug. 28, 1984)
PTL 2: Japanese Unexamined Patent Application Publication No. 2012-102007 (published in May 31, 2012)
PTL 3: Japanese Unexamined Patent Application Publication No. 2012-69749 (published in Apr. 5, 2012)
PTL 4: Japanese Unexamined Patent Application Publication No. 2006-332382 (published in Dec. 7, 2006)
PTL 5: Japanese Unexamined Patent Application Publication No. 2007-317701 (published in Dec. 6, 2007)
PTL 6: Japanese Unexamined Patent Application Publication No. 2006-332382 (published in Dec. 7, 2006)

SUMMARY OF INVENTION

Technical Problem

However, in a case of a substrate for light emitting devices in which a light reflecting layer which also serves as an insulator layer is formed on a metal base surface using a ceramic coating material, excellent reflectivity and heat radiating properties are obtained, but dielectric strength voltage properties are low. For example, in a case where it is attempted to realize a light emitting device for bright LED lighting using supplied power of 100 W or higher by using the substrate described above, it is difficult to ensure high dielectric strength voltage properties necessary for a substrate for light emitting devices for the purpose of high-intensity lighting, unlike the case of the ceramic substrate.

This is due to the reason described below. In a high-intensity type lighting requiring brightness, light emitting elements are generally connected to each other in series and light emitting is performed at a high voltage. From viewpoints of short circuit prevention and safety, the entire light emitting device needs to have dielectric strength voltage properties of 4 to 5 kV or higher, for example, in such a lighting device, and a substrate for light emitting devices also needs to have the equivalent dielectric strength voltage properties, in many cases.

In a ceramic substrate having problems such as a decrease in manufacturing yield and an increase in manufacturing cost of a substrate, a thickness of an insulating layer is increased and a level of dielectric strength voltage properties corresponding thereto are easily obtained. With respect to this, in a case of a substrate for light emitting devices in which a light reflecting layer which also serves as an insulator layer is formed on a metal base surface by using a ceramic coating material, it is difficult to form the insulating layer and stably realize insulating properties. When the desired high dielectric strength voltage properties are stably ensured by increasing a thickness of the light reflecting layer which also serves as an insulator layer, heat resistance increases and heat radiating properties decrease.

A substrate for light emitting devices in which an alumina insulating layer is formed by plasma spraying disclosed in PTL 5 is a substrate for light emitting devices having excellent electrical dielectric strength voltage properties and excellent heat radiating properties.

Even when it is attempted to obtain alumina by thermal spraying such as plasma spraying, a representative particle diameter of ceramic particles used in thermal spraying is, for example, 10 μm to 50 μm, and accordingly, a surface of an alumina insulating layer formed by using thermal spraying is corrugated. A representative dimension of the corrugation at this time is approximately 40 μm. Even in a case where a particle diameter of the ceramic particles used is decreased as 5 μm to 40 μm, the representative dimension of the corrugation is large as approximately 20 μm.

As described above, a surface of the alumina insulating layer formed by plasma spraying is a corrugated surface, and accordingly, in a case where face-up type light emitting elements are mounted on the alumina insulating layer formed by plasma spraying, thermal contact between the light emitting elements and the alumina layer is limited to point contact between a lower surface of the light emitting elements and protruded portions of the alumina layer and heat resistance significantly increases. As described above, in the face-up type light emitting element, the active layer is positioned on a side far from the light emitting element mounting surface of the substrate for light emitting devices, and accordingly, an active layer temperature easily increases. When high heat resistance is imparted between the light emitting element and the alumina layer as described above, a temperature increases to be substantially proportional to power supplied to the light emitting element. Therefore, in a high-output light emitting device having high power supplied to one light emitting element, an active layer temperature of the light emitting element rapidly increases and the lifetime of the light emitting element decreases. As described above, the substrate for a light source in which the alumina insulating layer is formed on the metal base by plasma spraying has deteriorated heat radiating properties.

Since the surface of the alumina insulating layer formed by plasma spraying is a corrugated surface, metal electrodes are hardly formed. For example, in a case where a base circuit pattern is formed by printing metal paste and is coated by plating, so that electrodes are formed on a ceramic flat plate, defects are generated in printing of paste on a corrugated surface. Scratches are easily generated in the paste printing and this becomes a reason for defects formed during plating. Since a boundary of a printed portion is not clearly shown due to the influence on a corrugated surface, the finish of plating does not become uniform.

In a substrate for light emitting devices in which an alumina insulating layer is formed by using the AD method disclosed in PTL 6, the maximum reflectivity of a layer formed of only alumina by using the AD method is 85%. Even when excellent light reflectivity is obtained, reflectivity exceeding 90% to 95% used in high-intensity lighting may not be obtained. Accordingly, as a substrate for light emitting devices used in high-intensity lighting in which 90% or more and 95% or more of reflectivity is necessary, the reflectivity described above is low.

As described above, in the substrate for light emitting devices using a metal as a base in the related art, a substrate having low heat resistance, excellent heat radiating properties, dielectric strength voltage properties, and high light reflectivity is not suitable at least for mass production.

The present invention has been made to address the aforementioned problems and provide a substrate for light emitting devices having high heat radiating properties, dielectric strength voltage properties, high light reflectivity, and excellent mass productivity, and a light emitting device using the substrate for light emitting devices.

Solution to Problem

In order to solve the above-mentioned problems, according to an aspect of the invention, there is provided a substrate for light emitting devices including: a base containing a metal material; a first insulating layer having thermal conductivity which is formed on one surface of the base; a second insulating layer having light reflectivity which is formed on the first insulating layer; and a wiring pattern which is formed on the second insulating layer, in which the first insulating layer is formed of ceramic which is formed by using an aerosol deposition method and reinforces dielectric strength voltage properties of the second insulating layer.

In order to solve the above-mentioned problems, according to another aspect of the invention, there is provided a substrate for light emitting devices including: a base containing a metal material; a first insulating layer having thermal conductivity and light reflectivity which is formed on one surface of the base; and a wiring pattern which is formed on the first insulating layer, in which the first insulating layer contains ceramic formed by using the aerosol deposition method and an additive of an inorganic material for improving brightness.

In order to solve the above-mentioned problems, according to still another aspect of the invention, there is provided a substrate for light emitting devices including: a base containing a metal material; a first insulating layer having thermal conductivity which is formed on one surface of the base; a second insulating layer having thermal conductivity and light reflectivity which is formed on the first insulating layer; and a wiring pattern which is formed on the second insulating layer, in which the first insulating layer is formed of ceramic formed by using an aerosol deposition method, the second insulating layer contains ceramic which is formed by using the aerosol deposition method, and the second insulating layer further contains an additive of an inorganic material for improving brightness, or all of ceramic of the second insulating layer which is formed by using the aerosol deposition method is configured with ceramic having high brightness.

In order to solve the above-mentioned problems, according to still another aspect of the invention, there is provided a substrate for light emitting devices including: a base containing a metal material; a first insulating layer having thermal conductivity which is formed on one surface of the base; a second insulating layer having light reflectivity which is formed on the other surface of the base; and a wiring pattern which is formed on the second insulating layer, in which the first insulating layer is formed of ceramic which is formed by using an aerosol deposition method and reinforces dielectric strength voltage properties of the second insulating layer.

In order to solve the above-mentioned problems, according to still another aspect of the invention, there is provided a substrate for light emitting devices including: a base containing a metal material; a first insulating layer having thermal conductivity which is formed on one surface of the base; a wiring pattern which is formed on the first insulating layer; and a second insulating layer having light reflectivity which is formed on the first insulating layer and on some parts of the wiring pattern so that some parts of the wiring pattern are exposed, in which the first insulating layer is formed of ceramic which is formed by using an aerosol deposition method.

In order to solve the above-mentioned problems, according to still another aspect of the invention, there is provided a light emitting device including: the substrate for light emitting devices according to the invention; light emitting elements; lands or connectors for connecting the light emitting elements to an external wiring or an external device; a frame formed of a resin having light reflectivity which is formed so as to surround a region of the substrate for light emitting devices where the light emitting elements are disposed; and a sealing resin which seals the region surrounded by the frame.

Advantageous Effects of Invention

According to the aspect of the invention, it is possible to provide a substrate for light emitting devices having heat radiating properties, dielectric strength voltage properties, high light reflectivity, and excellent mass productivity.

DESCRIPTION OF EMBODIMENTS

Hereinafter, embodiments of the invention will be described in detail.

Embodiment 1

(Configuration of Lighting Device 1)

Embodiment 1 will be described as follows with reference to FIG. 1 to FIG. 8.

Figure 1:
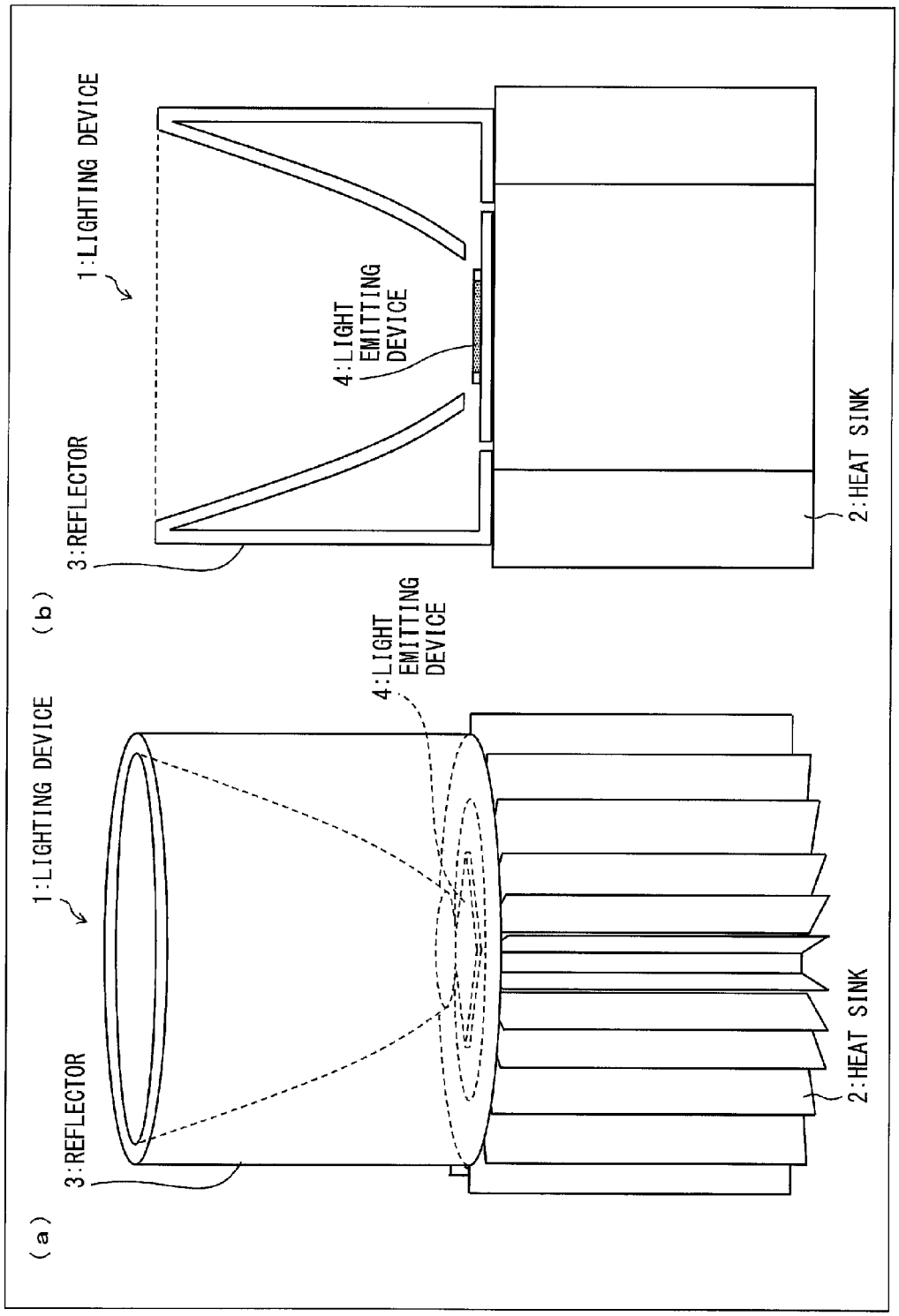
FIG. 1(a) is a perspective view showing appearance of a lighting device according to Embodiment 1 and FIG. 1(b) is a sectional view of the lighting device.

FIG. 1(a) is a perspective view showing appearance of a lighting device 1 according to Embodiment 1 and FIG. 1(b) is a sectional view of the lighting device 1. The lighting device 1 includes a light emitting device 4, a heat sink 2 for radiating heat generated from the light emitting device 4, and a reflector 3 which reflects light emitted from the light emitting device 4. FIG. 1 shows an example in which the light emitting device 4 according to Embodiment 1 is applied to the lighting device 1.

Figure 2:
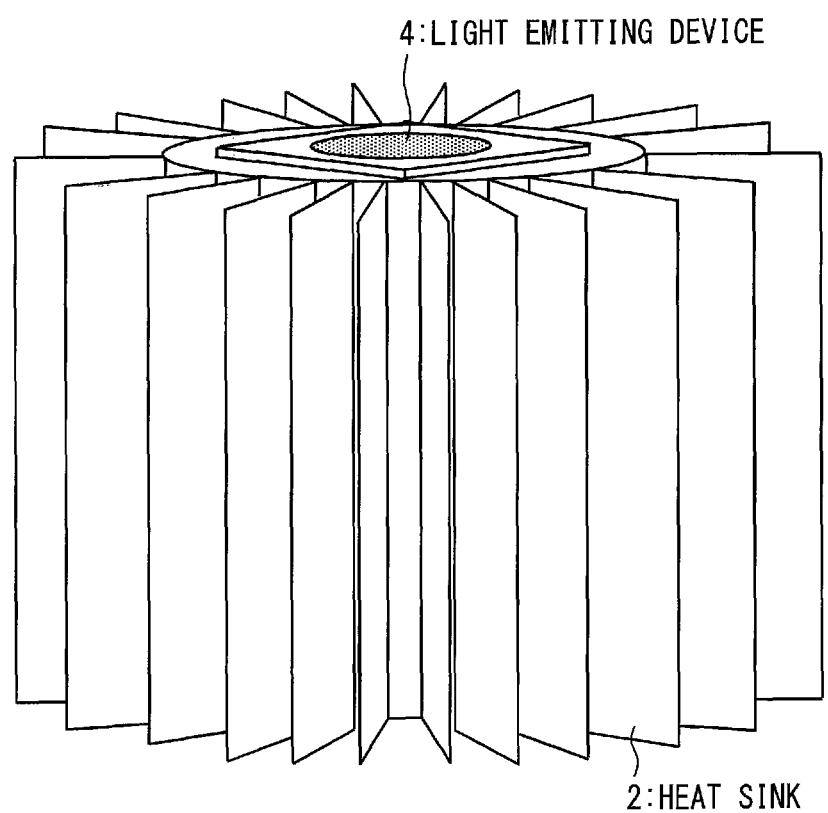
FIG. 2 is a perspective view of appearance of a light emitting device and a heat sink according to Embodiment 1.

FIG. 2 is a perspective view of appearance of the light emitting device 4 and the heat sink 2 according to Embodiment 1. The light emitting device 4 may be used to be mounted on the heat sink 2.

(Configuration of Light Emitting Device 4)

Figure 3:
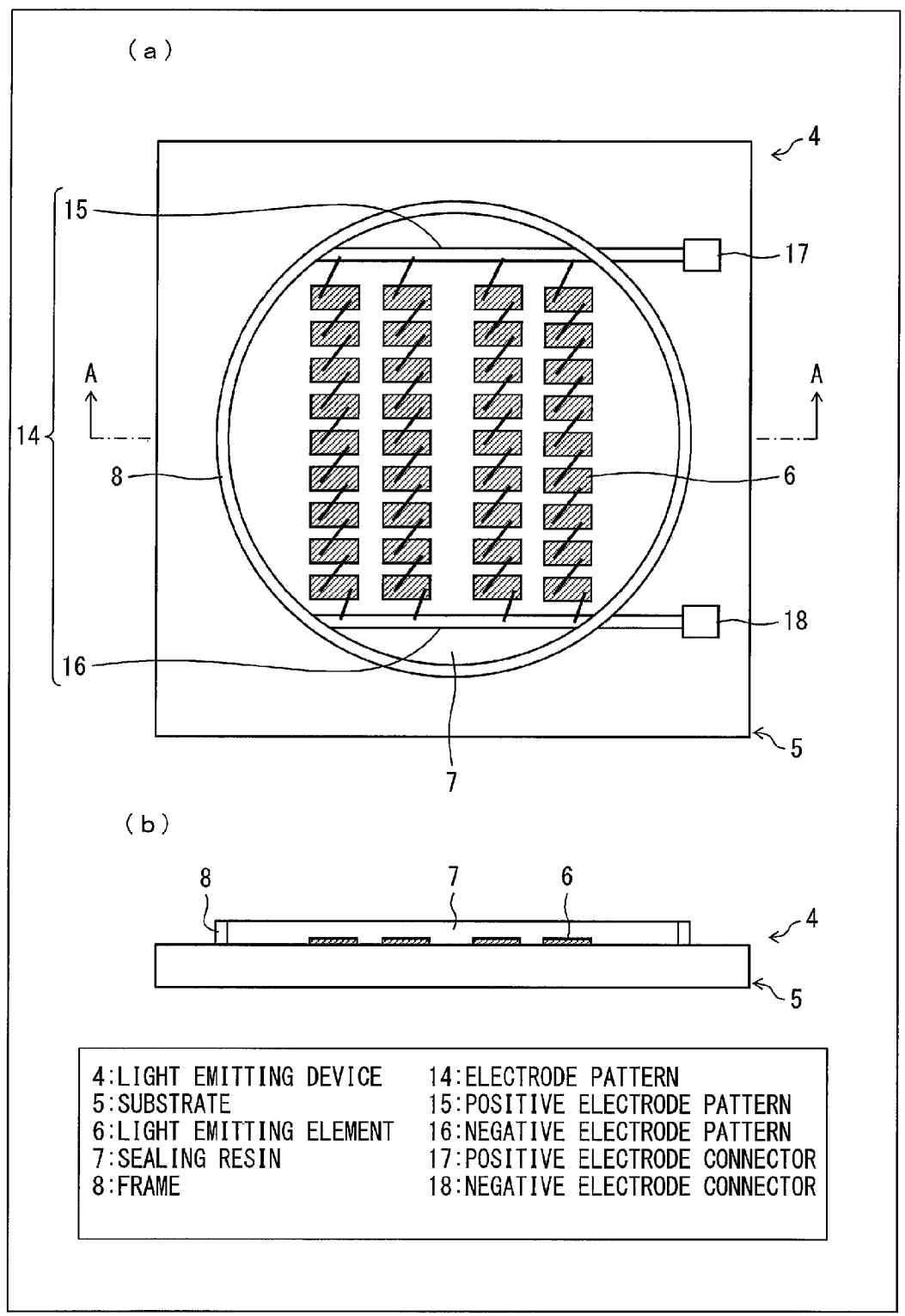
FIG. 3(a) is a plan view showing a configuration of the light emitting device and FIG. 3(b) is a sectional view taken along a plane AA shown in FIG. 3(a).

FIG. 3(a) is a plan view showing a configuration of the light emitting device 4 and FIG. 3(b) is a sectional view taken along a plane AA shown in FIG. 3(a). In FIG. 3, the significant number of light emitting elements 6 is omitted for convenience, due to simplification. A dimension, a shape, a number, and the like are not always the same as actual values of a substrate, a light emitting element, and a light emitting device, and this applies to all drawings.

The light emitting device 4 is a chip-on-board (COB) type light emitting device in which light emitting elements 6 such as a plurality of LED elements or electro-luminescence (EL) elements are mounted on a substrate (substrate for light emitting devices) 5.

A disc-shaped frame 8 provided in the circumference of a sealing resin 7 and surrounding the periphery of the plurality of light emitting elements 6 is provided on the substrate 5. The inside of the frame 8 is filled with the sealing resin 7 to seal the light emitting elements 6. The sealing resin 7 contains a phosphor which is excited by light emitted from the light emitting elements 6 and converts the emitted light to light at a different wavelength. By using this configuration, the light emitting elements 6 perform plane emission using the surface of the sealing resin 7.

Since the plurality of light emitting elements 6 are laminated, the power supplied to the light emitting device 4 may be 10 W, 50 W, 100 W, or 100 W or higher, high-intensity emitted light is obtained from the light emitting device 4 to which the power is supplied. For example, in order to realize the high-output light emitting device 4 having the supplied power of approximately 100 W by accumulating medium-sized light emitting elements 6 having a size of approximately 500 µm×800 µm on the substrate 5, it is necessary to accumulate the large number of light emitting elements 6 the number of which is approximately 300 to 400. Since the light emitting device 4 performs great heat radiating by accumulating the large number of light emitting elements 6, high heat radiating properties from the light emitting device 4 may be ensured by mounting the light emitting device 4 on the heat sink 2 having significantly larger volume than the light emitting device 4, as shown in FIG. 2.

As the light emitting elements 6, blue LED chips, violet LED chips, and ultraviolet LED chips may be used, for example. As a phosphor filled in the sealing resin 7, a phosphor which emits any colored light of blue, green, yellow, orange, and red light beams, for example, or a combination of plural arbitrary phosphors may be used. Accordingly, it is possible to emit light having desired color from the light emitting device 4. The phosphor of the sealing resin 7 may be omitted, and three colored light emitting elements 6 of blue, green, and red light emitting elements having different light emitting wavelengths may be arranged on the substrate 5, the light emitting elements 6 having a combination of arbitrary two colors may be arranged, or the single-colored light emitting element 6 may be arranged.

(Configuration of Substrate 5)

FIG. 4(a) is a plan view showing a configuration of the substrate 5 provided in the light emitting device 4, FIG. 4(b) is a sectional view taken along a plane BB shown in FIG. 4(a), and FIG. 4(c) is an enlarged view of a part of the sectional view.

The substrate 5 is used in the light emitting device 4 (see FIG. 3) in which the plurality of light emitting elements 6 (see FIG. 3) are disposed on the substrate.

The substrate 5 includes an aluminum base 10 (base). As shown in FIG. 4(c), an intermediate layer 11 (first insulating layer), a reflective layer 12 (second insulating layer), and an electrode pattern (wiring pattern) 14 are formed, in this order, on a surface of the aluminum base 10.

The intermediate layer 11 is formed so as to cover the surface (based on FIG. 4(c)) of the aluminum base 10. The reflective layer 12 is formed on the upper surface of the intermediate layer 11 on the surface of the aluminum base 10. That is, the intermediate layer 11 is formed between the reflective layer 12 and the aluminum base 10.

The electrode pattern 14 is formed on the reflective layer 12. As shown in FIG. 4(a) and FIG. 4(b), the electrode pattern 14 includes a positive electrode pattern (wiring pattern) 15 and a negative electrode pattern (wiring pattern) 16. The electrode pattern 14 is formed of a base circuit pattern (not shown) formed of a conductive layer and a plating covering the circuit pattern. The electrode pattern 14 is a wiring for realizing electrical connection between the light emitting elements 6 (see FIG. 3) disposed on the substrate 5. As shown in FIG. 3, the light emitting elements 6 are connected to the electrode pattern 14 through wires, for example, and the face-up type light emitting elements 6 are mounted on the reflective layer 12.

The light emitting elements 6 are connected to the positive electrode pattern 15 and the negative electrode pattern 16. The positive electrode pattern 15 is connected to a positive electrode connector 17 for connecting the light emitting elements 6 to an external wiring or an external device through the positive electrode pattern 15. The negative electrode pattern 16 is connected to a negative electrode connector 18 for connecting the light emitting elements 6 to an external wiring or an external device through the negative electrode pattern 16. Instead of the positive electrode connector 17 and the negative electrode connector 18, the electrode pattern may be configured with lands, and the positive electrode pattern 15 and the negative electrode pattern 16 may be directly connected to an external wiring or an external device by using soldering.

In a case of connecting the positive electrode pattern 15 and the negative electrode pattern 16 to an external wiring or an external device by using the positive electrode connector 17 and the negative electrode connector 18, respective lands may be provided in the positive electrode pattern 15 and the negative electrode pattern 16 to connect the positive electrode pattern 15 and the positive electrode connector 17 to each other and connect the negative electrode pattern 16 and the negative electrode connector 18, through the lands.

In Embodiment 1, the intermediate layer 11 which is a ceramic insulator having thermal conductivity and the reflective layer 12 which is a ceramic insulator having light reflectivity are formed between the electrode pattern 14 and the aluminum base 10 as insulating layers. The intermediate layer 11 is formed between the reflective layer 12 and the aluminum base 10. In a case where the intermediate layer 11 and the reflective layer 12 are compared to each other, it is desired that the thermal conductivity of the intermediate layer is higher than that of the reflective layer and the light reflectivity of the reflective layer is higher than that of the intermediate layer. By using the configuration described above, the substrate 5 may stably ensure high thermal conductivity, high dielectric strength voltage properties, and high reflectivity. A thickness of the reflective layer 12 is desirably smaller than a thickness of the intermediate layer 11. Each layer will be described in detail below.

(Specific Configuration of Aluminum Base 10)

As the aluminum base 10, an aluminum base having a vertical length of 50 mm, a horizontal length of 50 mm, and a thickness of 3 mmt can be used, for example. The advantages of an aluminum material are light weight, excellent workability, and high thermal conductivity. In addition, components other than aluminum may be contained in the aluminum base 10 in a range not disturbing anodic oxidation performed for forming a protective layer 13.

The material of the base is not limited thereto. Any material may be used as long as it is a metal material having light weight, excellent workability, and high thermal conductivity, and a copper material can be used as a material of the base, for example. An alloy of copper containing components other than copper may be used.

(Specific Configuration of Reflective Layer 12)

The reflective layer 12 contains light reflective ceramic which reflects light from the light emitting elements 6 (see FIG. 3) and has insulating properties. Accordingly, the reflective layer 12 reflects light from the light emitting elements 6 (see FIG. 3). The reflective layer 12 is formed between the electrode pattern 14 and the intermediate layer 11, that is, between the electrode pattern 14 and the aluminum base 10. The reflective layer 12 is formed on an outermost layer of the substrate 5 as an insulating reflective layer containing ceramic particles, by performing hardening of ceramic particles mixed with a glass binder or a resin binder having light resistance and heat resistance by drying or firing. In Embodiment 1, the reflective layer 12 is a mixed layer of light-reflectivity ceramic and vitreous matters. The reflective layer 12 contains zirconia as light-reflectivity ceramic and is formed by using a glass binder by performing sintering.

The glass binder is a sol-like material which synthesizes glass particles due to a sol-gel reaction. The resin binder is configured with an epoxy resin, a silicone resin, a fluorine resin, or a polyimide resin having excellent heat resistance and light resistance and high transparency. The glass binder has excellent heat resistance and light resistance and high thermal conductivity, compared to the resin binder, and accordingly, it is more preferable to use the glass binder.

A firing temperature of the glass binder using the sol-gel method is comparatively low as 200° C. to 500° C., and in a case of using the glass binder in the reflective layer 12, the aluminum base 10 or the intermediate layer 11 is not damaged during a manufacturing step, when a suitable temperature is selected. Even in a case of using the resin binder in the reflective layer 12, the aluminum base 10 or the intermediate layer 11 is not damaged, in the same manner as described above.

As main materials of the light-reflectivity ceramic material used in the reflective layer 12, titanium oxide particles, alumina particles, and aluminum nitride particles are used in addition to the zirconia particles. In addition thereto, high-reflective ceramic materials may be used.

The ceramic material herein is not limited to a metal oxide and may be an insulating material which reflects light from the light emitting elements 6 (see FIG. 3). For example, the ceramic material contains ceramic in a broad sense containing aluminum nitride, that is, all of inorganic solid materials. Among these inorganic solid materials, an arbitrary material may be used as the light-reflectivity ceramic material of the reflective layer 12, as long as it is a stable material having excellent heat resistance and thermal conductivity and a material having excellent light reflectivity and light scattering. Accordingly, the material causing light absorption is not suitable as the ceramic material of the reflective layer 12. For example, the color of silicon nitride, silicon carbide, and the like is normally black and is not suitable as a ceramic material used in the reflective layer 12.

It is desirable that a thickness of the reflective layer 12 is approximately from 50 μm to 100 μm, for example, by considering the reflectivity of the substrate 5. Since the thermal conductivity of the reflective layer 12 is lower than that of the intermediate layer 11, it is desirable that the thickness of the reflective layer 12 is a minimum thickness necessary for ensuring the desired light reflection function. The thickness of the reflective layer 12 is suitably set to be approximately 50 μm to 100 μm as the thickness for achieving the object. In a case where the surface of the intermediate layer 11 has a corrugated shape, the reflective layer 12 functions as a layer which embeds the convex and concave portions of the surface of the intermediate layer 11 to flatten a surface loaded on the light emitting elements 6. As will be described later, since the intermediate layer 11 used in Embodiment 1 is a ceramic layer formed by using the AD method, a depth of the convex and concave portions of the surface of the intermediate layer 11 is small as 1 to 3 μm. As described above, the intermediate layer 11 of Embodiment 1 is formed by using the AD method, and accordingly, when flatness of the intermediate layer 11 is higher than that of the ceramic layer formed by thermal spraying, and thus an effect of flatness of the reflective layer 12 is limited.

(Specific Configuration of Intermediate Layer 11)

The intermediate layer 11 is formed by laminating a ceramic layer on the aluminum base 10 by using the AD method and has insulating properties. That is, the intermediate layer 11 contains ceramic formed by using the AD method. As described above, since the reflective layer 12 has a minimum thickness necessary for ensuring the light reflecting function, the dielectric strength voltage properties necessary for the substrate 5 may be insufficient. Therefore, the intermediate layer 11 reinforces the dielectric strength voltage properties which are insufficient by using only the reflective layer 12.

Specifically, light reflectivity of the reflective layer 12 is dependent on a ceramic material to be mixed with the vitreous matters or the resin and the amount thereof, but reflectivity thereof is saturated when a thickness is approximately 10 μm to 100 μm. Accordingly, the thickness is dependent on formation conditions of the intermediate layer 11, but the thickness of the intermediate layer 11 is preferably from 50 μm to 1000 μm and particularly preferably from 50 μm to 500 μm. As described above, it is possible to use a comparatively thick layer having a thickness of 0.5 mm to 1.0 mm as the intermediate layer 11, because, although will be specifically described later, the ceramic layer (intermediate layer 11) formed by the AD method has excellent quality and high thermal conductivity, and in a case of alumina, for example, even in a case where the alumina is formed under the typical formation conditions, it is possible to realize high thermal conductivity of approximately 15 W/(m·° C.).

For example, when the thickness of the intermediate layer 11 is 100 μm, it is possible to ensure stable dielectric strength voltage of at least 1.5 kV to 3 kV or more with only the intermediate layer 11. When the thickness of the intermediate layer 11 is 500 μm, it is possible to ensure dielectric strength voltage of at least 7.5 kV to 15 kV with only the intermediate layer 11. The thickness of the intermediate layer 11 may be determined, so that the dielectric strength voltage which is the total of a dielectric strength voltage of the reflective layer 12 and a dielectric strength voltage of the intermediate layer 11 finally becomes a desired dielectric strength voltage. In Embodiment 1, it is desirable that the reflective layer 12 and the intermediate layer 11 are constituted so that the total dielectric strength voltage is approximately from 4 kV to 5 kV.

As a ceramic material used in the intermediate layer 11, alumina ($Al_2O_3$) has excellent thermal conductivity and dielectric strength voltage properties and suitable for forming an electric insulating film by using the AD method is most preferable, and as the ceramic material used in the intermediate layer 11 in Embodiment 1, alumina is used.

As the ceramic material used in the intermediate layer 11, aluminum nitride or silicon nitride are preferably used, in addition to alumina, because thermal conductivity and dielectric strength voltage properties thereof are excellent. For example, silicon carbide has high thermal conductivity, and zirconia and titanium oxide have high dielectric strength voltage properties. Accordingly, silicon carbide, zirconia, and titanium oxide may be used according to the purpose or use of the ceramic material used in the intermediate layer 11.

The ceramic material herein is not limited to a metal oxide and is ceramic in a broad sense containing aluminum nitride, silicon nitride, or silicon carbide, that is, contains all of inorganic solid materials. Among these inorganic solid materials, an arbitrary material may be used as the ceramic material used in the intermediate layer 11, as long as it is a stable material having excellent heat resistance and thermal conductivity and a material having excellent dielectric strength voltage properties.

It is desired that the ceramic material used in the intermediate layer 11 has higher thermal conductivity than that of the ceramic material used in the reflective layer 12. As described above, in Embodiment 1, zirconia particles are used as the ceramic material in the reflective layer 12. The zirconia particles are used in the reflective layer 12, whereas alumina is used in the intermediate layer 11. Since the thermal conductivity of alumina is higher than the thermal conductivity of zirconia, the thermal conductivity of the intermediate layer 11 can be increased than that of the reflective layer 12, while maintaining high dielectric strength voltage properties.

As described above, the intermediate layer 11 is formed by laminating ceramic layers on the aluminum base 10 by using the AD method. The alumina is low-melting-point metal having a melting point of 660° C. and the sintering of ceramic is normally performed at a temperature higher than that temperature. Accordingly, a ceramic sintered body cannot be directly sintered on the aluminum base 10.

However, according to the AD method which will be described later, it is possible to easily form (laminate) a layer formed of only ceramic to be flat and dense, without directly sintering a ceramic sintered body on the aluminum base 10. A basic temperature of the aluminum base 10 at the time of laminating by using the AD method is a normal temperature, and the ceramic layer can be laminated on the aluminum base 10 at a temperature which is sufficiently lower than 660° C. which is a melting point of aluminum. That is, the intermediate layer 11 formed of only ceramic can be formed on a low-melting-point metal, without using a binder which decreases thermal conductivity, such as a glass binder or a resin binder. Accordingly, the intermediate layer 11 has dielectric strength voltage properties which is equivalent to or higher than that of the layer formed by using the glass binder or the resin binder, without decreasing the original thermal conductivity of the ceramic material such as alumina.

Since the ceramic layer of the intermediate layer 11 is formed by using the AD method, the ceramic layer is dense and has a small porosity (percentage of air holes occupying a film formed) which is an index of elaborateness of a layer (film). Accordingly, the intermediate layer 11 can stably ensure high dielectric strength voltage properties and realize an insulating layer having high thermal conductivity with lower heat resistance.

In addition, the ceramic layer may be subjected to heat treatment, in order to increase dielectric strength voltage properties of the ceramic layer or to improve thermal conductivity of the ceramic layer, after forming the ceramic layer by using the AD method. When the heat treatment is performed, for example, at 200° C. to 900° C., the ceramic particles can grow or defects in the ceramic layer can be decreased. Accordingly, the dielectric strength voltage properties and the thermal conductivity of the ceramic layer are increased. The heat treatment may be performed at a suitable temperature in a range not exceeding 660° C. in the aluminum base, for example, by considering a melting point of the base.

The thermal conductivity in a case where the thermal treatment of the ceramic layer (intermediate layer 11) formed by using the AD method is performed, is similar to thermal conductivity of a ceramic substrate formed by the sintering in the related art, and a value of thermal conductivity of, for example, 10 to 30 W/(m·° C.), is stably obtained. With respect to this, the thermal conductivity of the layer in the related art which is formed by solidifying ceramic particles using a glass or resin binder receives an influence of glass or resin having low thermal conductivity, and thus, thermal conductivity thereof is normally approximately 1 to 3 W/(m·° C.).

When the ceramic layer formed by using the AD method and the layer in the related art which is formed by solidifying ceramic particles using a glass or resin binder are compared to each other, the thermal conductivity of the former layer (ceramic layer formed by using the AD method) is higher by one digit, as described above. The heat resistance of the former layer is approximately one tenth of heat resistance of the latter layer (layer in the related art which is formed by solidifying ceramic particles using a glass or resin binder) and the same heat resistance is obtained by estimation of the former layer having a layer thickness of 500 μm and the latter layer having a layer thickness of 50 μm. When dielectric strength voltage properties for the thicknesses are the same, the heat radiating properties become same, even when the former layer has a dielectric strength voltage which is ten times a dielectric strength voltage of the latter layer.

When the ceramic layer formed by using the AD method and the ceramic layer in the related art formed by using the thermal spraying are compared to each other, a difference occurs in a corrugated state in a depth direction with respect to the surface of the ceramic layer, and the depth of convex and concave portions of the ceramic layer formed by using the AD method is smaller than the depth of convex and concave portions of the ceramic layer formed by using the thermal spraying. The depth of convex and concave portions of the ceramic layer formed by using the AD method is small as approximately 2 μm or smaller whereas the depth of convex and concave portions of the ceramic layer formed by using the thermal spraying is large as approximately 20 μm to 40 μm or larger. The convex and concave portions having a depth of approximately 2 μm are small-sized convex and concave portions which can be easily embedded with die bond paste used in a case of mounting the light emitting elements 6 on the substrate 5. The depth of the convex and concave portions on the surface of the ceramic layer obtained by using the AD method is small as described above, because the particle diameter of the ceramic particles of a raw material used in the AD method is sufficiently smaller than the particle diameter of the ceramic particles used in the thermal spraying. As a result, when the ceramic layer is formed by using the AD method, a film which is denser and flatter than the ceramic layer formed by the thermal spraying is easily obtained.

(AD Method)

The AD method is a technology of mixing raw materials of fine particles and ultrafine particles prepared by another method in advance with gas for performing aerosolizing, and ejecting the aerosolized material to a substrate through nozzles to form a coating film.

As a similar technology thereof, the thermal spraying is used. The thermal spraying is a method of causing fused particles obtained from thermal sprayed material fused or heated to a fused state to rapidly collide with a base surface and laminate the fused particles onto the base surface. The thermal sprayed material is supplied to a thermal spraying device in a powder or wire state.

When differences in film forming methods between the AD method and the thermal spraying in a case of forming the ceramic layer are compared to each other, it can be said that the main differences are a particle diameter of powder used in the raw material and a temperature of the material.

For example, in the plasma spraying, ceramic particles having a representative particle diameter of 10 to 50 μm which is comparatively large is heated • fused or set to be in a semi-fused state by using plasma, is incorporated into a plasma flow blowing from nozzles to accelerate the ceramic particles to rapidly collide with the base, and the ceramic layer is formed on the base.

With respect to this, in the AD method, the aerosolized fine particles and ultrafine particles are used as raw materials. As particles having a particle size suitable for performing aerosolizing, ceramic particles having a particle size of approximately 0.08 to 2 μm are used. As described above, it is found that the particle diameter suitable for performing aerosolizing is approximately one tenth or smaller of the particle diameter suitable for performing the thermal spraying.

Generally, the ceramic sintered body prepared in advance may be mechanically pulverized to obtain the fine particles or ultrafine particles. The fine particles prepared as described above are accumulated on the base by using a film forming device 50 shown in FIG. 5.

Figure 5:
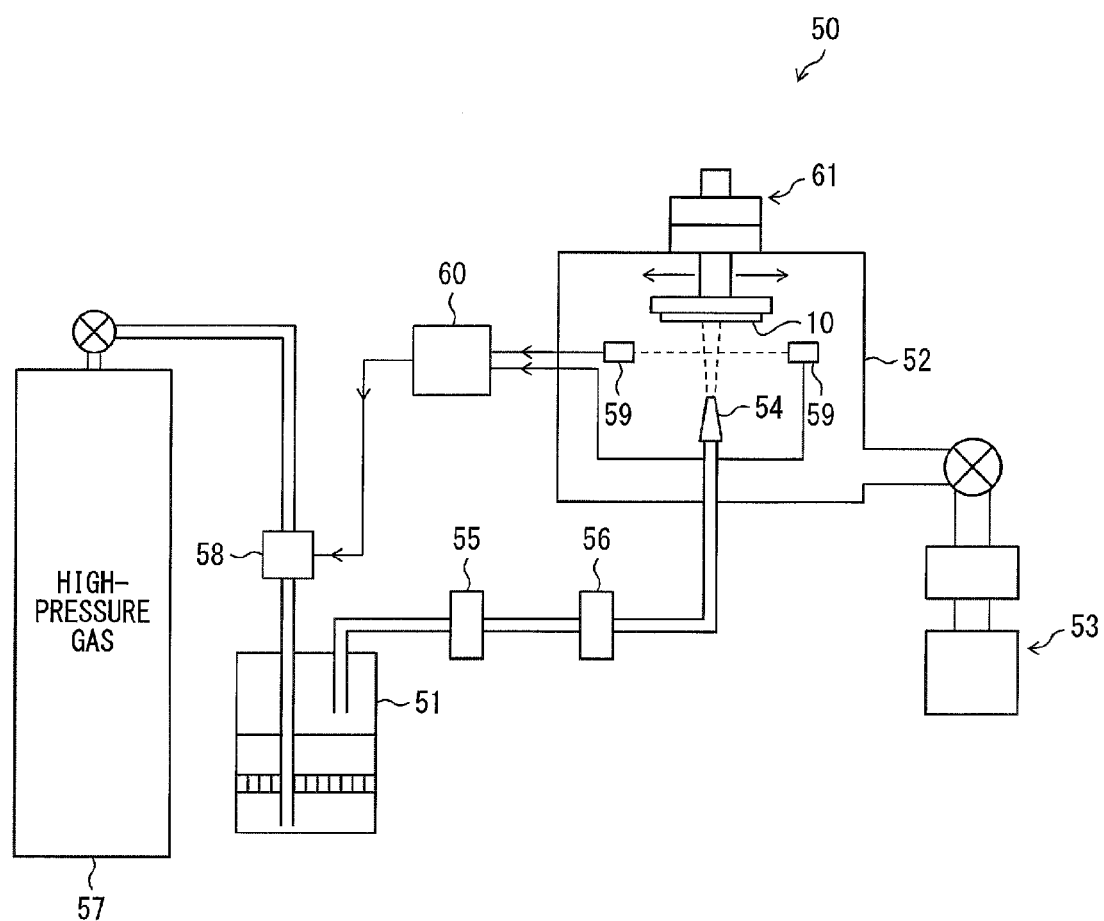
FIG. 5 is a schematic view of a film forming device for forming an intermediate layer of the substrate by using an AD method.

FIG. 5 is a schematic view of the film forming device 50 for forming the intermediate layer 11 of the substrate 5 by using the AD method. The film forming device 50 includes an aerosol generator 51 and a film forming chamber 52 which are connected to each other through a thin transport tube. The pressure of the film forming chamber 52 is reduced to approximately 50 kPa to 1 kPa by using a vacuum pump 53. The dry fine particle material and the ultrafine particle material which are raw materials are aerosolized by being stirred and mixed with high-pressure gas which is supplied from a high-pressure gas container 57 through a mass flow controller 58, in the aerosol generator 51. The aerosolized fine particle material and the ultrafine particle material are transported to the film forming chamber 52 with a flow of gas generated due to a difference in pressure between the aerosol generator 51 and the film forming chamber 52, accelerated through a slit-shaped small opening nozzle 54 to be ejected to the aluminum base 10 which is fixed to a XYZθ stage 61. Accordingly, the ceramic layer is formed on the base 10 at room temperature.

A the fine particle material which is a raw material, ceramic sintered powder having a particle diameter of 0.08 to 2 μm which is mechanically pulverized is used. The gas-transported ultrafine particle material is easily accelerated to several 100 m/sec by passing through the small opening nozzle 54 which is a small opening having a size of 1 mm or smaller. Since the film forming speed and the density of the film forming material greatly depend on a particle diameter, an aggregated state, or a dry state of the ceramic fine particles used, a pulverizing device 55 and a classifying device 56 of the aggregated particles are provided between the aerosol generator 51 and the film forming chamber 52 to realize a high-quality particle flow.

The fine particle material ejected to the aluminum base 10 is sensed by a transmitting type optical sensor and particle beam concentration of the ejected fine particle material is measured by using a particle beam concentration measuring device 60. The mass flow controller 58 controls the flow rate of the high-pressure gas based on the measurement result of the particle beam concentration measuring device 60.

Even in a case where fine particles having a single crystal structure having an average particle diameter of 80 to 100 nm or more is used as a raw material, when the appropriate film forming conditions are selected, it is possible to obtain a dense film forming material formed of non-oriented fine crystals having a particle diameter of 10 to 20 nm or less in which an amorphous layer or a heterogeneous phase is not substantially observed between the ceramic crystal particles in the ceramic layer obtained by using the AD method as described above.

The ceramic layer obtained as described above is a denser film forming material, compared to the ceramic layer obtained by using the thermal spraying. Accordingly, the ceramic layer formed by using the AD method has high thermal conductivity and dielectric strength voltage properties, and it is possible to stably reproduce the excellent properties described above, according to the AD method. As described above, the particle diameter of the particles used as the ceramic raw material in the AD method is extremely small as 0.08 to 2 μm, compared to that in the thermal spraying. Since the fine particles are more finely pulverized due to the collision of the fine particles with the aluminum base 10 during the film formation, the ceramic layer obtained as a film forming material has small-sized convex and concave portions on the surface and high flatness.

The ceramic layer formed by using the AD method is a layer having high flatness, and may be ground in order to further increase the flatness. Since the ceramic layer formed by using the AD method is a dense layer formed of ceramic particles having a small particle diameter, resistance to the grinding is high and defected parts due to the peeling of the ceramic particles are hardly generated. Since the ceramic layer formed by using the AD method has particles each of which is extremely small, even when defected parts are generated due to the grinding, the defected parts are small so that they are not visibly recognizable, and have no problems in practical use.

In a case where the ceramic layer is formed by using the plasma spraying of the related art, a porosity of the ceramic layer is approximately 1% to 5%, and accordingly, it was necessary to pay attention so that penetration holes are not formed in the ceramic layer, for maintaining dielectric strength voltage properties. For example, it was necessary to laminate the ceramic layers to be thick until the penetration holes are filled.

However, in the ceramic layer formed by using the AD method, such problems regarding the penetration hole do not occur in practice. Even when the problems occur, the problems only occur in special cases such as a case where the layer thickness is extremely small, for example, a thickness of 50 μm or less, or a case where the film forming speed is excessively high. Generally, when the ceramic layer (insulating layer) has a thickness of approximately 50 μm or greater, such problems do not occur. This is because that the particle diameter of the ceramic particles used as the raw material is extremely small as 0.08 to 2 μm, the formed ceramic layer is dense over the entire surface, and the porosity is less than 1%.

Hereinabove, the AD method has been mainly described as a forming method of the intermediate layer (ceramic layer) 11. However, the AD method is not limited to be used in the formation of the ceramic layer, and can be applied to the formation of a metal layer. Particularly, in a case where the AD method is used in the formation of an electrode layer formed of copper or silver, the formation can be performed at room temperature, and accordingly, the AD method is more preferably used because a decrease in electric conductivity and thermal conductivity due to oxidation is not substantially observed, compared to a case where the raw material is heated to a high temperature by using plasma spraying or flame spraying.

As described above, in order to form a dense ceramic layer having high dielectric strength voltage properties, or in order to form a high-quality electrode layer having high electric conductivity and thermal conductivity, it is more desirable to use the AD method in which the fine particles having an extremely small particle diameter of 0.08 to 2 μm can be accumulated at room temperature, compared to a case of forming a ceramic layer or an electrode layer by using the spraying technology such as high velocity flame spraying or plasma spraying and other methods in the related art.

(Manufacturing Method of Substrate 5 According to Embodiment 1)

Figure 6:
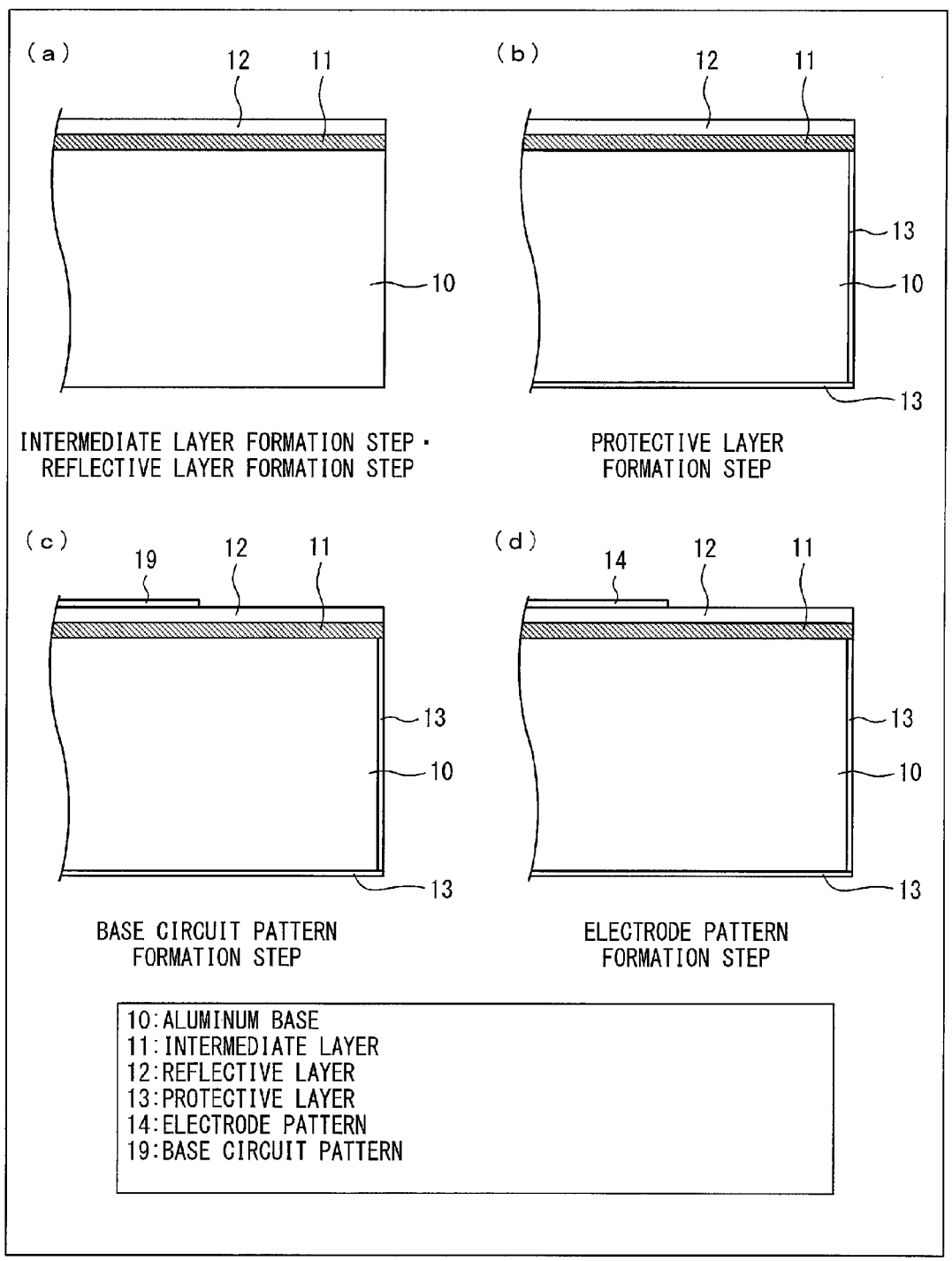
FIGS. 6(a) to 6(d) are sectional views for illustrating a manufacturing method of the substrate.

Next, a manufacturing method of the substrate 5 according to Embodiment 1 will be described with reference to FIG. 6. FIGS. 6(*a*) to 6(*d*) are schematic sectional views for illustrating manufacturing steps of the substrate 5 of Embodiment 1.

First, as shown in FIG. 6(*a*), the intermediate layer 11 is formed on the surface on the aluminum base 10 (intermediate layer formation step). The intermediate layer 11 is formed by laminating an alumina layer on the aluminum base 10 by using the AD method.

After that, as shown in FIG. 6(*a*), the reflective layer 12 is formed on the upper surface of the intermediate layer 11 on the surface of the aluminum base 10 (reflective layer formation step). The reflective layer 12 is formed as an insulating reflective layer containing ceramic particles, by performing hardening of ceramic particles mixed with a glass binder or a resin binder having light resistance and heat resistance by drying or firing.

In Embodiment 1, since aluminum is used in the aluminum base 10 and alumina is used in the ceramic layer of the intermediate layer 11, it is possible to increase a firing temperature for forming the reflective layer 12, after the formation step of the intermediate layer 11.

In the reflective layer formation step, after applying the ceramic coating material containing ceramic particles onto the intermediate layer 11, the reflective layer 12 is formed by synthesis of glass by using a sol-gel method. The firing temperature of the glass binder using the sol-gel method is generally 200° C. to 500° C., but it is effective to set the firing temperature to 400° C. to 500° C., in order to reduce holes from the porous film generated in a gel state of the vitreous matters and to increase the insulating properties.

Accordingly, in Embodiment 1, a sol used in the synthesis of vitreous matters by sol-gel reaction is applied onto the intermediate layer 11 by screen printing, as a binder of zirconia particles. After that, the glass binder is dried at 200° C. to 300° C. and fired at 400° C. to 500° C. to form the reflective layer 12.

In the forming method of the reflective layer 12, a method of forming a vitreous layer by remelting an material obtained by solidifying low-melting-point glass particles with an organic binder is used, in addition to the sol-gel method. It is necessary to set at least a temperature of 800° C. to 900° C. for performing the remelting of a material obtained by solidifying low-melting-point glass particles with an organic binder. In Embodiment 1, since the ceramic layer represented by alumina is used in the intermediate layer 11, a forming method of the reflective layer 12 where a high temperature process is necessary, can also be used.

However, the high temperature described above exceeds 660° C. which is a melting point of the aluminum used in the aluminum base 10. Accordingly, it is necessary to use an alloy material having a high melting point obtained by suitably mixing impurities with aluminum base 10. Since the melting point of copper is 1085° C. which is higher than the melting point of aluminum, when copper is used as the base, a method of remelting low-melting-point glass can be used, but the method of remelting low-melting-point glass may be used after increasing the melting point of the base by suitably mixing impurities to the aluminum base 10.

Since the glass has excellent light resistance and heat resistance, the glass is most preferable as a material for forming the reflective layer 12, but instead of glass, a resin having excellent heat resistance and light resistance, for example, a silicone resin, an epoxy resin, a polyimide resin, or a fluorine resin may be used as a binder with respect to the ceramic particles. Although the resin described above is deteriorated compared to the glass in viewpoints of heat resistance and light resistance, a hardening temperature of the resin is lower than a hardening temperature in the glass synthesis by using a sol-gel reaction of the glass raw material, and when the resin is used as a binder with respect to the ceramic particles, it is easy to perform the formation step of the reflective layer 12.

Next, as shown in FIG. 6(*b*), the protective layers 13 are formed so as to cover the lower end surface and the side end surface of the aluminum base 10 (protective layer formation step).

In the practical manufacturing, sealing treatment is performed after alumite treatment to seal pores generated in an aluminum anodic oxidation coating which is the protective layers 13. When the sealing treatment is performed after alumite treatment as described above, the aluminum anodic oxidation coating for forming the protective layers 13 is stabilized. Accordingly, durability and corrosion resistance of the aluminum base 10 are more reliably obtained by using the protective layers 13.

Here, the aluminum anodic oxidation coating, that is, the alumite layer used as the protective layer 13 is extremely thin so as to have a thickness of 10 μm or less, for example, 1 to 3 μm, and is subjected to sealing treatment. The sealing treatment is treatment necessary for preventing corrosion due to a plating solution used in a plating treatment in an electrode pattern formation step which will be described later and for avoiding unnecessary precipitation of metal. The alumite layer can be used as a radiate layer having high heat radiating properties by forming a film having a thickness of 50 μm or greater, for example, using porous properties thereof, but in a state where the porous properties remain, the function as the protective layer 13 is not sufficiently obtained. Accordingly, in the protective layer 13 obtained by performing the sealing treatment of the thin aluminum anodic oxidation coating having a thickness of 10 μm or less, the holes of the porous film are covered, and thus a function as a heat radiation layer is not obtained. However, sufficient functions are obtained for preventing corrosion in the plating step and unnecessary precipitation, and improving durability and corrosion resistance of the aluminum base 10 after completing the substrate 5.

It is desirable that the formation of the protective layer 13 by the alumite treatment is performed after forming the reflective layer 12. As in Embodiment 1, the vitreous matter is synthesized by using a sol-gel reaction and the firing temperature when forming the reflective layer 12 is 200° C. to 500° C. Particularly, when the temperature is increased to 250° C. or higher to fire the reflective layer 12, after forming the protective layer 13, cracks are generated on the protective layer 13 and a function as a protective film of the substrate 5 for light emitting devices is deteriorated. By performing the formation of the reflective layer 12 first, the reflective layer 12 containing the ceramic particles functions as a mask in the alumite treatment in the formation step of the protective layer 13. Accordingly, since the protective layer 13 is formed after forming the intermediate layer 11, only the parts of the aluminum base 10 where the aluminum materials are exposed, excluding the intermediate layer 11, are covered with the protective layers 13.

In a case of using a resin binder in the reflective layer 12, the hardening temperature of the resin may be 250° C. or less, depending on the material. In such a case, even when the reflective layer 12 is formed after forming the protective layers 13, cracks are not generated on the protective layers 13, and accordingly, any formation order may be used.

Here, the protective layers 13 are set as alumite layers, but protective sheets may be bonded, instead of the protective layers 13, for example. The protective sheets may be peeled off from or allowed to remain on the substrate 5 in a final stage of the manufacturing, depending on heat resistance, heat radiating properties, and long-term reliability of the protective sheets.

In the intermediate layer formation step, the reflective layer formation step, and the protective layer formation step described above, the substrate 5 in which the aluminum base 10 is covered with the intermediate layer 11, the reflective layer 12, and the protective layers 13 is manufactured. Next, the electrode pattern 14 is formed on the reflective layer 12, as described below.

First as shown in FIG. 6(*c*), a circuit pattern is drawn on the upper surface of the reflective layer 12 by printing or the like using metal paste formed of a resin containing metal particles, as a base of the electrode pattern 14, and the circuit pattern is dried to form a base circuit pattern 19 (base circuit pattern formation step). As shown in FIG. 6(*d*), the electrode pattern 14 is formed by precipitating electrode metal on the base circuit pattern 19 by using plating treatment (electrode pattern formation step).

The aluminum base 10 is already covered with the reflective layer 12 having high reflectivity containing ceramic, the intermediate layer 11, and the protective layer 13 which is the aluminum anodic oxidation coating. Accordingly, by using the plating solution used in the plating treatment in the electrode pattern formation step, the corrosion of the aluminum base 10 does not occur, and the electrode metal is efficiently precipitated only on the base circuit pattern 19 by using the plating solution.

Here, the substrate 5 according to the embodiment has low heat resistance and excellent dielectric strength voltage properties, compared to a substrate including a metal base of the related art, and the reason thereof will be described below.

Figure 7:
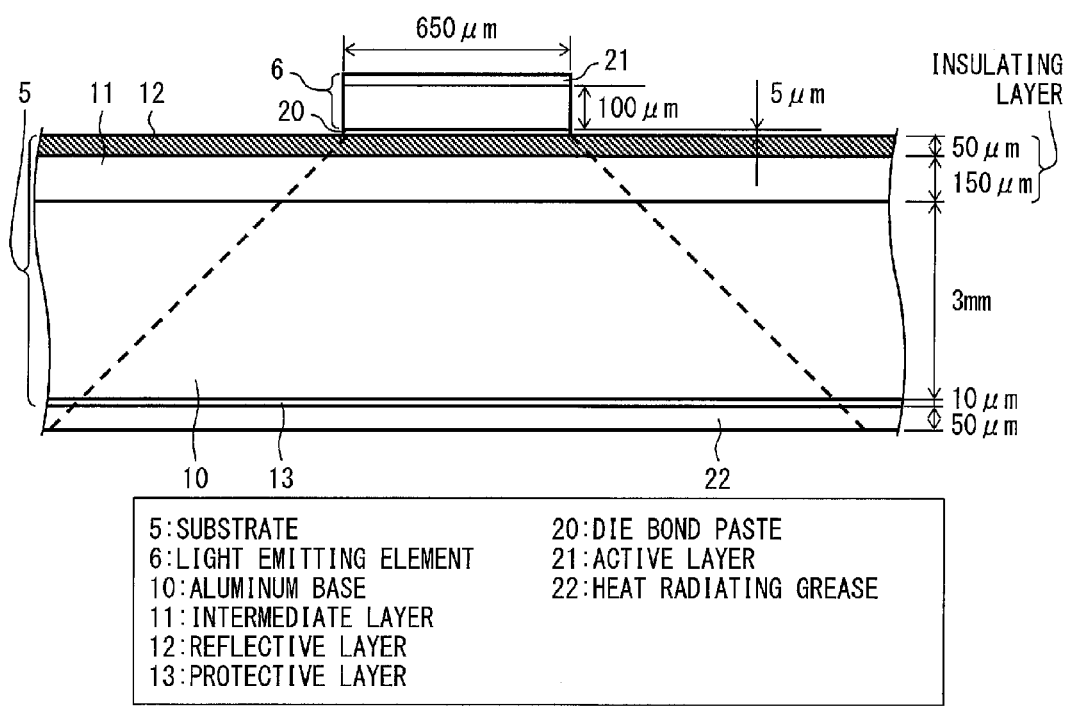
FIG. 7 is a schematic sectional view of the substrate according to Embodiment 1.

FIG. 7 is a schematic sectional view of the substrate 5 according to Embodiment 1. As shown in FIG. 7, the substrate 5 includes the aluminum base 10, the intermediate layer 11, the reflective layer 12, and the protective layer 13. The intermediate layer 11 and the reflective layer 12 have insulating properties, and the substrate 5 has desired dielectric strength voltage properties by using the insulating layer formed of the intermediate layer 11 and the reflective layer 12. Hereinafter, specific examples are considered. The aluminum base 10 is formed of aluminum having a thickness of 3 mm and the intermediate layer 11 is formed on the surface of the aluminum base 10. The thickness of the intermediate layer 11 is 150 µm, and the intermediate layer is an alumina layer (ceramic layer) formed by using the AD method. The reflective layer 12 is formed on the upper surface of the intermediate layer 11. The thickness of the reflective layer 12 is 50 µm and the reflective layer is a zirconia-containing glass-based insulating layer. The reflective layer 12 is a glass-based insulator formed by firing a ceramic coating material containing high-temperature-fired ceramic and glass raw materials at a temperature of 200° C. to 500° C., and contains zirconia particles as the ceramic. Here, the intermediate layer 11 has the most of the dielectric strength voltage of the dielectric strength voltage of the substrate 5. An alumite layer having a thickness of 10 µm is formed on the lower end surface of the aluminum base 10 as the protective layer 13.

Here, the protective layer 13 may be thermally connected to the heat sink (heat radiation material) 2 (see FIG. 1 and FIG. 2) through a heat radiating grease 22. The thickness of the heat radiating grease 22 may be 50 µm.

According to the configuration described above, most of heat generated by the light emitting elements 6 is finally released to the atmosphere from the heat sink 2, in a case of a air cooling system. As a base material of the heat radiating grease 22 used in a semiconductor device or a lighting device using an LED, silicone oil is selected, for example, and the thermal conductivity may be improved in many cases, by incorporating powder having high thermal conductivity such as alumina or silver. The thermal conductivity of the base material of the heat radiating grease 22 is approximately 0.2 W/(m·° C.), but as a result of the improvement of the thermal conductivity, the thermal conductivity of the heat radiating grease 22 becomes approximately 1 to 3 W/(m·° C.). When the protective layer 13 and the heat sink 2 are mechanically connected to each other, an air layer interposed therebetween is operated as an insulating layer. Accordingly, the air layer is removed and the heat radiating grease 22 is interposed in order to thermally connect the protective layer and the heat sink. In the substrate 5 used in high-intensity lighting as in Embodiment 1, a heat radiating path from the surface of the substrate 5 towards the rear surface side of the substrate 5 may be set with the shortest distance, in many cases, and in order to increase heat radiating properties, it is desirable that the rear surface of the substrate 5 and the heat sink 2 are adhered to each other by the heat radiating grease 22 as described above. Regarding the heat radiating grease 22, the same configuration in the substrate 5 is applied to the substrate 100A which will be described later in FIG. 8, and the description hereinafter will be omitted.

Figure 8:
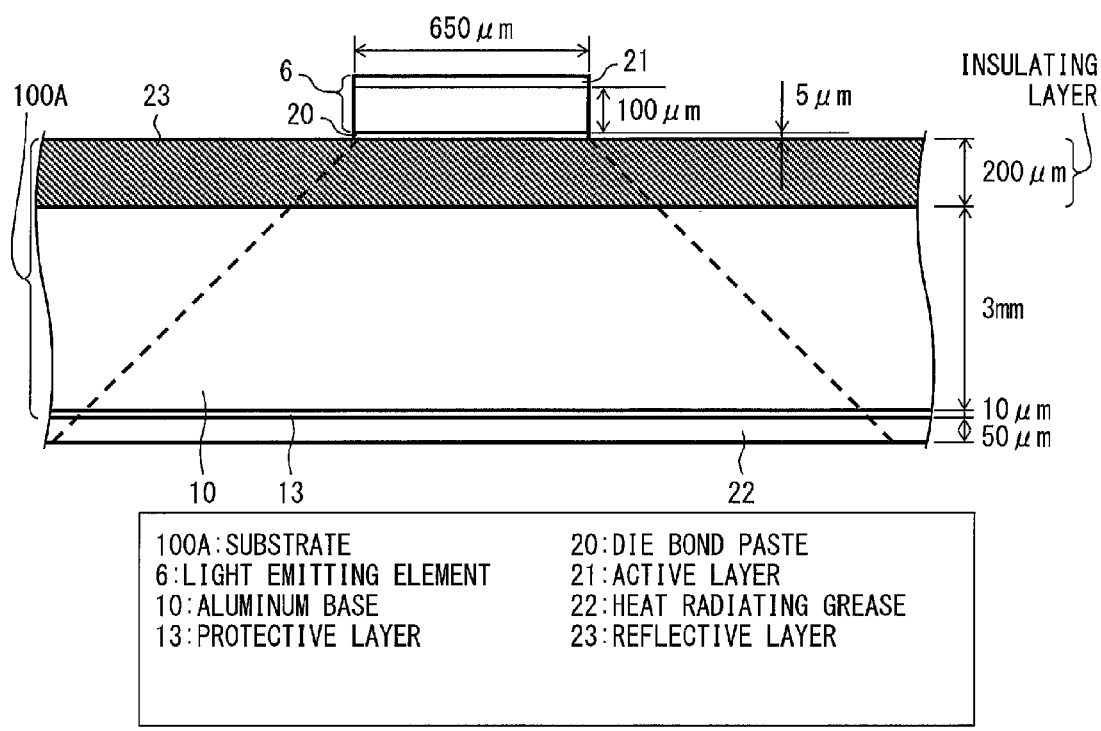
FIG. 8 is a schematic sectional view of a substrate according to a comparative example of Embodiment 1.

FIG. 8 is a schematic sectional view of a substrate 100A according to a comparative example of Embodiment 1. As shown in FIG. 8, the substrate 100A includes the aluminum base 10, a reflective layer 23, and the protective layer 13. The reflective layer 23 has insulating properties, and the substrate 100A has desired dielectric strength voltage properties by using the glass-based insulating layer formed of one layer of the reflective layer 23. The aluminum base 10 is formed of aluminum having a thickness of 3 mm and a glass-based insulating layer having a thickness of 200 µm and having light reflectivity and dielectric strength voltage properties is formed on the surface of the aluminum base 10 as the reflective layer 23. In the same manner as the reflective layer 12 shown in FIG. 7, the reflective layer 23 is a glass-based insulator formed by firing a ceramic coating material containing high-temperature-fired ceramic and glass raw materials at a temperature of 200° C. to 500° C., and contains zirconia particles as the ceramic. An alumite layer having a thickness of 10 µm is formed on the lower end surface of the aluminum base 10 as the protective layer 13.

The light emitting element 6 is disposed on each of the substrate 5 and the substrate 100A, and the light emitting element 6, and the substrate 5 and the substrate 100A are connected to each other through a die bond paste 20 having a thickness of 5 µm. A plane size of the light emitting element 6 has a vertical width of 650 µm and a horizontal width of 650 µm, the thickness from the die bond paste 20 to an active layer 21 of the light emitting element 6 is set as 100 µm, and a substrate for light emitting elements, the material of which is sapphire is used as the substrate for light emitting elements.

Next, a difference in thermal conductivity of the insulating layer and a difference in layer thickness between the substrate 5 and the substrate 100A will be described.

The total of the thickness of the insulating layer is 200 µm in both of the substrate 5 and the substrate 100A.

In the substrate 100A, all of the insulating layer having a thickness of 200 µm is the reflective layer 23. The reflective layer 23 is a zirconia-containing glass-based insulating layer which is formed by sintering sol-gel glass containing zirconia as a ceramic material, and thermal conductivity σ1 of the reflective layer 23 is 1 W/(m·° C.).

The insulating layer of the substrate 5 has a laminated structure of the reflective layer 12 and the intermediate layer 11. The reflective layer 12 is a zirconia-containing glass-based insulating layer which is the same as the reflective layer 23 of the substrate 100A. The intermediate layer 11 is an alumina layer (ceramic layer) formed by using the AD method. Regarding thermal conductivity σ3 of the intermediate layer 11, a value changes depending on the formation conditions or the heat treatment after the formation, but the value of approximately 5 to 20 W/(m·° C.) is obtained even in a case of not performing the heat treatment after the formation, and a value of 10 to 30 W/(m·° C.) is stably obtained after the heat treatment is performed. Here, the most representative value is 15 W/(m·° C.). The thermal conductivity of the reflective layer 12 is the same as the thermal conductivity of the reflective layer 23 and the thermal conductivity σ1 is 1 W/(m·° C.).

The ceramic layer represented by alumina formed by using the AD method which is used in the intermediate layer 11 can be formed by only using ceramic, without using the binder having low thermal conductivity such as the glass or resin binder. Accordingly, the ceramic layer formed by using the AD method can realize the thermal conductivity close to that of original ceramic formed by the sintering. Therefore, the high thermal conductivity of 15 W/(m·° C.) can be realized, even on the metal base.

In the ceramic layer represented by alumina formed by using the AD method, a dense ceramic layer can be formed, and accordingly the high dielectric strength voltage can be realized with a thin insulating layer.

The particle diameter of the ceramic particles as a primary particle diameter used as a raw material is small as 0.08 µm to 2 µm. When the ceramic particles having the primary particle diameter is rapidly incorporated and pulverized in the aluminum base 10, most of the particles become secondary particles having a smaller particle diameter as 0.08 µm or smaller, and accumulated on the aluminum base 10. Accordingly, the porosity (percentage of air holes occupying a film formed) of the formed ceramic layer is small, and it is possible to realize a dense ceramic layer having no penetration holes with a thin layer thickness. As a result, in the ceramic layer represented by alumina formed by using the AD method, it is possible to realize the high dielectric strength voltage with a thin insulating layer.

With respect to this, in a case of forming the reflective layer 23 which is an insulating layer of the substrate 100A by using the sol-gel method, for example, a coating material obtained by mixing ceramic particles with sol-like glass raw material is applied or printed on the base, and vitreous matters are synthesized by drying and sintering. The ceramic particles are solidified with the vitreous matters synthesized herein and the reflective layer 23 (here, zirconia-containing glass-based insulating layer) formed of the ceramic-containing glass-based insulating layer is formed on the aluminum base 10. It is possible to realize high light reflectivity in a visible light region with this layer.

Zirconia is a material having low thermal conductivity among ceramic materials and the glass is used as a binder, and accordingly, the thermal conductivity of the reflective layer 23 is low thermal conductivity as 1 W/(m·° C.). The same result is obtained, in a case where titanium oxide (TiO$_2$) is used instead of zirconia.

Since the glass formed by using the sol-gel reaction is a porous film in a gel state before the sintering, it is necessary to cover the holes by precisely sintering at a high temperature to increase insulating properties. However, particularly in a case where a film is thin, it is difficult to completely remove the effect of porous properties, even after the sintering, and penetration holes may remain. In such a case, the dielectric strength voltage decreases. As described above, the dielectric strength voltage properties of the ceramic-containing glass-based insulating layer formed by using the glass synthesized by the sol-gel reaction as a binder are deteriorated, compared to the dielectric strength voltage properties of the ceramic layer obtained by using the AD method. In order to realize the dielectric strength voltage properties which are equivalent to that of the ceramic layer obtained by using the AD method, it is necessary that the thickness of the ceramic-containing glass-based insulating layer formed by using the glass synthesized by sol-gel reaction as a binder is set to be sufficiently greater than the thickness of the ceramic layer obtained by using the AD method.

Here, the dielectric strength voltage properties of the insulating layer will be described more by using numerical values. In the dense alumina layer formed by using the AD method, the dielectric strength voltage properties are approximately 15 kV/mm to 30 kV/mm. Even when the lowest dielectric strength voltage properties are 15 kV/mm, at least a dielectric strength voltage of 4.5 kV can be ensured, in a case where the thickness of the intermediate layer 11 formed of the alumina layer formed by using the AD method is set as 0.3 mm. When the intermediate layer 11 having a thickness of 0.3 mm and the reflective layer 12 having a thickness of 0.05 mm (50 μm) are combined with each other, an insulating layer having the total thickness of 0.35 mm is obtained.

With respect to this, with the reasons described above, the dielectric strength voltage properties of the reflective layer 23 is deteriorated than that of the intermediate layer 11, and only 7.5 kV/mm to 15 kV/mm which is half of the dielectric strength voltage properties of the intermediate layer 11 can be stably realized. Compared to the intermediate layer 11 having a thickness of 0.3 mm (300 μm) of the substrate 5 described above, in a case where the dielectric strength voltage properties of the reflective layer 23 is only 7.5 kV/mm, the thickness of 0.6 mm (600 μm) which is double the thickness described above is necessary, in order to realize the same dielectric strength voltage of 4.5 kV with the reflective layer 23.

In a case where the thickness of the insulator layer is the same as in the cases of the substrate 5 and the substrate 100A, the dielectric strength voltage properties of the substrate 100A are lower than that of the substrate 5, and it is necessary to increase the layer thickness in the substrate 100A, in order to obtain the same properties.

As described above, the representative value of the thermal conductivity of the alumina layer formed by using the AD method is 15 W/(m·° C.), whereas the representative value of the thermal conductivity of the reflective layer 23 is 1 W/(m·° C.). Accordingly, it is clear that the sufficient dielectric strength voltage properties can be ensured and a decrease in heat resistance of the substrate 5 can be realized, by using the intermediate layer 11 formed of the alumina layer formed by using the AD method.

The alumina layer formed by using the AD method has deteriorated thermal conductivity and dielectric strength voltage properties, but it is possible to prevent an increase in heat resistance of the substrate 5 to the minimum limit while ensuring the desired high light reflectivity, by forming the ceramic-containing glass-based insulating layer having excellent light reflectivity, particularly, the zirconia-containing glass-based insulating layer (reflective layer 12) on the intermediate layer 11 so as to have a minimum thickness of 10 μm to 100 μm.

As described above, when the insulating layer is formed by using the reflective layer 12 and the intermediate layer 11 as in the substrate 5, and the ceramic layer represented by alumina formed by the AD method is applied to the intermediate layer 11, the intermediate layer 11 becomes a dense ceramic layer. Accordingly, it is possible to realize high dielectric strength voltage properties with a thin insulating layer, and as a result, it is also possible to decrease heat resistance of the insulating layer. It is possible to realize high reflectivity with the reflective layer 12.

By using the configuration described above, the inventors have succeeded for the first time in realizing an ideal substrate for light emitting devices which satisfies three properties of high light reflectivity, low heat resistance (high heat radiating properties), and high electrical dielectric strength voltage properties which are necessary for a substrate for high-intensity lighting light emitting devices, at the same time, in Embodiment 1.

As described above, according to Embodiment 1, in the substrate 5, the intermediate layer 11 formed of the ceramic layer formed by using the AD method is provided between the aluminum base 10 and the reflective layer 12, and the electrode pattern 14 is formed on the insulating layer formed of the intermediate layer 11 and the reflective layer 12. As a result, a substrate for light emitting devices suitable for high-intensity lighting having high reflectivity, high heat radiating properties, high dielectric strength voltage properties, and long-term reliability containing heat resistance and light resistance is obtained. In addition, according to Embodiment 1, it is possible to provide such a substrate for light emitting devices having excellent mass productivity.

In Embodiment 1, an outer shape of the substrate 5 seen in a direction orthogonal to the base surface is set as a square shown in FIG. 3, but the outer shape of the substrate 5 is not limited thereto and arbitrary closed figure shapes can be used. The closed figure shape may be a closed figure shape in which circumference of a closed figure is configured with only a linear line or only a curve, or the closed figure shape may be a closed figure shape in which circumference of a closed figure contains at least a linear portion and at least a curved portion. The closed figure shape is not limited to a convex figure shape and may be a concave figure shape. For example, as an example of a convex polygonal shape configured with only a linear line, shapes of a triangle, a pentagon, a hexagon, an octagon, and the like may be used, or arbitrary concave figure shapes may be used. As an example of a closed figure shape configured with only a curve, a circular shape or a elliptical shape may be used, or a closed figure shape such as a shape having a convex curve or a shape having a concave curve may be used. In addition, a shape of a racetrack may be used as a closed figure shape containing at least a linear portion and at least a curved portion.

Modified Example of Embodiment 1

Figure 19:
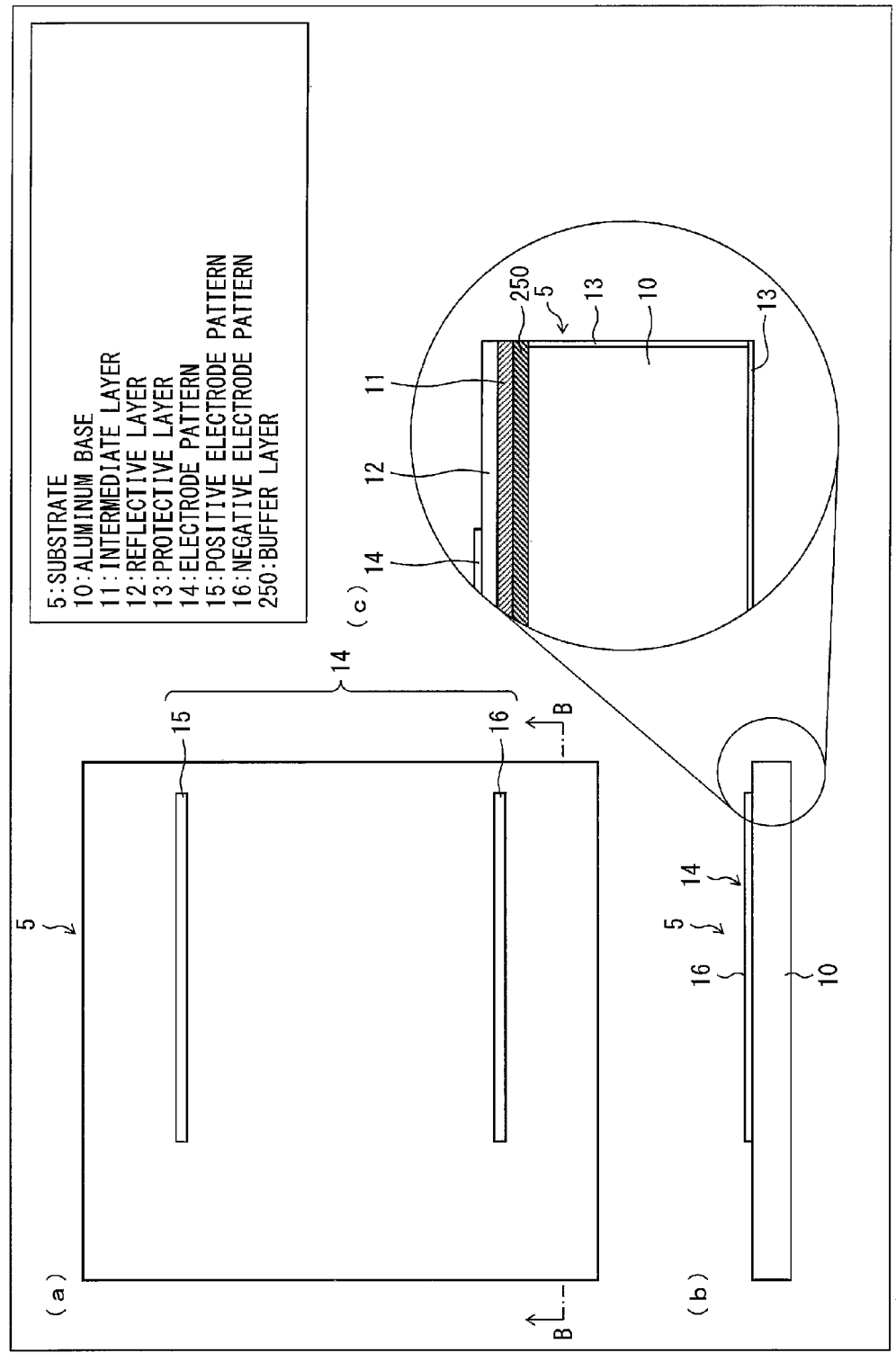
FIG. 19(a) is a plan view of a substrate according to a modification example of Embodiment 1.
FIG. 19(b) is a sectional view taken along an arrow B-B shown in FIG. 19(a)
FIG. 19(c) is an enlarged view of a part of FIG. 19(b).

A modified example of Embodiment 1 of the invention will be described as follows with reference to FIG. 19. FIG. 19 is a diagram for illustrating a configuration of the substrate 5 according to a modified example of the substrate 5 of Embodiment 1. FIG. 19(a) is a plan view of the substrate 5 according to the modification example of Embodiment 1, FIG. 19(b) is a sectional view taken along an arrow B-B shown in FIG. 19(a), and FIG. 19(c) is an enlarged view of a part of FIG. 19(b).

As shown in FIG. 19(c), the substrate 5 according to the modification example of Embodiment 1 is different from the substrate 5 according to Embodiment 1 in that a buffer layer 250 is formed between the base 10 (base) and the intermediate layer 11. The other configurations of the substrate 5 according to the modification example of Embodiment 1 are the same as those of the substrate 5 according to Embodiment 1.

According to the substrate 5 according to Embodiment 1, the intermediate layer 11 (second insulating layer) is directly formed on the base 10 formed of metal such as an aluminum plate. In a case where the substrate 5 according to Embodiment 1 is set as the substrate for light emitting devices, particularly, in a case where this substrate is used as a substrate for high-output light emitting devices, the base 10 formed of metal is repeatedly expanded and contracted due to effects of heat generated in the light emitting elements loaded on the substrate 5 according to Embodiment 1. Accordingly, the intermediate layer 11 formed on the base 10 may be peeled off or have deteriorated dielectric strength voltage properties due to mechanical loads received due to a difference in a coefficient of linear expansion between the intermediate layer and the metal base 10. In addition, the light emitting elements loaded on the substrate 5 according to Embodiment 1 may also have a decreased lifetime due to effects of heat history received due to a difference in a coefficient of linear expansion between the intermediate layer and the metal base 10.

Therefore, as shown in FIG. 19, the buffer layer 250 is formed between the base 10 and the intermediate layer 11 in the substrate 5 according to the modification example of Embodiment 1.

The base 10 is a substrate formed of a material having high thermal conductivity. The material of the base 10 is not particularly limited, as long as it is a material having high thermal conductivity, and a substrate formed of metal containing aluminum, copper, stainless steel, or iron as a material can be used, for example.

The buffer layer 250 is a film formed by performing thermal spraying or an aerosol deposition method (AD method) with respect to one surface (hereinafter, referred to as a surface) of the base 10 and is formed of a material having a smaller coefficient of linear expansion than that of the base 10. It is preferable that the coefficient of linear expansion of the buffer layer 250 is greater than that of the intermediate layer 11. A thickness of the buffer layer 250 is from 10 µm to 100 µm and is preferably from 20 µm to 30 µm.

Since the buffer layer 250 having a coefficient of linear expansion smaller than that of the base 10 and close to that of the intermediate layer 11 is interposed therebetween, it is possible to significantly decrease transmission of mechanical loads to the light emitting elements due to thermal expansion and contraction of the base 10, and therefore, it is possible to increase a length of lifetime of the light emitting elements 6 and the light emitting device 4 and to improve reliability.

The buffer layer 250 is desirably a metal or alloy layer. The metal containing at least any one of metals having a small coefficient of linear expansion such as Ni, Ti, Co, Fe, Nb, Mo, Ta, and W, or an alloy thereof is used as a material of metal or alloy layer used for the buffer layer 250.

Particularly, in a case where the material of the base 10 is aluminum, the buffer layer 250 contains at least any one of Ni, Ti, and Co as a material, and particularly preferably, the buffer layer 250 desirably contains Ni as a material.

In addition, in order to increase adhesiveness with the base 10 formed of aluminum, the buffer layer 250 is preferably an alloy of Ni (nickel) and aluminum. In a case where the buffer layer 250 is an alloy of Ni (nickel) and aluminum, a rate of Ni is desirably increased as much as possible and the rate of nickel in the buffer layer 250 is desirably equal to or greater than 90% as a weight ratio, in order to obtain a coefficient of linear expansion close to a substantially intermediate value of the coefficients of linear expansion of the base 10 and the intermediate layer 11. As will be described later, this is because the coefficient of linear expansion of nickel is $13.4 \times 10^{-6}/°$ C. and this substantially coincides with $15 \times 10^{-6}/°$ C. which is an intermediate value of coefficients of linear expansion of both of aluminum and alumina which is a representative ceramic material. It is possible to make the coefficient of linear expansion of the buffer layer 250 fall in a range of $13 \times 10^{-6}/°$ C. to $16 \times 10^{-6}/°$ C. which is close to $15 \times 10^{-6}/°$ C. described above, by setting the rate of nickel in the buffer layer 250 formed an alloy of nickel and aluminum to be equal to or greater than 90% as a weight ratio.

A melting point of Ni is determined to be low among metals described above, but is practically high as 1455° C. When an alloy of Al and Ni is used, it is possible to decrease a melting point, and it is possible to decrease a temperature necessary for preparing a fused state or a half-fused state. Accordingly, the alloy described above is suitable for forming a nickel layer by thermal spraying, for example.

In a case where the material of the base 10 is aluminum and the material of the intermediate layer 11 is alumina, the coefficient of linear expansion of Ni is substantially an intermediate value of the coefficients of linear expansion of aluminum and alumina, and thus Ni is suitable as the buffer layer between the base 10 and the intermediate layer 11.

When coefficients of linear expansion of metals described above are compared at room temperature, coefficients of linear expansion of Ni (nickel), Ti (titanium), and Co (cobalt) are respectively $13.4 \times 10^{-6}/°$ C., $8.6 \times 10^{-6}/°$ C., and $13.0 \times 10^{-6}/°$ C. which are smaller than $23 \times 10^{-6}/°$ C. which is a coefficient of linear expansion of aluminum. With respect to this, since a coefficient of linear expansion of alumina which is representative ceramic material is from $6 \times 10^{-6}/^\circ$ C. to $8 \times 10^{-6}/^\circ$ C. and is substantially $7 \times 10^{-6}/^\circ$ C., Ni (nickel) and Co (cobalt) have substantially intermediate coefficients of linear expansion with respect to those of aluminum and ceramic, and thus, are more suitable as metal used in the buffer layer between the base 10 and the intermediate layer 11.

The coefficients of linear expansion greatly vary depending on a glass composition, but the coefficients of linear expansion are substantially from $3 \times 10^{-6}/^\circ$ C. to $9 \times 10^{-6}/^\circ$ C. and are coefficients of linear expansion comparatively close to that of alumina.

The buffer layer 250 is formed by thermal spraying or an aerosol deposition method (AD method).

The surface of the base may be roughened by blasting, before forming the buffer layer 250, in order to further improve adhesiveness between the base 10 and the buffer layer 250.

Embodiment 2

Embodiment 2 of the invention will be described as follows with reference to FIG. 9 to FIG. 11. For convenience of description, the same reference numerals are used for the members having the same functions as the members described in the embodiment described above and the description thereof will be omitted.

Figure 9:
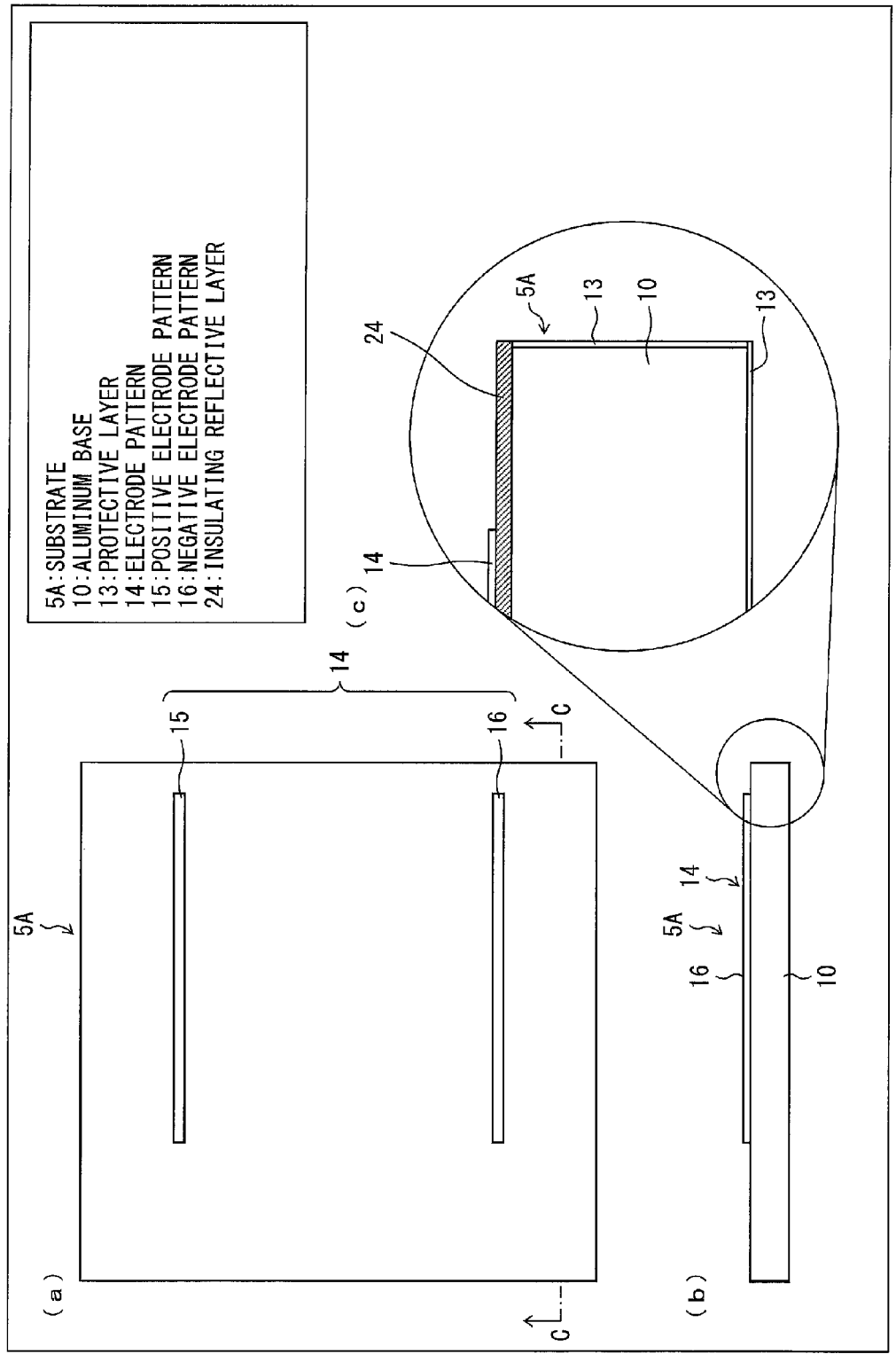
FIG. 9(a) is a plan view showing a configuration of a substrate according to Embodiment 2.
FIG. 9(b) is a sectional view taken along a surface CC shown in FIG. 9(a)
FIG. 9(c) is an enlarged view of a part of the sectional view.

FIG. 9(*a*) is a plan view showing a configuration of a substrate 5A according to Embodiment 2, FIG. 9(*b*) is a sectional view taken along a surface CC shown in FIG. 9(*a*), and FIG. 9(*c*) is an enlarged view of a part of the sectional view. In the same manner as the substrate 5 according to Embodiment 1, the substrate 5A according to embodiment 2 is applied to the light emitting device 4 of FIG. 3 and can be applied to the lighting device 1 of FIG. 1.

In Embodiment 1 described above, the intermediate layer 11, the reflective layer 12, and the protective layer 13 are formed on the aluminum base 10. The intermediate layer 11 is formed between the aluminum base 10 and the reflective layer 12 by using the AD method and has high thermal conductivity.

With respect to this, in the substrate 5A of Embodiment 2, an insulating reflective layer 24 and the protective layer 13 are formed on the aluminum base 10. The insulating reflective layer 24 is formed on the surface (upper surface) of the aluminum base 10 (see FIG. 9(*c*)). The insulating reflective layer 24 is obtained by increasing the reflectivity of the intermediate layer 11 of Embodiment 1.

By using the configuration described above, it is possible to provide a substrate for light emitting devices suitable for high-intensity lighting by using only the insulating reflective layer 24.

(Configuration of Substrate 5A)

The configuration of the substrate 5A according to Embodiment 2 will be described with reference to FIG. 9.

As shown in FIG. 9(*c*), in the substrate 5A, the insulating reflective layer 24 (first insulating layer) is formed on the surface of the aluminum base 10. The electrode pattern 14 is formed on the upper surface of the insulating reflective layer 24.

In Embodiment 1 described above, since the ceramic having high thermal conductivity, for example, alumina is formed between the aluminum base 10 and the reflective layer 12, as the intermediate layer 11, but when the reflectivity of the intermediate layer 11 is high, it is possible to provide a substrate for light emitting devices suitable for high-intensity lighting by using only the intermediate layer 11, without the reflective layer 12.

However, the maximum reflectivity of the layer formed of only alumina by using the AD method is 85% and light reflectivity is excellent, but it is not possible to obtain reflectivity exceeding 90% to 95% used for high-intensity lighting. In order to form a layer having high reflectivity described above, it is necessary to add an additive of an inorganic material for improving brightness with respect to alumina which is a base material.

Examples of the additive include titanium oxide, magnesium oxide, zinc oxide, barium sulfate, zinc sulfate, magnesium carbonate, calcium carbonate, and wollastonite. The additive is suitably selected, pulverized, processed to have a particle shape, and mixed with alumina particles so as to obtain material particles, and the material particles are accumulated on the aluminum base 10 by using the AD method, and accordingly, it is possible to form a layer having reflectivity exceeding 90% to 95% which cannot be achieved in a case where the layer is formed by only the alumina particles.

The thickness of the insulating reflective layer 24 is from 50 μm to 1000 μm. This is for forming the insulating reflective layer 24 having high reflectivity and excellent dielectric strength voltage properties.

In a case where alumina particles are used as a base material, a typical value of the thermal conductivity of the insulating reflective layer 24 is high as 15 W/(m·° C.), and accordingly, even when a thickness is 1.0 mm, for example, it is possible to ensure sufficient heat radiating properties so that the layer is used in the substrate for high-intensity lighting.

When the layer is formed by using the thermal spraying in a case of laminating layers using materials having different melting temperatures, properties in the layer formed may not be uniform. This may cause cracks generated on the ceramic layer or the peeling thereof, and irregularity of reflection. Therefore, it is necessary to particularly pay attention, in a case of forming the layer by using the thermal spraying using the materials having different melting temperatures.

With respect to this, according to the AD method, the ceramic particles are not set to be in a fused or in a semi-fused state and the ceramic particles and an additive are laminated at room temperature, and accordingly, it is possible to comparatively easily form a dense mixed ceramic layer having uniform configuration.

(Manufacturing Method of Substrate 5A According to Embodiment 2)

The manufacturing method of the substrate 5A according to Embodiment 2 will be described with reference to FIG. 10. FIG. 10(*a*) to FIG. 10(*d*) are sectional views for illustrating a manufacturing method of the substrate 5A according to Embodiment 2.

Figure 10:
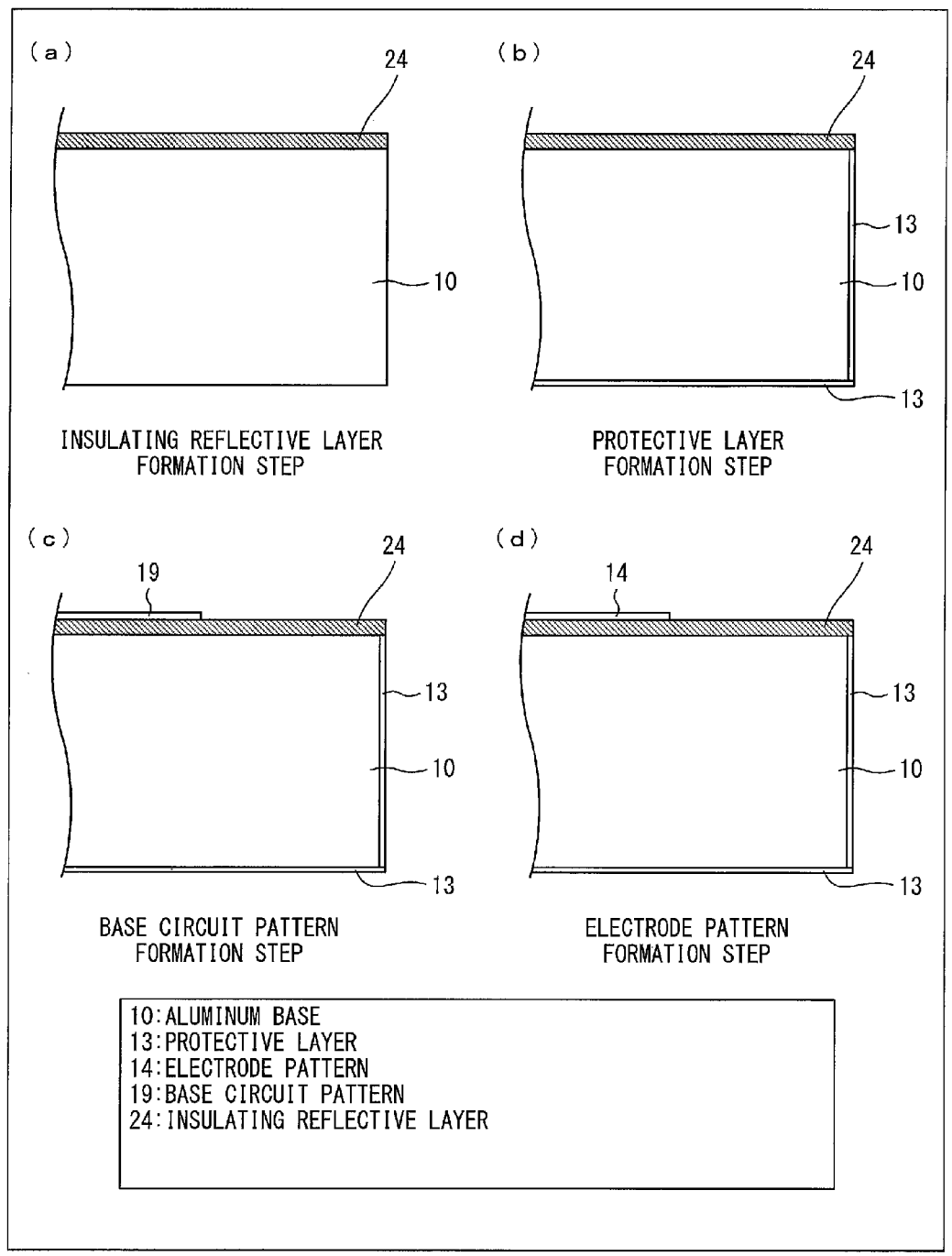
FIGS. 10(a) to 10(d) are sectional views for illustrating a manufacturing method of the substrate according to Embodiment 2.

First, as shown in FIG. 10(*a*), the insulating reflective layer 24 is formed on the surface of the aluminum base 10 (insulating reflective layer formation step). The formation method of the insulating reflective layer 24 is substantially the same as the forming method of the intermediate layer 11 of Embodiment 1, but a material of particles which is a raw material accumulated on the aluminum base 10 by using the AD method is different. In Embodiment 1, the ceramic layer is formed by using the AD method by using only the fine particles of alumina as a material, but in Embodiment 2, the ceramic layer is formed by using the AD method, not only the fine particles of alumina, but also using a material obtained by suitably mixing an additive for increasing brightness as fine particles is used as a raw material.

Here, after forming the ceramic fine particles having different materials independently, and the ceramic powder having the plurality of materials are suitably combined with each other to obtain raw material fine particles for AD method, but, after performing sintering of composite ceramic having increased brightness, the material is pulverized to obtain composite ceramic fine particles, and the composite ceramic fine particles may be used in the AD method. That is, the fine particles formed of different types may be used by mixing fine particles which are obtained by sintering and pulverizing the ceramic, or fine particles formed of single composite ceramic formed by mixing the plurality of ceramic raw material in a state of the raw material and sintering and pulverizing the single composite ceramic. The fine adjustment of brightness is more easily performed by using the former method, and in Embodiment 2, the former method having higher convenience is used.

At this time, since the insulating reflective layer 24 has high reflectivity, it is possible to provide a substrate for light emitting devices suitable for high-intensity lighting by using only the insulating reflective layer 24, without using the reflective layer 12. Accordingly, the reflective layer formation step can be omitted.

After that, as shown in FIG. 10(b), the protective layers 13 are formed so as to cover the rear surface and the side end surface of the aluminum base 10 (protective layer formation step). The forming method of the protective layer 13 is the same as in Embodiment 1.

That is, the sealing treatment is performed and an extremely thin alumite layer having a thickness of 10 μm or less, for example, 1 to 3 μm, is used as the protective layer 13. As described above, the thin alumite layer subjected to the sealing treatment does not function as a heat radiation layer, because holes of the porous film are covered. However, since the holes are covered, the alumite layer functions as a protective layer for preventing corrosion in the plating step and unnecessary precipitation of the plating and improving durability and corrosion resistance of the aluminum base 10 after completing the substrate.

Instead of the protective layer 13 described above, the electrode pattern 14 which will be described later may be formed by bonding protective sheets. The protective sheets can be easily peeled off, after the electrode pattern 14 is formed.

Next, as shown in FIG. 10(c), the base circuit pattern 19 is formed on the upper surface of the insulating reflective layer 24 (base circuit pattern formation step). Then, as shown in FIG. 10(d), the electrode pattern 14 is formed (electrode pattern formation step). The forming methods of the base circuit pattern 19 and the electrode pattern 14 are the same as those in Embodiment 1.

Comparative Example

A comparative example of Embodiment 2 will be described as follows with reference to FIG. 11. FIG. 11 is a diagram for illustrating a comparative example of the substrate 5A of Embodiment 2, a sectional view of a substrate 200, and a partially enlarged view of the vicinity of the portion where light emitting elements 206 are mounted.

In the substrate 200 described above, a material obtained by suitably mixing an additive for increasing brightness with alumina is set as a thermal sprayed material, and a ceramic layer 201 which is an insulating reflective layer formed by performing thermal spraying of this thermal sprayed material to the aluminum base 210 realizes high reflectivity suitable for high-intensity lighting. The ceramic layer 201 of FIG. 11 in this comparative example is formed by using the thermal spraying, but the insulating reflective layer 24 provided in the substrate 5A of Embodiment 2 shown in FIG. 9 is formed by using the AD method.

When the ceramic layer is formed on the metal base by using the thermal spraying, the surface thereof may be roughened. This is mainly because the particle diameter of the material particles used in the thermal spraying is greater than the particle diameter of the material used in the AD method. When the representative particle sizes of the raw material ceramic particles used in the film formation are compared to each other, the particles having comparatively large particle diameter of 10 to 50 μm are used in the thermal spraying, whereas the particle having comparatively small particle diameter of approximately 0.08 to 2 μm which are suitable for aerosolizing are used in the AD method.

Figure 11:
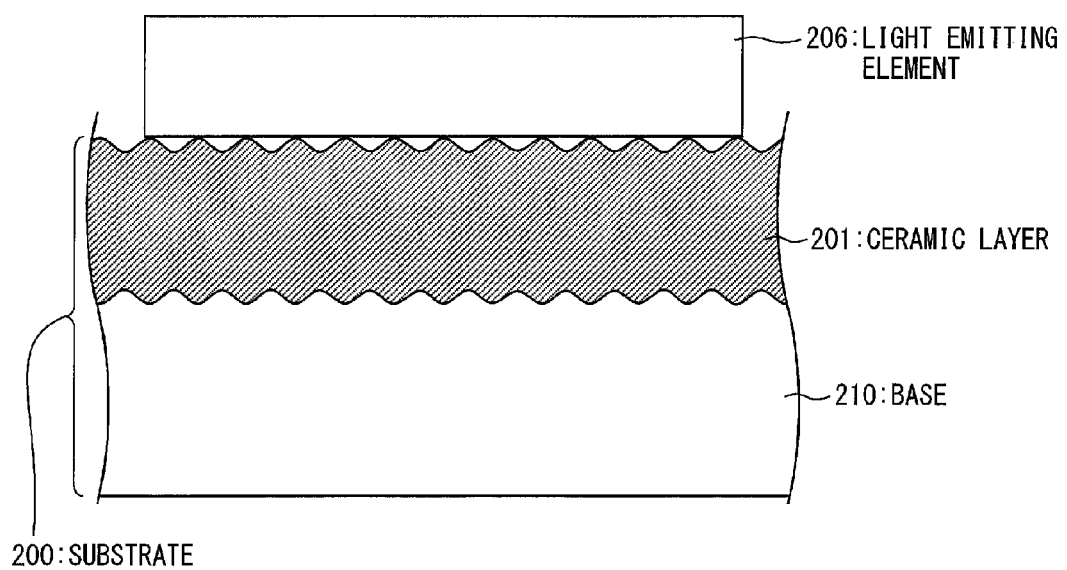
FIG. 11 is a schematic sectional view of a substrate according to a comparative example of Embodiment 2.

As shown in FIG. 11, in order to increasing adhesiveness between the aluminum base 210 and the ceramic layer 201, in a case of setting the surface of the aluminum base 210 to have convex and concave portions by blasting and laminating the ceramic layers 201 by using the thermal spraying, the effect of the corrugated shape of the aluminum base 210 obtained by blasting remains on the surface of the laminated ceramic layer 201. The depth of the convex and concave portions finally remaining on the surface of the ceramic layer 201 is large as approximately 20 μm to 40 μm or larger.

When the base circuit pattern 19 shown in FIG. 10 is formed on the surface having great convex and concave portions, disconnection occurs in the base circuit pattern 19. In addition, the light emitting elements 206 and the ceramic layer 201 mounted on the light emitting elements 206 are not sufficiently contacted with each other, the light emitting elements 206 and the ceramic layer 201 may have high heat resistance.

With respect to this, the insulating reflective layer 24 formed on the aluminum base 10 provided in the substrate 5A of Embodiment 2 is formed by using the AD Method. In the AD method, the particles having a comparatively small particle diameter of approximately 0.08 to 2 μm suitable for aerosolizing are used, and accordingly, the depth of the convex and concave portions finally remaining on the insulating reflective layer 24 is small as approximately 2 μm or smaller.

In a comparative example shown in FIG. 11, in order to increasing adhesiveness between the aluminum base 210 and the ceramic layer 201, the surface of the aluminum base 210 is set to have convex and concave portions by blasting and the ceramic layer 201 is laminated by using the thermal spraying. Even in the substrate 5A of Embodiment 2, the same blasting is performed with respect to the aluminum base 10, the insulating reflective layer 24 may be formed by using the AD method to improve adhesiveness between the aluminum base 10 and the insulating reflective layer 24. The convex and concave portions are formed on the surface of the aluminum base 10 by blasting, but the particles having a comparatively small particle diameter of approximately 0.08 to 2 μm suitable for aerosolizing are used as the ceramic fine particles used in the AD method, and accordingly, as the accumulation of ceramic proceeds, it is possible to decrease the convex and concave portions remaining on the insulating reflective layer 24. As a result, it is also possible to set the depth of the convex and concave portions finally remaining on the insulating reflective layer 24 after the lamination sufficiently proceeds, to be equal to or smaller than 5 μm.

The flatness of the insulating reflective layer 24 formed by using the AD method as described above is substantially the same as that of the ceramic substrate obtained by sintering of the ceramic, and it is possible to ensure flatness necessary as a substrate for light emitting devices for high-intensity lighting, without particularly performing a flattening operation such as mechanical polishing or buffing. Even in a case where it is necessary to perform a flattening operation such as mechanical polishing or buffing, it is possible to comparatively easily perform the polishing. Since the ceramic layer formed by using the AD method is formed of a dense layer, it is unusual that the ceramic layer is peeled from the metal base due to the polishing operation, or the ceramic particles in the ceramic layer are peeled, and a hole-shaped defected part having a size of 1 μm or larger is formed on the surface.

The particle diameter of the fine particles constituting the ceramic layer formed by using the AD method is from 0.08 to 2 μm at a stage of incorporating the fine particles to the aluminum substrate 10. However, the fine particles are pulverized when being incorporated to the aluminum substrate 10, the particle diameter is further decreased, and the ceramic layer formed by using the AD method becomes a dense layer having the fine particles having a particle diameter of 0.08 μm or smaller as a main material. Since the particle diameter of the fine particles constituting the ceramic layer is small, a large hole does not remain in the defected part, even when the fine particles are defected due to the polishing.

In the comparative example of FIG. 11, unlike the insulating reflective layer 24 obtained by using the AD method, the ceramic layer 201 is formed by using the thermal spraying, and accordingly, the depth of the convex and concave portions remaining on the surface of the ceramic layer 201, after forming the ceramic layer 201, is large as 20 μm to 40 μm or larger. Accordingly, in order to ensure flatness necessary for a substrate for light emitting devices for high-intensity lighting, it is necessary to perform the flattening treatment using polishing or the like with respect to the ceramic layer 201, in order to use the layer in practice by improving the comparative example of FIG. 11. However, it is generally difficult to perform the operation of flattening by decreasing the depth of the convex and concave portions remaining on the surface of the ceramic layer 201 which is 20 μm to 40 μm or larger to 2 to 3 μm or larger by using mechanical polishing or buffing.

The ceramic layer 201 is peeled from the metal base 210 due to the polishing operation, or the ceramic particles in the ceramic layer 201 are peeled, and a hole-shaped defected part having a size of 10 μm or larger is formed on the surface of the ceramic layer 201. The reason thereof is as follows. Compared to the particle diameter of the fine particle material used in the AD method described above, the particles having a comparatively large particle diameter of 10 to 50 μm are used in the thermal spraying of the comparative example of FIG. 11, and the particles are aggregated to form the ceramic layer 201, and accordingly, when the polishing is performed for flattening of the convex and concave portions, peeling easily occur or defects part are easily generated.

As it is clear from the description above, it is determined that it is effective to use the insulating reflective layer 24 formed by using the AD method as in Embodiment 2 as the substrate for light emitting devices for high-intensity lighting, compared to a case of using the ceramic layer 201 formed by the thermal spraying as in the comparative example of FIG. 11.

Modification Example 1 of Embodiment 2

Figure 4:
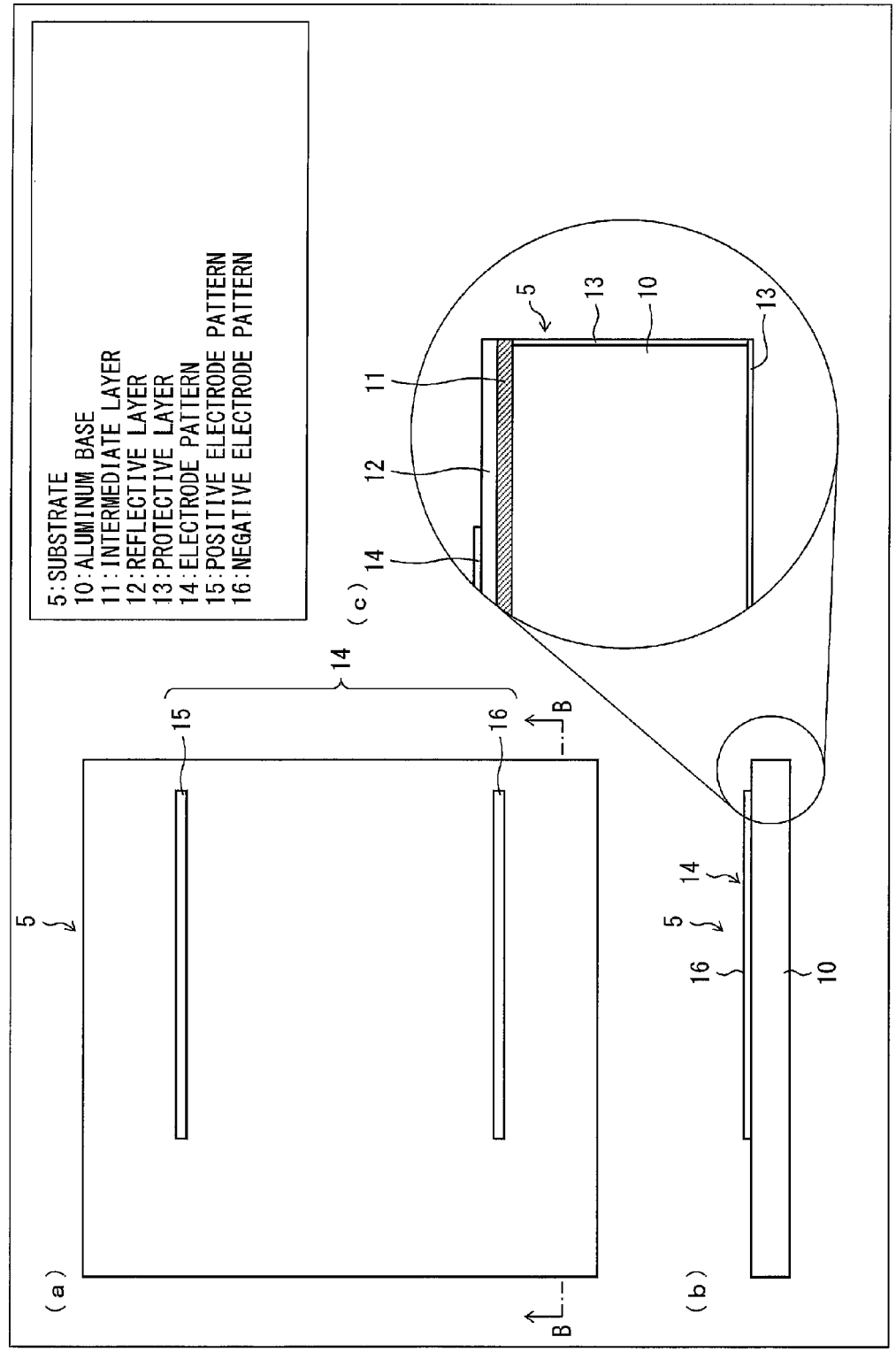
FIG. 4(a) is a plan view showing a configuration of a substrate provided in the light emitting device.
FIG. 4(b) is a sectional view taken along a plane BB shown in FIG. 4(a)
FIG. 4(c) is an enlarged view of a part of the sectional view.

In Embodiment 2, the insulating reflective layer 24 formed by using the AD method is configured with a single layer as shown in FIG. 9, but a two-layer structure may be used in which the insulating reflective layer 24 of Embodiment 2 is formed on the intermediate layer 11 of Embodiment 1, by replacing the reflective layer 12 of Embodiment 1 shown in FIG. 4 with a ceramic layer having increased reflectivity formed by using the AD method which is shown as the insulating reflective layer 24 of Embodiment 2. That is, the ceramic materials or compositions may be changed with the intermediate layer 11 and the reflective layer 12. When the intermediate layer 11 and the reflective layer 12 are compared to each other, the thermal conductivity of the intermediate layer is higher than that of the reflective layer and the light reflectivity of the reflective layer is higher than that of the intermediate layer. In this case, both of the intermediate layer 11 and the reflective layer 12 are formed by using the AD method. For example, in a case of using ceramic such as alumina as a base material of the reflective layer 12, an additive of an organic material for improving brightness is added to alumina, but in a case of using ceramic such as titanium oxide as a base material of the reflective layer 12, titanium oxide may be used alone without using an additive, because titanium oxide is ceramic having high brightness. A thickness of the reflective layer 12 is desirably smaller than a thickness of the intermediate layer 11.

Modification Example 2 of Embodiment 2

Figure 20:
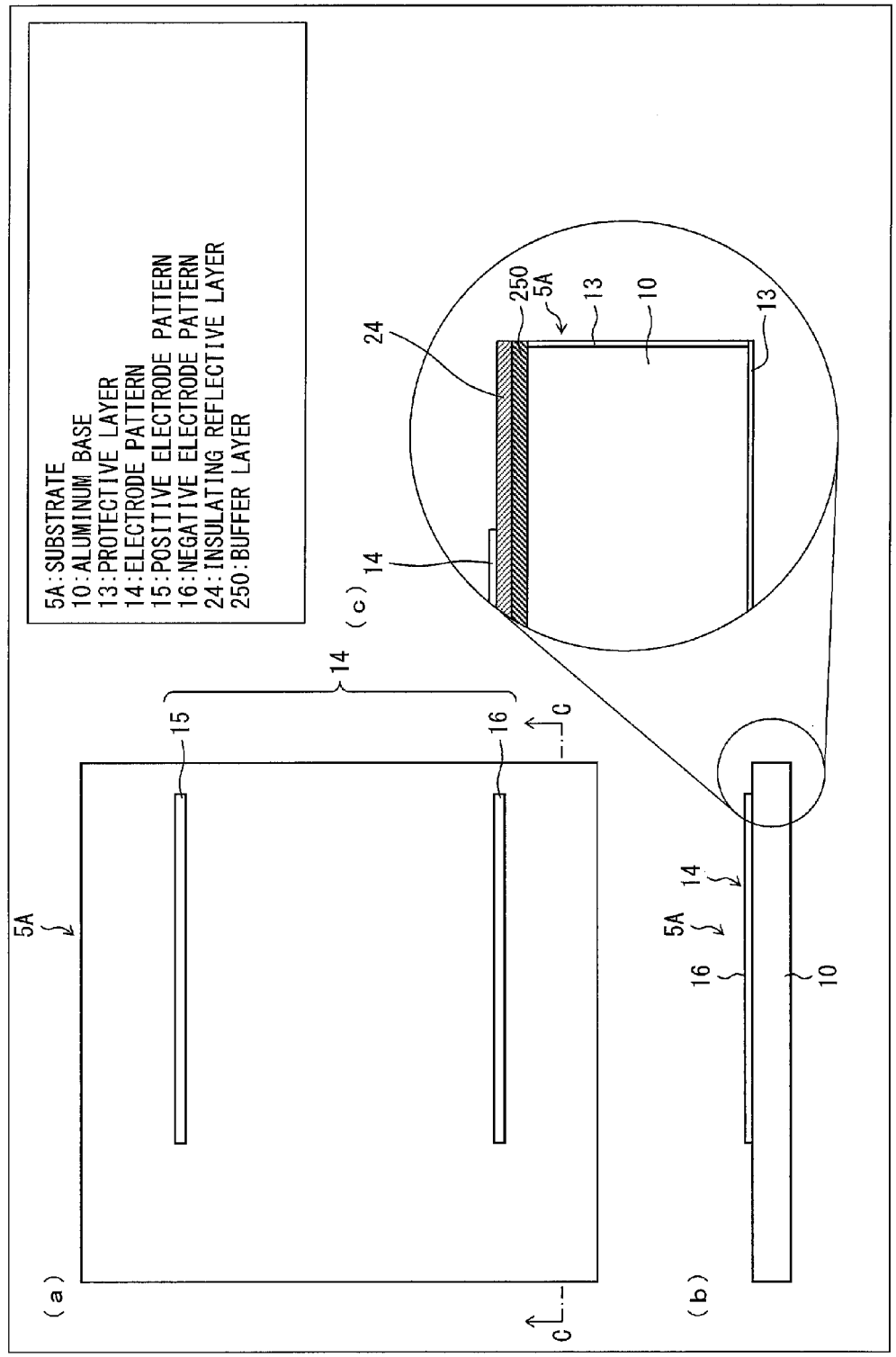
FIG. 20(a) is a plan view of a substrate according to a modification example 2 of Embodiment 2.
FIG. 20(b) is a sectional view taken along an arrow C-C shown in FIG. 20(a)
FIG. 20(c) is an enlarged view of a part of FIG. 20(b).

A modification example 2 of Embodiment 2 of the invention will be described as follows with reference to FIG. 20. FIG. 20 is a diagram for illustrating the configuration of the substrate 5A according to the modification example 2 of the substrate 5A of Embodiment 2. FIG. 20(*a*) is a plan view of the substrate 5A according to the modification example 2 of Embodiment 2, FIG. 20(*b*) is a sectional view taken along an arrow C-C shown in FIG. 20(*a*), and FIG. 20(*c*) is an enlarged view of a part of FIG. 20(*b*).

As shown in FIG. 20(*c*), the substrate 5A according to the modification example 2 of Embodiment 2 is different from the substrate 5A according to Embodiment 2, in that the buffer layer 250 is formed between the aluminum base 10 (base) and the insulating reflective layer 24. The other configurations of the substrate 5A according to the modification example 2 of Embodiment 2 are the same as those of the substrate 5A according to Embodiment 2.

In the substrate 5A according to Embodiment 2, the insulating reflective layer 24 is directly formed on the base 10 formed of metal such as aluminum plate. In a case where the substrate 5A according to Embodiment 2 is set as the substrate for light emitting devices, particularly, in a case where this substrate is used as a substrate for high-output light emitting devices, the base 10 formed of metal is repeatedly expanded and contracted due to effects of heat generated in the light emitting elements loaded on the substrate 5A according to Embodiment 2. Accordingly, the insulating reflective layer 24 formed on the base 10 may be peeled off or have deteriorated dielectric strength voltage properties due to mechanical loads received due to a difference in a coefficient of linear expansion between the insulating reflective layer and the metal base 10. In addition, the light emitting elements loaded on the substrate 5A according to Embodiment 2 may also have a decreased lifetime due to effects of heat history received due to a difference in a coefficient of linear expansion between the insulating reflective layer and the metal base 10.

Therefore, as shown in FIG. 20, the buffer layer 250 is formed between the aluminum base 10 (base) and the insulating reflective layer 24 in the substrate 5A according to the modification example 2 of Embodiment 2.

The base 10 is a substrate formed of a material having high thermal conductivity. The material of the base 10 is not particularly limited, as long as it is a material having high thermal conductivity, and a substrate formed of metal containing aluminum, copper, stainless steel, or iron as a material can be used, for example.

The structure shown in the modification example 1 of Embodiment 2 is the same as in a case where the buffer layer 250 is formed between the aluminum base 10 (base) and the intermediate layer 11.

The buffer layer 250 according to the modification example 2 of Embodiment 2 is the same as the buffer layer 250 described in the modification example of Embodiment 1, the description has been made in the modification example of Embodiment 1, and therefore, the description herein will be omitted. Specifically, when a case using alumina as the insulating reflective layer 24 is determined by using the LED using the sapphire substrate as the light emitting elements 6, the coefficient of linear expansion of sapphire is $7 \times 10^{-6}/°$ C. which is substantially the same as the coefficient of linear expansion of alumina, the thermal expansion and contraction synchronously occur, and accordingly, the mechanical loads to the light emitting elements 6 due to the thermal expansion and contraction of the insulating reflective layer 24 can be substantially ignored. The mechanical load due to the thermal expansion and contraction of the aluminum base 10 having a coefficient of linear expansion of $23 \times 10^{-6}/°$ C. is decreased and transmitted to the insulating reflective layer 24 through the buffer layer 250 having a smaller coefficient of linear expansion than that of the base 10 and is further decreased and transmitted to the light emitting elements 6 through the insulating reflective layer 24, and accordingly, the mechanical loads to the light emitting elements 6 are significantly decreased.

Embodiment 3

Figure 12:
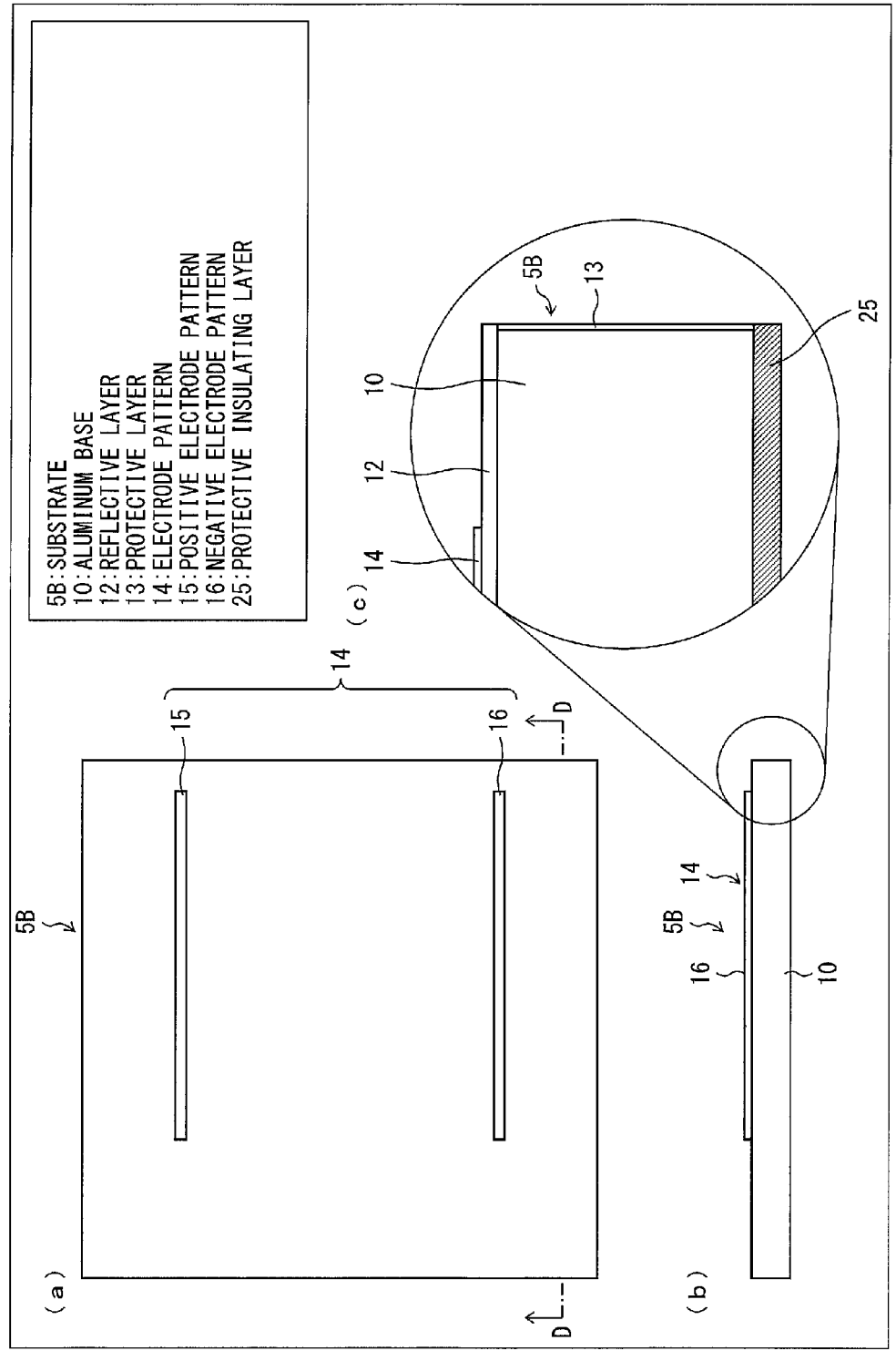
FIG. 12(a) is a plan view showing a configuration of a substrate according to Embodiment 3.
FIG. 12(b) is a sectional view taken along a plane DD shown in FIG. 12(a)
FIG. 12(c) is an enlarged view of a part of the sectional view.

Embodiment 3 of the invention will be described as follows with reference to FIG. 12 and FIG. 13. For convenience of description, the same reference numerals are used for the members having the same functions as the members described in the embodiment described above and the description thereof will be omitted.

In Embodiment 1, the intermediate layer 11, the reflective layer 12, and the protective layers 13 are formed on the aluminum base 10 (FIG. 4). The intermediate layer 11 is formed between the aluminum base 10 and the reflective layer 12 by using the AD method and has high thermal conductivity as an insulating layer.

With respect to this, in Embodiment 3, the reflective layer 12 (first insulating layer), the protective layer 13, and a protective insulating layer 25 (second insulating layer) are formed on the aluminum base 10. The reflective layer 12 is formed on the surface of the aluminum base 10 (see FIG. 12(c)). The protective insulating layer 25 has the same material as that of the intermediate layer 11 described in Embodiment 1 and is formed on the rear surface (lower surface) of the aluminum base 10 (see FIG. 12(c)) by using the AD method. The protective layer 13 is an aluminum anodic oxidation coating (alumite) and is formed on the end surface of the aluminum base 10 (see FIG. 12(c)). By using the configuration described above, since the layer thickness of the protective insulating layer 25 can be sufficiently greater than that of the intermediate layer 11 (FIG. 4), even in a case where it is difficult to ensure desired dielectric strength voltage properties because the thickness of the intermediate layer 11 is not increased in the substrate 5 (see FIG. 4) according to embodiment 1, it is possible to ensure desired dielectric strength voltage properties, according to a substrate 5B according to Embodiment 3.

(Configuration of Substrate 5B)

The configuration of the substrate 5B according to Embodiment 3 will be described with reference to FIG. 12. FIG. 12(a) is a plan view showing the configuration of the substrate 5B according to Embodiment 3, FIG. 12(b) is a sectional view taken along a plane DD shown in FIG. 12(a), and FIG. 12(c) is an enlarged view of a part of the sectional view.

As shown in FIG. 12(c), in the substrate 5B, the reflective layer 12 is formed on the surface of the aluminum base 10. The reflective layer 12 is formed of the same material as that of the reflective layer 12 described in Embodiment 1. In a case where the base is aluminum, an aluminum base surface which is suitable for high-intensity reflection and subjected to alumite treatment may be used as the reflective layer 12. The electrode pattern 14 is formed on the upper surface of the reflective layer 12.

The protective insulating layer 25 is formed on the rear surface of the aluminum base 10. The protective insulating layer 25 is formed on the aluminum base 10 with the same material by using the same method ad in a case of the intermediate layer 11 described in Embodiment 1. That is, the protective insulating layer 25 has ceramic formed by using the AD method. The protective layer 13 is an anodic oxidation coating (alumite) formed on the end surface of the aluminum base 10 by using anodic oxidation. In the substrate 5B, the intermediate layer 11 described in Embodiment 1 is not formed. In Embodiment 3, the protective insulating layer 25 has a function of the intermediate layer 11.

In a structure of the substrate 5 shown in Embodiment 1 (see FIG. 4) in which the reflective layer 12 and the intermediate layer 11 are disposed directly below the light emitting elements 6 (see FIG. 3), heat resistance of the reflective layer 12 and the intermediate layer 11 significantly affects the heat resistance of the entire substrate 5. In a case where it is necessary to set the layer thickness of the intermediate layer 11 than it was assumed to be, in order to obtain desired dielectric strength voltage properties, the heat resistance may increase more than it was assumed to be. In order to avoid this problem, the protective insulating layer 25 may be formed on the lower surface of the aluminum base 10 separated from the light emitting elements 6 (see FIG. 3), instead of the intermediate layer 11.

By forming the protective insulating layer 25 having lower thermal conductivity than that of the aluminum base 10 on the rear surface of the aluminum base 10 to be separated from the light emitting elements 6 (see FIG. 3), it is possible to decrease the heat resistance of the protective insulating layer 25 more than the intermediate layer 11, even when the protective insulating layer 25 has the same thermal conductivity as that of the intermediate layer 11 (see FIG. 4). This is because heat is diffused in a horizontal direction which is parallel to the surface of the substrate 5B, until heat passes through the protective insulating layer 25.

As described above, a contribution ratio of the heat resistance generated by the protective insulating layer 25 with respect to the heat resistance of the entire substrate 5B can be set to be extremely smaller than a contribution ratio of the heat resistance generated by the intermediate layer 11 (see FIG. 4) of Embodiment 1. Accordingly, the thickness of the protective insulating layer 25 can be set to be sufficiently greater than that in a case of using the intermediate layer 11, and accordingly, it is possible to increase dielectric strength voltage properties. At this time, even when the thickness of the protective insulating layer 25 is increased, an effect of the heat resistance of the protective insulating layer 25 to the heat resistance of the entire substrate 5B is slight. Thus, in the substrate 5B, even in a case where it is necessary to increase the thickness of the protective insulating layer 25, it is possible to ensure necessary dielectric strength voltage properties while keeping heat resistance low.

Specifically, in a case where the thickness of the intermediate layer 11 of Embodiment 1 exceeds 500 μm, for example, heat resistance of each of the light emitting elements 6 (see FIG. 3) of the light emitting device 4 (see FIG. 3) is increased, and accordingly, it is particularly desirable to use the configuration of the protective insulating layer 25 according to Embodiment 3. Even when the thickness of the intermediate layer 11 is equal to or smaller than 500 μm, it is desirable to ensure dielectric strength voltage properties of the substrate 5B using the protective insulating layer 25, instead of the intermediate layer 11, in a case where it is necessary to concern the hat radiating properties most.

The thickness of the reflective layer 12 is from 10 μm to 100 μm. The thickness of the protective insulating layer 25 is equal to or greater than 50 μm. Accordingly, it is possible to realize high reflectivity by using the reflective layer 12 and obtain excellent dielectric strength voltage properties by using the protective insulating layer 25.

The thickness of the reflective layer 12 is desirably smaller than the thickness of the protective insulating layer 25. Unlike the intermediate layer 11 of Embodiment 1 or the insulating reflective layer 24 of Embodiment 2, the upper limit of the thickness of the protective insulating layer 25 is not particularly limited and can be equal to or greater than 1000 μm. However, when considering efficiency of the formation of the ceramic layer by using the AD method, it is practically desirable to set the thickness thereof to be approximately equal to or smaller than 1000 μm.

Ensuring the main dielectric strength voltage by using the intermediate layer 11 (see FIG. 4) which is formed on the front surface of the aluminum base 10 as in Embodiment 1 or by using the protective insulating layer 25 which is formed on the rear surface of the aluminum base 10 as in Embodiment 3 is also determined depending on the lighting device to be manufactured, and accordingly, the determination thereof cannot be easily performed depending on heat resistance or ease of the manufacturing method. In Embodiment 1 and Embodiment 3, it is possible to select the configuration of the substrate used in the light emitting device 4. In addition, even in a case of using a copper base instead of the aluminum base 10, Embodiment 3 is satisfied in the same manner as described above.

(Manufacturing Method of Substrate 5B According to Embodiment 3)

Next, a manufacturing method of the substrate 5B according to Embodiment 3 will be described with reference to FIG. 13. FIG. 13(*a*) to FIG. 13(*d*) are sectional views for illustrating the manufacturing method of the substrate 5B according to Embodiment 3.

Figure 13:
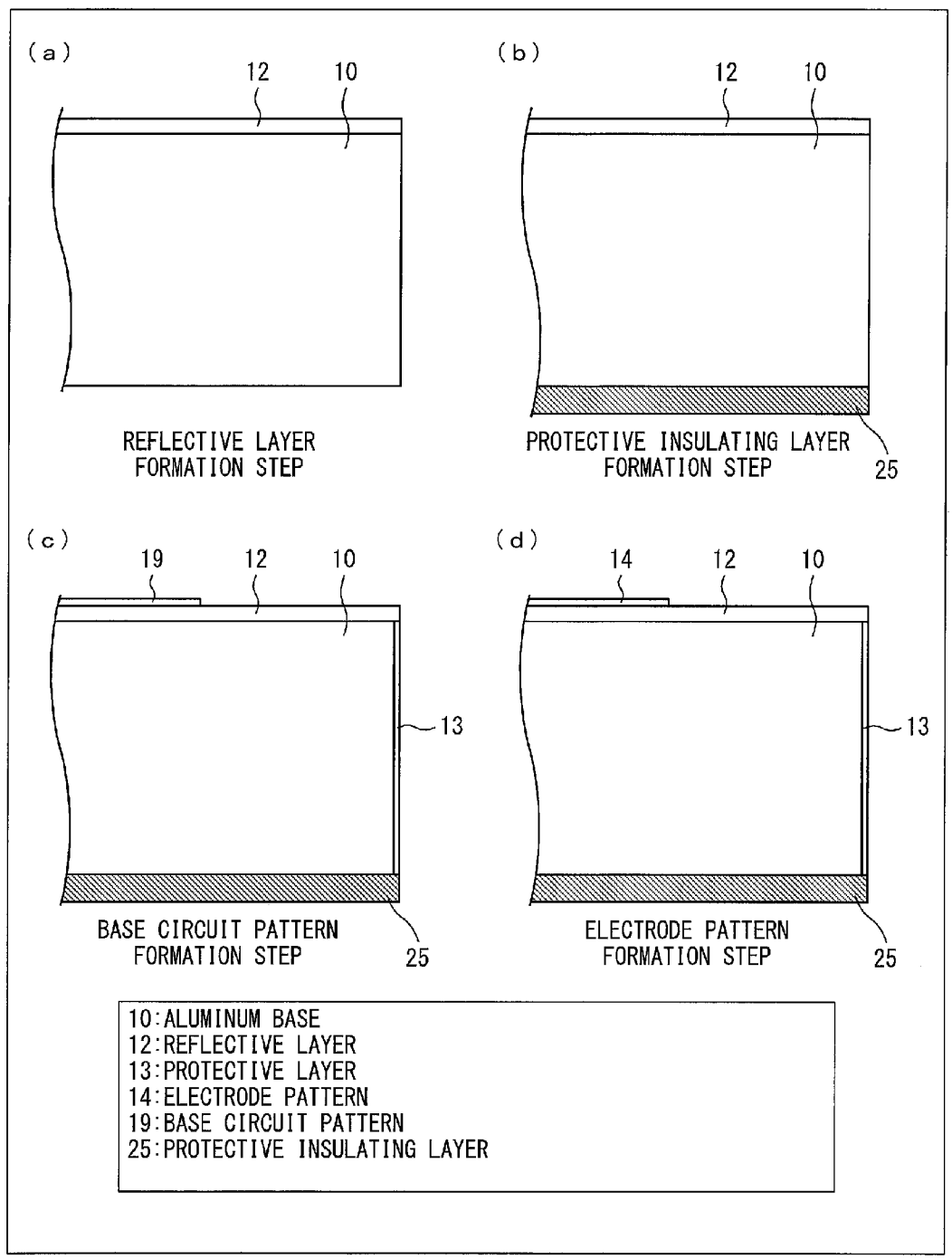
FIGS. 13(a) to 13(d) are sectional views for illustrating a manufacturing method of the substrate according to Embodiment 3.

First, as shown in FIG. 13(*a*), the reflective layer 12 is formed on the surface of the aluminum base 10 (reflective layer formation step). The forming method of the reflective layer 12 is the same as the forming method of the reflective layer 12 in Embodiment 1.

Then, as shown in FIG. 13(*b*), the protective insulating layer 25 is formed on the rear surface of the aluminum base 10 (protective insulating layer formation step). The forming method of the protective insulating layer 25 is the same as the forming method of the intermediate layer 11 (see FIG. 6) of Embodiment 1. At this time, since the protective insulating layer 25 is formed in a position separated from the light emitting elements 6 (see FIG. 6), it is possible to keep the heat resistance low, even when the thickness of the protective insulating layer 25 is formed to be greater than the thickness of the intermediate layer 11.

As shown in FIG. 13(*c*), the protective layer 13 is formed on the end surface of the aluminum base 10, and then, in the same manner as in Embodiment 1, the base circuit pattern 19 is formed on the upper surface of the reflective layer 12 (base circuit pattern formation step). After that, as shown in FIG. 13(*d*), the electrode pattern 14 is formed (electrode pattern formation step).

As described above, in Embodiment 3, the intermediate layer 11 described in Embodiment 1 is not formed. As described above, in Embodiment 3, the intermediate layer formation step can be omitted.

Modified Example of Embodiment 3

Figure 21:
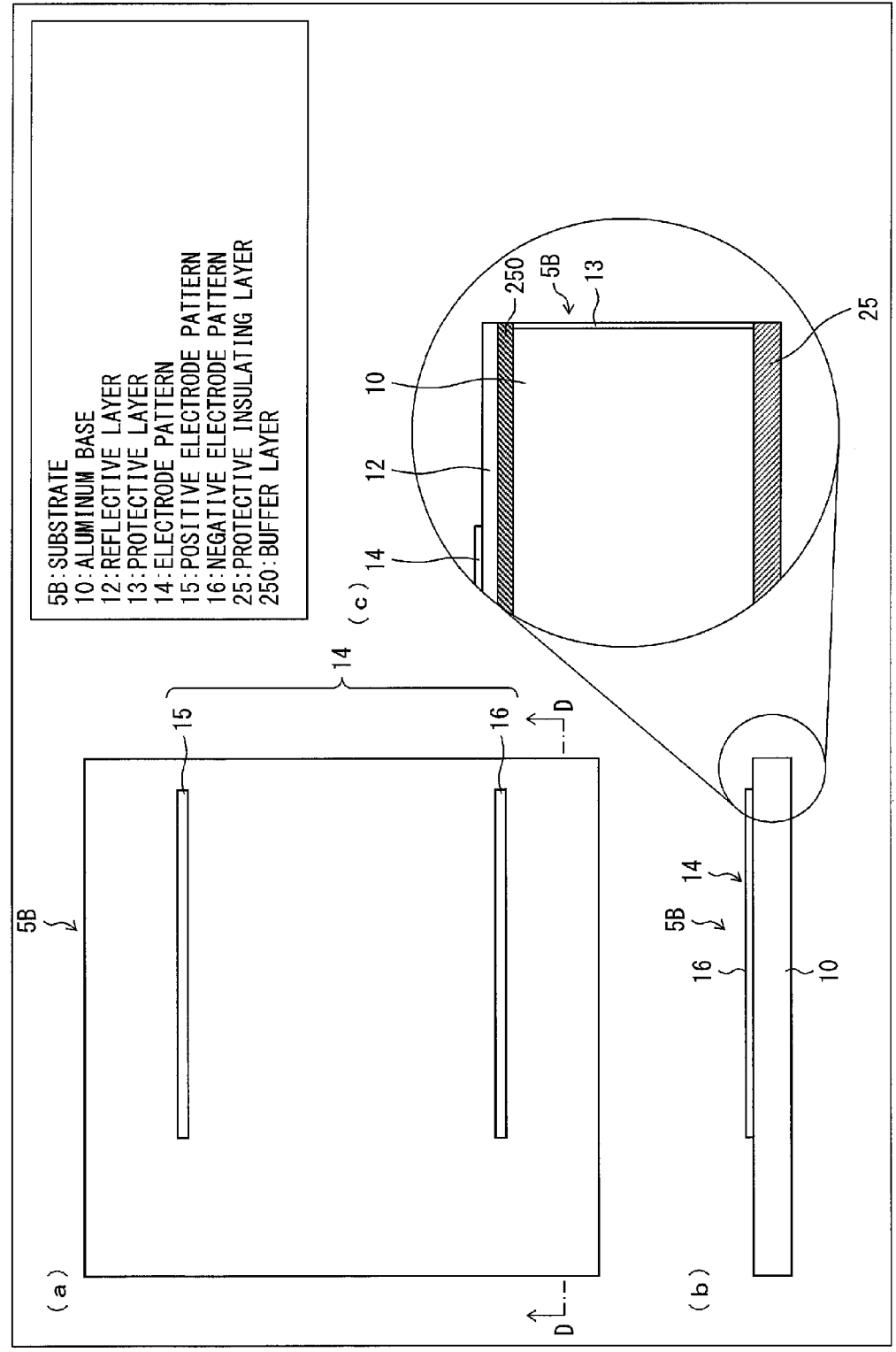
FIG. 21(a) is a plan view of a substrate according to a modification example of Embodiment 3.
FIG. 21(b) is a sectional view taken along an arrow D-D shown in FIG. 21(a)
FIG. 21(c) is an enlarged view of a part of FIG. 21(b).

A modified example of Embodiment 3 of the invention will be described as follows with reference to FIG. 21. FIG. 21 is a diagram for illustrating a configuration of the substrate 5B according to a modified example of Embodiment 3. FIG. 21(*a*) is a plan view of the substrate 5B according to the modification example of Embodiment 3, FIG. 21(*b*) is a sectional view taken along an arrow D-D shown in FIG. 21(*a*), and FIG. 21(*c*) is an enlarged view of a part of FIG. 21(*b*).

As shown in FIG. 21(*c*), the substrate 5B according to the modification example of Embodiment 3 is different from the substrate 5B according to Embodiment 3 in that the buffer layer 250 is formed between the base 10 (base) and the reflective layer 12. The other configurations of the substrate 5B according to the modification example of Embodiment 3 are the same as those of the substrate 5B according to Embodiment 3.

In the substrate 5B according to Embodiment 3, the reflective layer 12 is directly formed on the base 10 formed of metal such as an aluminum plate. In a case where the substrate 5B according to Embodiment 3 is set as the substrate for light emitting devices, particularly, in a case where this substrate is used as a substrate for high-output light emitting devices, the base 10 formed of metal is repeatedly expanded and contracted due to effects of heat generated in the light emitting elements loaded on the substrate 5B according to Embodiment 3. Accordingly, the reflective layer 12 formed on the base 10 may be peeled off or have deteriorated dielectric strength voltage properties due to mechanical loads received due to a difference in a coefficient of linear expansion between the reflective layer and the metal base 10. In addition, the light emitting elements loaded on the substrate 5B according to Embodiment 3 may also have a decreased lifetime due to effects of heat history received due to a difference in a coefficient of linear expansion between the reflective layer and the metal base 10.

Therefore, as shown in FIG. 21, the buffer layer 250 is formed between the aluminum base 10 (base) and the insulating reflective layer 24 in the substrate 5B according to the modification example of Embodiment 3.

The base 10 is a substrate formed of a material having high thermal conductivity. The material of the base 10 is not particularly limited, as long as it is a material having high thermal conductivity, and a substrate formed of metal containing aluminum, copper, stainless steel, or iron as a material can be used, for example.

The buffer layer 250 according to the modification example of Embodiment 3 is the same as the buffer layer 250 described in the modification example of Embodiment 1, the description thereof has been made in the modification example of Embodiment 1, and therefore, the description herein will be omitted.

In addition, it is more preferable to form a buffer layer formed of the same material and to have the same thickness as the buffer layer 250 between the base 10 and the protective layer 25.

Embodiment 4

Embodiment 4 of the invention will be described as follows with reference to FIG. 14 to FIG. 18. For convenience of description, the same reference numerals are used for the members having the same functions as the members described in the embodiment described above and the description thereof will be omitted.

Figure 14:
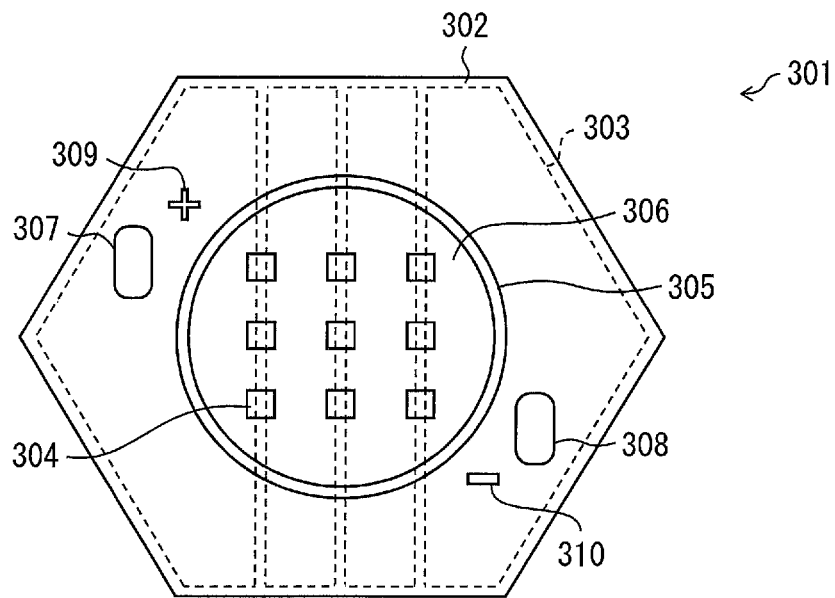
FIG. 14 is a plan view showing a configuration of a light emitting device according to Embodiment 4.
Figure 15:
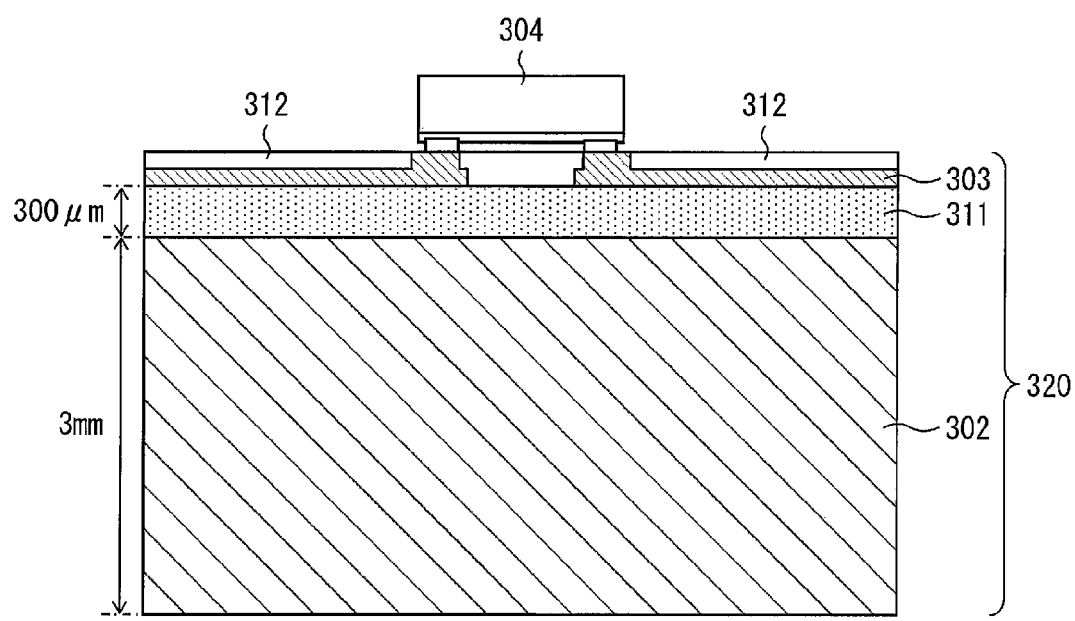
FIG. 15 is a sectional view showing a configuration of a substrate and a light emitting element provided in the light emitting device.

FIG. 14 is a plan view showing a configuration of a light emitting device 301 according to Embodiment 4. FIG. 15 is a sectional view showing configurations of a substrate (substrate for light emitting devices) 320 and a light emitting element 304 provided in the light emitting device 301. The light emitting device 301 according to Embodiment 4 can be applied to the lighting device 1 shown in FIG. 1 and may be used to be mounted on the heat sink 2, as shown in FIG. 2.

As shown in FIG. 14 and FIG. 15, the light emitting device 301 includes the substrate 320 and the light emitting elements 304. The substrate 320 includes a base 302, an intermediate layer (first insulating layer) 311 (see FIG. 15), an electrode pattern (wiring pattern) 303, and a reflective layer (second insulating layer) 312 (see FIG. 15).

The light emitting elements 304 electrically connected to the electrode pattern 303 and nine light emitting elements (LED chips) 304 arranged in three columns and three rows are shown in FIG. 14. The nine light emitting elements 304 have a connection configuration in which the light emitting elements are connected in parallel in three columns using the electrode pattern 303 and series circuits of three light emitting elements 304 are provided to each light emitting element in the three columns (that is, three series • three parallel). The number of the light emitting elements 304 is not limited to nine and the light emitting elements may not have a connection configuration of three series • three parallel.

The light emitting device 301 further includes a light-reflecting resin frame 305, a phosphor-containing sealing resin 306, an anode electrode (anode land or anode connector) 307, a cathode electrode (cathode land or cathode connector) 308, an anode mark 309, and a cathode mark 310.

The light-reflecting resin frame 305 is a disc-shaped (arc) frame formed of alumina filler-containing silicone resin which is provided on the electrode pattern 303 and the reflective layer 312. The material of the light-reflecting resin frame 305 is not limited thereto and may be an insulating resin having light reflectivity. The shape thereof is not limited to a disc (arc) shape, either, and an arbitrary shape can be used.

The phosphor-containing sealing resin 306 is a sealing resin layer formed of a transparent resin. A region surrounded by the light-reflecting resin frame 305 is filled with the phosphor-containing sealing resin 306 and the phosphor-containing sealing resin seals the electrode pattern 303, the light emitting elements 304, and the reflective layer 312. The phosphor-containing sealing resin 306 contains a phosphor. As the phosphor, a phosphor which is excited by primary light emitted from the light emitting elements 304 and emits light at a wavelength longer than that of the primary light is used.

The configuration of the phosphor is not particularly limited and can be suitably selected according to desired chromaticity of white color and the like. For example, as a combination of neutral white and light bulb color, a combination of a YAG yellow phosphor and (Sr, Ca) $AlSiN_3$:Eu red phosphor, or a combination of a YAG yellow phosphor and $CaAlSiN_3$:Eu red phosphor can be used. As a combination of high color rendering, a combination of a (Sr, Ca) $AlSiN_3$:Eu red phosphor and a $Ca_3$ (Sc, $Mg)_2Si_3O_3O_{12}$:Ce insulating phosphor or a $Lu_3Al_5O_{12}$:Ce insulating phosphor can be used. A combination of other phosphors may be used and a configuration of containing only a YAG yellow phosphor as false white.

The anode electrode 307 and the cathode electrode 308 are electrodes supplying a current for driving the light emitting elements 304 to the light emitting elements 304 and are provided in a state of a land. The anode electrode 307 and the cathode electrode 308 may be provided as a form of connectors, by installing connectors in the land portion. The anode electrode (anode land or anode connector) 307 and the cathode electrode (cathode land or cathode connector) 308 are electrodes capable of being connected to an external power supply (not shown) of the light emitting device 301. The anode electrode (anode land or anode connector) 307 and the cathode electrode (cathode land or cathode connector) 308 are connected to the light emitting elements 304 through the electrode pattern 303.

The anode mark 309 and the cathode mark 310 are respectively alignment marks which are references for performing positioning with respect to the anode electrode (anode land or anode connector) 307 and the cathode electrode (cathode land or cathode connector) 308. The anode mark 309 and the cathode mark 310 respectively have functions of showing polarity of the anode electrode (anode land or anode connector) 307 and the cathode electrode (cathode land or cathode connector) 308.

A thickness of a portion of the electrode pattern 303 immediately below the anode electrode (anode land or anode connector) 307 and the cathode electrode (cathode land or cathode connector) 308 is greater than a thickness of a portion of the electrode pattern 303 other than the portion immediately below the electrodes (corresponding to a portion of the electrode pattern 303 of FIG. 15 covered with the reflective layer 312).

Specifically, the thickness of the electrode pattern 303 immediately below the anode electrode (anode land or anode connector) 307 and the cathode electrode (cathode land or cathode connector) 308 is preferably from 70 µm to 300 µm and the thickness thereof in a portion other than the portion immediately below the electrodes is preferably from 35 µm to 250 µm. A heat radiating function of the light emitting device 301 is improved in a case of a great thickness of the electrode pattern 303. However, even in a case where the thickness of the electrode pattern 303 is increased to be greater than the range described above by allowing the thickness of the electrode pattern 303 to exceed 300 µm, heat resistance decreases and heat radiating properties are also improved, as long as the light emitting elements 304 are arranged at sufficient intervals. For example, when the intervals between the light emitting elements 304 are set as 600 μm or more which is double or more of 300 μm which is the thickness of the electrode pattern 303, it is possible to decrease heat resistance. When intervals between the light emitting elements are sufficiently provided as described above, heat radiating properties are improved, but the number of light emitting elements mounted on the substrate for light emitting devices decreases. The thickness of the electrode pattern 303 immediately below the anode electrode (anode land or anode connector) 307 and the cathode electrode (cathode land or cathode connector) 308 is set as 300 μm and the thickness thereof in a portion other than the portion immediately below the electrodes is set as 250 μm or smaller, as a measure of the practical limit, and there is no limitation according to the purpose or use.

The total of a base area of the electrode pattern 303 is preferably at least four times or more of the total area of electrode terminals for mounting the light emitting elements 304 in the electrode pattern 303. The thermal conductivity of the intermediate layer 311 shown in FIG. 15 is lower than the thermal conductivity of the electrode pattern 303, in a case of performing comparison with metal, and accordingly, when the electrode pattern 303 occupies a sufficiently wide area of a portion coming into contact with the intermediate layer 311, it is possible to decrease heat resistance applied to heat passing through the intermediate layer 311. A proportion of the area described above is set to be four times or more, when it is assumed that the thermal conductivity of the intermediate layer 311 is 15 W/(m·° C.), but in a case where the thermal conductivity of the intermediate layer 311 is lower than this, for example, 7.5 W/(m·° C.), the proportion of the area described above is desirably set to be eight times or more. As the thermal conductivity of the intermediate layer 311 decreases, it is desired to have great total of the base area of the electrode pattern 303 as much as possible.

(Substrate 320 (for Light Emitting Devices))

Hereinafter, each layer included in the substrate 320 will be described with reference to FIG. 15.

As shown in FIG. 15, the substrate 320 includes the base 302 formed of a metal material, the intermediate layer 311 having thermal conductivity which is formed on a surface of one side of the base 302, the electrode pattern 303 which is formed on the intermediate layer 311, and the reflective layer 312 having light reflectivity which is formed on the intermediate layer 311 and the electrode pattern 303 so that some parts of the electrode pattern 303 are exposed.

(Base 302 Formed of Metal Material)

In Embodiment 4, an aluminum base was used as the base 302 formed of a metal material. As an aluminum base, an aluminum plate having a size of 50 mm (length)×50 mm (width)×3 mm (thickness) can be used, for example. The advantages of aluminum are light weight, excellent workability, and high thermal conductivity. In addition, components other than aluminum may be contained in the aluminum base in a range not disturbing anodic oxidation. As mentioned below specifically, in Embodiment 4, the intermediate layer 311, the electrode pattern 303, the reflective layer 312 having light reflectivity can be formed on the base 302 at a comparatively low temperature, and accordingly, an aluminum base formed of low-melting-point metal having a melting point of 660° C. can be used as the base 302 formed of a metal material. Therefore, there is no limitation to the aluminum base and various materials can be selected as the base 302 formed of a metal material such as a copper base, for example.

(Intermediate Layer 311 Having Thermal Conductivity)

In the embodiment, as shown in FIG. 15, the intermediate layer 311 which is a ceramic insulator having thermal conductivity is formed between the base 302 formed of a metal material and the electrode pattern 303 or the reflective layer 312 having light reflectivity, in order to stably impart high heat radiating properties and high dielectric strength voltage properties to the substrate 320 (for light emitting devices).

The intermediate layer 311 is an insulating layer having excellent thermal conductivity which is formed on the base 302 formed of a metal material by using the AD method. A binder such as glass or a resin which decreases thermal conductivity is not used in the intermediate layer 311, and accordingly, the high level of the thermal conductivity of original ceramic is not deteriorated. Therefore, it is possible to realize the same dielectric strength voltage properties with low heat resistance, compared to an insulating layer formed using the binder. Since the ceramic layer (intermediate layer 311) formed by using the AD method is a dense film formed of particles typically having a smaller particle diameter than 0.1 μm, adhesiveness with the base 302 formed of a metal material is excellent and dielectric strength voltage properties per unit thickness is also high. Further, flatness of the layer (intermediate layer 311) formed by using the AD method is also high.

As described above, in Embodiment 4, since an aluminum base formed of low-melting-point metal having a melting point of 660° C. is used as the base 302 formed of a metal material, the intermediate layer 311 cannot be formed by directly sintering a ceramic sintered body on the aluminum base, but the intermediate layer 311 can be formed on the aluminum base by using the AD method.

That is, when the AD method is used, the intermediate layer 311 formed of only ceramic can be easily formed with high quality, without using a binder formed of glass or a resin.

As described above, since the good intermediate layer 311 having high heat radiating properties and high dielectric strength voltage properties can be formed on the substrate 320 (for light emitting devices), it is possible to stably impart high heat radiating properties and high dielectric strength voltage properties to the substrate 320.

As ceramic used for forming the intermediate layer 311, alumina is desirable due to high insulating properties and thermal conductivity and good balance therebetween, and thus, alumina is used in Embodiment 4. However, there is no limitation. In addition to alumina, aluminum nitride or silicon nitride is preferable because aluminum nitride or silicon nitride has excellent thermal conductivity and dielectric strength voltage properties.

In addition, silicon carbide has high thermal conductivity and zirconia or titanium oxide has high dielectric strength voltage properties. Accordingly, various metals are preferably suitably used according to the purpose or use of the intermediate layer 311.

Ceramic herein is not limited to a metal oxide and is ceramic in a broad sense containing aluminum nitride, silicon nitride, or silicon carbide, that is, contains all of inorganic solid materials. Among these inorganic solid materials, the ceramic may be any arbitrary material, as long as it is a stable material having excellent heat resistance and thermal conductivity and a material having excellent dielectric strength voltage properties.

It is desired that the intermediate layer 311 has higher thermal conductivity than that of ceramic particles which can be used in the reflective layer 312 which will be specifically described later.

In Embodiment 4, an insulating layer formed of alumina having higher thermal conductivity than that of zirconia is used as the intermediate layer 311. This is because an insulating layer containing zirconia particles is used as the reflective layer 312 in Embodiment 4. In order to form an electrical insulating layer by using the AD method, it is general to form an insulating layer formed of alumina by spraying alumina fine particles towards the base 302. The insulating layer formed of alumina described above is also preferable due to excellent thermal conductivity and dielectric strength voltage properties.

Both of the intermediate layer 311 and the reflective layer 312 which will be described later are insulating layers, but the reflective layer 312 having light reflectivity is good enough as long as it has a minimum thickness necessary for ensuring a light reflecting function. The light reflectivity of the reflective layer 312 having light reflectivity is dependent on a ceramic material to be mixed and the amount thereof, but reflectivity thereof is substantially saturated when a layer thickness is 10 μm to 100 μm. The dielectric strength voltage properties of the intermediate layer 311 are dependent on formation conditions of the insulating layer, but the intermediate layer 311 is preferably formed to have a layer thickness of 50 μm to 1000 μm, and the reflective layer 312 is preferably formed to have a layer thickness of 10 μm to 300 μm. In addition, the thickness of the reflective layer 312 is desirably smaller than the thickness of the intermediate layer 311.

The intermediate layer 311 is particularly preferably formed to have a layer thickness of 50 μm to 500 μm. When the intermediate layer 311 is formed to have a thickness of 100 μm, for example, it is possible to ensure at least dielectric strength voltage properties of 1.5 kV to 3 kV or more with only the intermediate layer 311, and when the intermediate layer 311 is formed to have a thickness of 500 μm, it is possible to ensure at least dielectric strength voltage properties of 7.5 kV to 15 kV with only the intermediate layer 311.

Here, since the electrode pattern 303 is directly formed on the intermediate layer 311, it is necessary to design the layer thickness of the intermediate layer 311 so that the dielectric strength voltage properties between the base 302 and the electrode pattern 303 are approximately 4 kV to 5 kV. It is possible to realize dielectric strength voltage properties of 4.5 kV, when the thickness of the intermediate layer 311 is at least 300 μm.

The thermal conductivity of a ceramic layer (intermediate layer 311) formed by using the AD method is similar to thermal conductivity of a ceramic layer formed by sintering and is, for example, a value of 10 to 30 W/(m·° C.). However, an insulating layer formed by solidifying ceramic particles using a binder formed of glass or a resin receives an influence of low thermal conductivity of glass or a resin, and thus, thermal conductivity thereof is normally approximately 1 to 3 W/(m·° C.). As described above, it can be said that thermal conductivity of a ceramic layer (intermediate layer 311) formed by using the AD method is higher by one digit, compared to thermal conductivity of an insulator layer formed by solidifying ceramic particles using a binder formed of glass or a resin.

Accordingly, in Embodiment 4, heat resistance of an insulating layer formed of alumina formed by using the AD method which is used as the intermediate layer 311 is approximately one tenth of heat resistance of an insulating layer formed by solidifying alumina particles using a binder formed of glass or a resin, and the same heat resistance is obtained by estimation of a layer thickness of 500 μm of the former insulating layer and a layer thickness of 50 μm of the latter insulating layer. When dielectric strength voltage properties for the thicknesses are the same, the heat radiating properties become same, even when the former insulating layer ensures a dielectric strength voltage which is ten times a dielectric strength voltage of the latter insulating layer.

The inner portion of the intermediate layer 311 may be suitably configured with a plurality of layers.

(Electrode Pattern 303)

The electrode pattern 303 formed on the intermediate layer 311 can be formed by a forming method of an electrode pattern of the related art, but the electrode pattern, in a case using the forming method of an electrode pattern of the related art, is configured with metal paste for an electrode base and a plating layer. An organic substance such as a resin is used as a binder in the metal paste for an electrode base, and accordingly, thermal conductivity was low and heat resistance was increased. In the formation method of the related art, it is necessary to perform printing, drying and plating treatment of the metal paste.

In Embodiment 4, the electrode pattern 303 is formed on the intermediate layer 311 by forming a copper conductive layer by using the AD method.

As shown in FIG. 15, in the substrate 320, since a copper conductive layer is directly formed on the intermediate layer 311 by using the AD method, excellent adhesiveness between the intermediate layer 311 and the electrode pattern 303 is obtained. Since a high-resistivity layer having low thermal conductivity is not interposed between the intermediate layer and the electrode pattern, it is possible to realize the substrate 320 having excellent heat radiating properties.

In order to increase the heat radiating properties of the substrate 320, it is effective to set a great layer thickness of the electrode pattern 303 having high thermal conductivity, and according to the AD method, it is possible to rapidly form a thick film conductive layer at room temperature.

The electrode pattern 303 is finally formed by performing scraping from the conductive layer by using etching after forming the conductive layer. The surface of the conductive layer formed by using the AD method is flat without many convex and concave portions, in the same manner as in the ceramic layer, and accordingly, it is not necessary to perform pretreatment of flattening the surface of the conductive layer by polishing or the like, in order to have a uniform etching depth. Even when the etching is performed in that state, it is possible to excellently scrape the electrode pattern 303 and there are no formation defects of the electrode pattern 303 or a short circuit between electrode terminals in a position where the light emitting elements 304 are mounted.

In the formation conductive layer, the thermal spraying may be performed, instead of the AD method. However, when the thermal spraying is used, great convex and concave portions are easily formed on the surface of the conductive layer, and accordingly, it is necessary to perform pretreatment of flattening using polishing or the like, at the time of scarping the electrode pattern 303 using etching. In addition, the material particles are normally heated to a high temperature in the thermal spraying, unlike the lamination performed at room temperature by the AD method. Therefore, it is necessary to pay attention for preventing oxidation of the surface of the metal particles.

As described above, it is found that it is most suitable to use the AD method, in order to form the conductive layer of the electrode pattern 303.

In Embodiment 4, copper is formed as the conductive layer for forming the electrode pattern 303, but there is no limitation, and a silver conductive layer may be formed.

Exposed portions of the electrode pattern 303 are portions of terminals electrically connected to the light emitting elements 304, portions corresponding to the anode electrode (anode land or anode connector) 307 and the cathode electrode (cathode land or cathode connector) 308 connected to an external wiring or an external device, and portions corresponding to the anode mark 309 and the cathode mark 310. The anode mark 309 and the cathode mark 310 may be formed on the reflective film 312.

As a connecting method of the light emitting device 301 and an external wiring or an external device, the anode electrode 307 and the cathode electrode 308 may be connected to an external wiring or an external device by soldering, or the light emitting device may be connected to an external wiring or an external device via connectors respectively connected to the anode electrode (anode land or anode connector) 307 and the cathode electrode (cathode land or cathode connector) 308.

(Reflective Layer 312 Having Light Reflectivity)

As shown in FIG. 15, in the substrate 320, the reflective layer 312 having light reflectivity is formed on the intermediate layer 311 and on some parts of the electrode pattern 303, so that some parts of the electrode pattern 303 are exposed.

The reflective layer 312 is formed of an insulating material which reflects light from the light emitting elements 304. In Embodiment 4, the reflective layer 312 is formed of an insulating layer containing ceramic, and a layer thickness thereof can be set as, for example, approximately 10 μm to 500 μm by considering reflectivity of the substrate 320. An upper limit of this thickness is limited by the thickness of the electrode pattern 303. When the electrode pattern 303 formed of copper is exposed, the light is absorbed, and accordingly, it is necessary to set the thickness which is great enough to cover the entire part of the electrode pattern 303, except for parts to be exposed. For example, in a case where a thickness of the conductive layer is set as 300 μm in order to increase heat radiating properties of the substrate 320, the reflective layer 312 is also set to have an optimal thickness equal to or smaller than 300 μm, in order to cover the conductive layer, and in a case where a thickness of the conductive layer is set as 500 μm, the reflective layer 312 is set to have an optimal thickness equal to or smaller than 500 μm.

Since thermal conductivity of the reflective layer 312 is lower than that of the intermediate layer 311 described above, the layer thickness of the reflective layer 312 is preferably a minimum thickness necessary for obtaining desired reflectivity. The layer thickness of the reflective layer 312 is suitable set to be approximately 50 μm to 100 μm as the thickness for achieving the object. In a case where the electrode pattern 303 has the maximum thickness and the coating is not sufficiently performed with this thickness, a third insulating layer may be interposed between the intermediate layer 311 and the reflective layer 312, and thermal conductivity of this layer is desirably higher than that of the reflective layer 312. As the third insulating layer, an insulating layer obtained by containing ceramic particles having excellent heat radiating properties in a glass binder or a resin binder may be used, a ceramic layer formed by using the AD method may be used, or the same alumina layer as the intermediate layer 311 may be used.

In Embodiment 4, the reflective layer 312 having light reflectivity is formed of an insulating layer containing zirconia particles which are light-reflectivity ceramic particles, and this insulating layer is formed by performing sintering using a glass binder.

As described above, in Embodiment 4, since an aluminum base is used as the base 302 formed of a metal material and an insulating layer formed of alumina which is a ceramic layer is used as the intermediate layer 311, it is possible to increase a firing temperature to be a temperature lower than a melting point of the base 302 formed of a metal material, in a formation process of the reflective layer 312 which is formed in a latter process.

The synthesis of vitreous matters by a sol-gel method is normally performed at 200° C. to 500° C., but firing is preferably performed at 400° C. to 500° C., in order to decrease the number of holes from a porous film generated in a vitreous gel state and to increase insulating properties.

Accordingly, in Embodiment 4, a sol used in the synthesis of vitreous matters by sol-gel method is used as a binder of zirconia particles and the reflective layer 312 having light reflectivity is applied onto the intermediate layer 311 and on the remaining parts of the electrode pattern 303 by screen printing, so that some parts of the electrode pattern 303 are exposed, and the reflective layer is dried at 200° C. to 300° C., and fired with the finish at 400° C. to 500° C.

The formation of the reflective layer 312 having light reflectivity may be performed by using spray coating. In this method, the reflective layer can be formed by coating a raw material by spray coating, drying and firing the material in the same manner as described above, and grinding some parts of the reflective layer 312 to expose some parts of the electrode pattern 303.

In Embodiment 4, zirconia particles are used as the light-reflectivity ceramic particles, but there is no limitation, and titan oxide particles or aluminum nitride particles can also be used in addition to zirconia. Alumina can be used as the light-reflectivity ceramic particles, in order to reduce light absorption by coating the electrode pattern 303.

The ceramic described herein is not limited to a metal oxide, either, and is ceramic in a broad sense containing aluminum nitride and contains general inorganic solid materials. Among these inorganic solid materials, the ceramic may be any arbitrary materials, as long as it is a stable material having excellent heat resistance and thermal conductivity and a material which is excellent in heat reflection and light scattering. However, ceramic particles causing light absorption are not suitable. Specifically, the color of silicon nitride, silicon carbide, and the like is normally black and are not suitable for ceramic particles used in the reflective layer 312.

Silica ($SiO_2$) fine particles may be mixed with the binder together with other ceramic and used in order to reinforce vitreous matter by the sol-gel method.

In Embodiment 4, since an aluminum base is used as the base 302 formed of a metal material, the reflective layer 312 is formed by sintering a glass-based binder using a sol-gel method at a firing temperature of 400° C. to 500° C. However, there is no limitation, and the reflective layer can be formed by using a method other than the sol-gel method.

For example, a method of forming a vitreous layer by remelting an element obtained by solidifying low-melting-point glass particles with an organic binder is used. It is necessary to set at least a temperature of 800° C. to 900° C. for performing remelting. However, in Embodiment 4 in which a ceramic layer represented by alumina is used as the intermediate layer 311, when the melting point of the base 302 formed of a metal material is set to be high as described below, a method of forming the reflective layer 312 where a high temperature process is necessary, can be used.

That is, a melting point of the aluminum base exceeds 660° C. in such a high temperature process, and accordingly, in this case, it is necessary to use an alloy material having a high melting point obtained by suitably mixing impurities with aluminum, as a material of the base 302. In a case where copper is used as a material of the base 302, a melting point of copper is 1085° C., and thus, copper can be used as it is, but copper may be used by increasing a melting point of the base 302 by suitably mixing impurities therewith.

Since a vitreous layer has excellent light resistance and heat resistance, a vitreous layer is preferably used in the formation of the reflective layer 312, and a resin having excellent heat resistance and light resistance can be used, instead of a vitreous matter. For example, the reflective layer 312 may be formed by using a silicone resin, an epoxy resin, a fluorine resin, or a polyimide resin as a binder with respect to the ceramic particles. Although vitreous matters are deteriorated in viewpoints of heat resistance and light resistance, it is advantageous that a hardening temperature is lower than that in the glass synthesis performed by a sol-gel method and a formation process is easily performed.

Hereinabove, the method of forming the reflective layer 312 by using ceramic particles having light reflectivity and the glass or resin binder has been described, but the insulating reflective layer 24 and the forming method thereof described in Embodiment 2 may be applied to the reflective layer 312 and the intermediate layer 311 and the forming method thereof in Embodiment 4. For example, in order to use ceramic obtained by mixing a brightening material such as titanium oxide with alumina as an additive as the intermediate layer 311 and the reflective layer 312, the ceramic layer described above may be formed by using the AD method.

The reflective layer 12 and the forming method thereof described in the modification example of Embodiment 2 may be applied to the reflective layer 312 and the forming method thereof in Embodiment 4. For example, in order to use ceramic formed of titanium oxide as the reflective layer 312, the ceramic layer described above may be formed by using the AD method.

The formation of the intermediate layer 311 is performed by using the AD method, but the formation of the reflective layer 312 is not limited thereto and may be performed by using the thermal spraying. This is because, as clearly shown in FIG. 15 in this embodiment, the light emitting elements 304 are not directly mounted on the reflective layer 312 and are mounted on the terminal portion of the wiring pattern 303, and accordingly, the convex and concave portions of the surface of the reflective layer 312 formed by using the thermal spraying do not affect heat radiating, and thus, the operation for the flatness of the surface of the reflective layer 312 is not compulsorily performed. This is a significant difference from the substrates shown in Embodiments 1 to 3 in which it is necessary to directly mount the light emitting elements 6 on the reflective layer 12 or the insulating reflective layer 24.

The inner portion of the reflective layer 312 of this embodiment may be suitably configured with a plurality of layers.

According to such a configuration, since a layer having high thermal conductivity can be disposed on a layer of the reflective layer 312 close to the intermediate layer 311 and a layer having high heat resistance can be disposed on a layer thereof on a side opposite thereto, it is possible to realize the substrate 320 for light emitting devices having high reflectivity, high heat radiating properties, dielectric strength voltage properties, long-term reliability containing heat resistance and light resistance. The values of thermal conductivity and heat resistance herein are relatively compared to each other in the reflective layer 312.

(Light Emitting Element 304)

In FIG. 15, the light emitting element 304 is mounted on the substrate 320 to be packaged. Here, the light emitting element 304 is electrically connected to a terminal part of the electrode pattern 303 by flip chip bonding. For realizing the electrical connection, a generally used method such as soldering, bump, or metal paste may be used.

In Embodiment 4, an LED element is used as the light emitting element 304, but there is no limitation and an EL element and the like can also be used.

In Embodiment 4, the light emitting element 304 is formed of a sapphire substrate.

(Manufacturing Step of Substrate 320)

Figure 16:
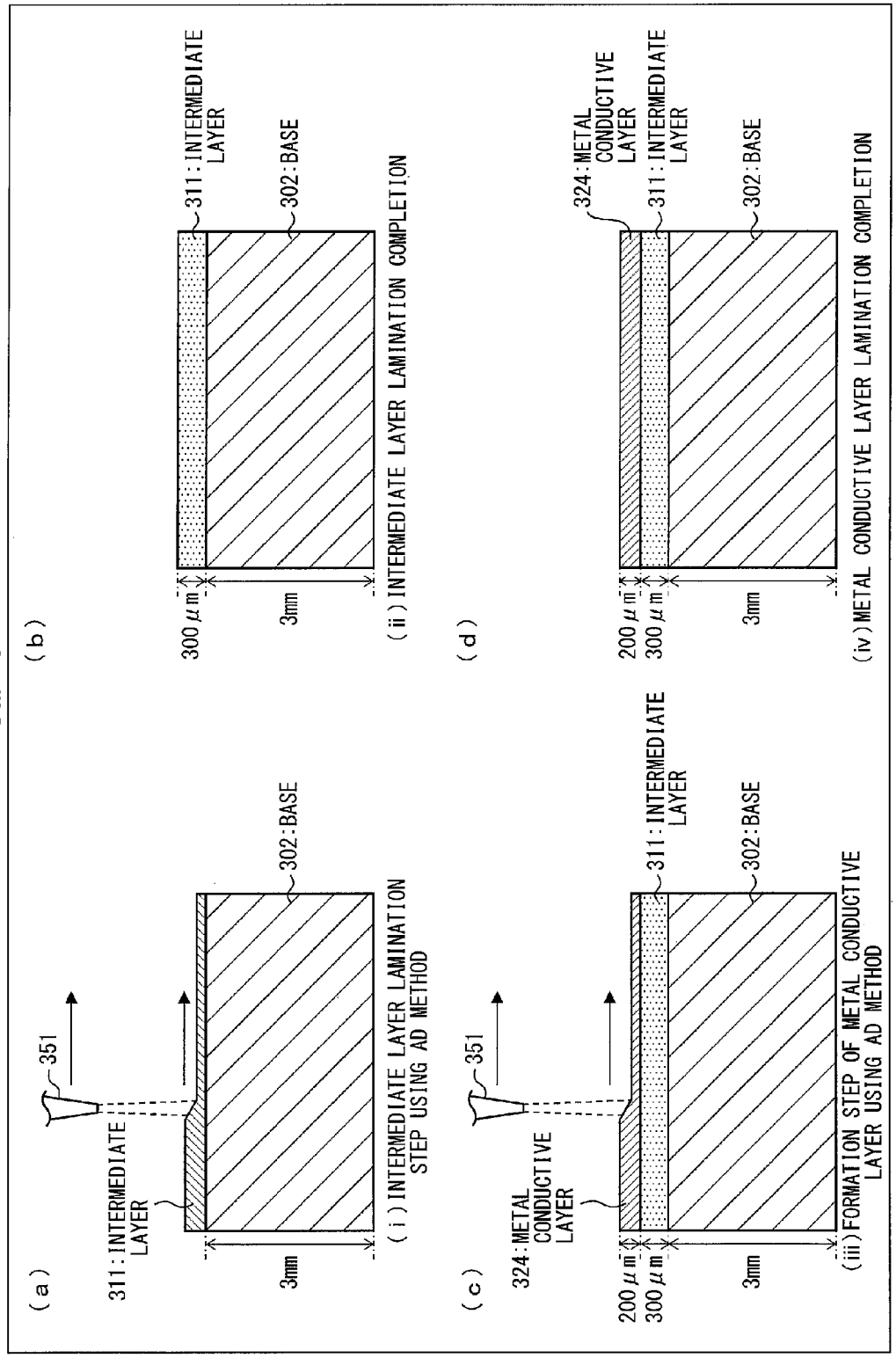
FIG. 16(a) to FIG. 16(d) are sectional views for illustrating a manufacturing method of the substrate according to Embodiment 4.
Figure 17:
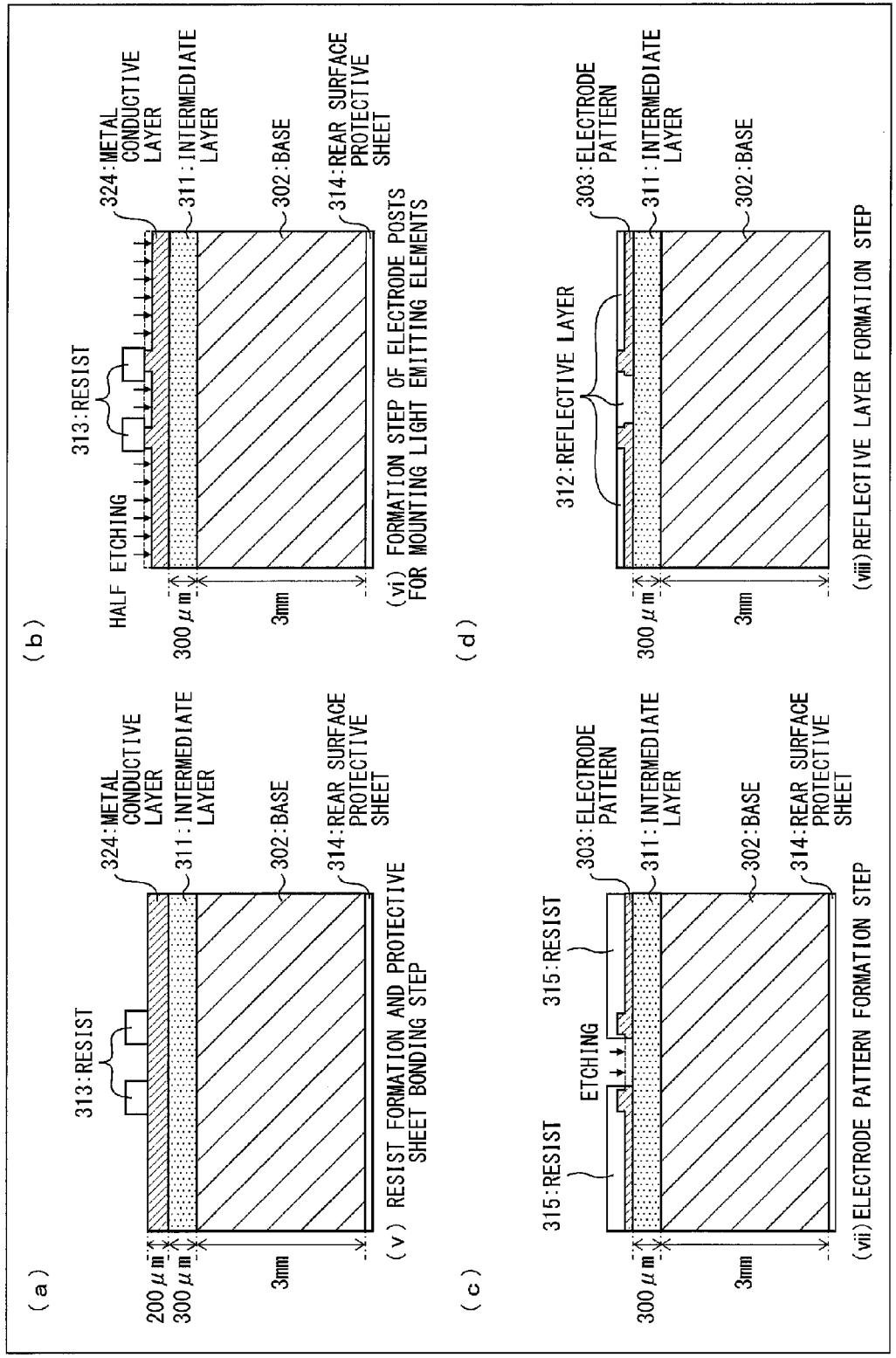
FIG. 17(a) to FIG. 17(d) are sectional views for illustrating a manufacturing method of the substrate according to Embodiment 4.

Hereinafter, a manufacturing step of the substrate 320 for light emitting devices will be described with reference to FIG. 16 and FIG. 17.

First, in a laminating step (1) of the intermediate layer 311 performed by the AD method, as shown in FIG. 16(a), the intermediate layer 311 formed of alumina was formed on one side (side where the intermediate layer 311 is formed) of an aluminum base having a thickness of 3 mm used as the base 302 by using a nozzle 351 by using the AD method. Adhesiveness with the ceramic in a case of forming the ceramic layer (intermediate layer 311) on the base 302 formed of metal by using the AD method is high, and accordingly, the ceramic layer is not peeled from the base 302, without performing special pretreatment before accumulation. However, for caution's sake, the ceramic layer may be formed, after the pretreatment for increasing adhesiveness is performed by roughening the surface of the base 302 by sandblasting, and then.

As shown in FIG. 16(b), the intermediate layer 311 having a thickness of 300 μm was completed (intermediate layer 311 laminating completion).

In Embodiment 4, the intermediate layer 311 is directly formed on the base 302 formed of metal, but if necessary, in order to improve adhesiveness between the base 302 and the intermediate layer 311, the intermediate layer 311 may be formed after roughening the surface of one side of the base 302 formed of aluminum by sandblasting. Since the adhesiveness is excellent in the formation of the ceramic layer performed by using the AD method, this step can be normally omitted.

Then, in a formation step of a metal conductive layer 324 performed by using the AD method, as shown in FIG. 16(c), a copper conductive layer having a thickness of 200 μm was formed on the intermediate layer 311 as the metal conductive layer 324 with the nozzle 351 by using the AD method, as shown in FIG. 16(d). In Embodiment 4, the metal conductive layer 324 is formed by using the AD method, but the metal conductive layer 324 may be formed by methods other than the AD method.

For example, after forming a thin conductive layer by using the AD method with respect to the intermediate layer 311 formed by using the AD method, a copper conductive layer may be precipitated to be thick by plating treatment. Alternatively, for example, an electrode layer may be formed by using printing of metal paste and formation of plating, in the related art.

In addition, the conductive layer can be formed by using the thermal spraying with respect to the intermediate layer 311 formed by using the AD method, but when the conductive layer is formed by using the AD method, the conductive layer has dense structure, higher adhesiveness, and lower heat resistance, has flat surface with less convex and concave portions on the surface of the conductor layer to be laminated, and an effect to the oxidation of the conductive layer is slight, and accordingly it is preferable to form the metal conductive layer 324 by using the AD method.

As in embodiment 4, when the metal conductive layer 324 is also formed by using the AD method, the surface of the conductive layer to be laminated is sufficiently flat, and accordingly, after that, the electrode pattern 303 can be directly formed, without performing the pretreatment for flattening the surface of the metal conductive layer 324.

Meanwhile, in a case where the size of the convex and concave portions of the metal conductive layer 324 formed is large, when the electrode pattern 303 is formed while leaving the convex and concave portions as they are, the etching for forming the electrode pattern 303 is unevenly performed and this may cause a short circuit between terminals and electrode defects. Accordingly, it is necessary to perform the pretreatment for flattening the convex and concave portions by using polishing or the like, before forming the electrode pattern 303, but when the metal conductive layer 324 is also formed by using the AD method, the sufficiently flat conductive layer is formed, and therefore, this pretreatment becomes unnecessary and can be omitted.

In a resist forming and protective sheet bonding step, as shown in FIG. 17(a), first, a rear surface protective sheet 314 was formed on a surface of the metal base 302 opposing to a surface where the intermediate layer 311 was formed. The rear surface protective sheet 314 is for preventing damage on the base 302, when forming resists 313 in a predetermined pattern.

In Embodiment 4, an example where the rear surface protective sheet 314 is only formed on a surface of the base 302 opposing to a surface where the intermediate layer 311 is formed is described, but it is also preferable to provide the rear surface protective sheet 314 on side surfaces of the base 302. After that, the resists 313 were formed on the entire surface of the flattened or flattened copper conductive layer (metal conductive layer 324), and a pattern of the resists 313 was formed so that resists 313 remain in terminal portions (electrode posts) of the copper conductive layer for electrical connection with respect to light emitting elements 304. It is necessary to perform at least a coating step, an exposing step, and a developing step, in order to form the resists 313 in a predetermined pattern, and thus, the rear surface protective sheet 314 protects the base 302, during these steps. In Embodiment 4, the rear surface protective sheet 314 was used, but there is no limitation, and an aluminum anodic oxidation coating (alumite layer) may be formed on side surfaces and a rear surface of a base 302 formed of aluminum, for example, instead of the rear surface protective sheet 314. In addition, it is more preferable to perform sealing treatment with respect to this aluminum anodic oxidation coating (alumite layer).

Then, in a formation step of electrode posts for mounting light emitting elements, as shown in FIG. 17(b), terminal portions (electrode posts) were formed on the metal conductive layer 324 by performing half etching of a copper conductive layer which is the metal conductive layer 324 by using dry etching, by using resists 313 as a mask.

Regarding the manufacturing step of the substrate 320, a case where the pattern of the resists 313 was formed so that resists 313 remain in terminal portions (electrode posts) of the copper conductive layer for electrical connection with the light emitting elements 304 has been described, but in the same manner as described above, it is desirable that the anode electrode (anode land or anode connector) 307, the cathode electrode (cathode land or cathode connector) 308, the anode mark 309, and the cathode mark 310 are respectively formed on the metal conductive layer 324 by forming a pattern of the resists 313 so that the resists 313 remain in a portion where the anode electrode (anode land or anode connector) 307, the cathode electrode (cathode land or cathode connector) 308, the anode mark 309, and the cathode mark 310 are formed, and performing half etching of a copper conductive layer which is the metal conductive layer 324 by using dry etching, by using resists 313 as a mask (not shown in FIG. 17(a)).

After that, in a wiring pattern formation step, first, after peeling off and removing the resists 313 shown in FIG. 17(b), resists 315 were formed so that only a region between the electrode portions of the copper conductive layer is exposed, as shown in FIG. 17(c). Then, the electrode pattern 303 was completed by performing dry etching (or wet etching) of the copper conductive layer by using resists 315 as a mask and electrically separating two terminal portions.

In a reflective layer formation step, first, after peeling off and removing the resists 315 shown in FIG. 17(c), the reflective layer 312 was completed by coating vitreous matters containing zirconia particles by screen printing so that the terminal portions (electrode posts) of the copper conductive layer are exposed, performing drying at 200° C. to 300° C., and performing firing at 400° C. to 500° C., as shown in FIG. 17(d). In Embodiment 4, since the screen printing is used, a step of exposing the terminal portions is not separately necessary.

In a case of forming the reflective layer 312 having light reflectivity using the screen printing, it is necessary to separately perform a step of exposing the terminal portions by coating a raw material by spray coating, drying and firing the material in the same manner as described above, and grinding some parts of the reflective layer 312.

Finally, the substrate 320 on which the light emitting elements 304 are mounted as shown in FIG. 15 was completed by performing the flip chip bonding of the light emitting elements 304 as flip-chip type LED chips to the terminal portions of the electrode pattern 303 of the substrate 320 for causing electrical connection. As the electrical bonding, bonding may be suitably performed by a Au bump method or soldering.

According to the type of soldering to be used, the terminal portions of the electrode pattern 303 may be covered with plating using Au or the like, if necessary. For example, in a case of using AuSn soldering, Au plating is necessary to be performed.

Comparative Example According to Embodiment 4

Next, a comparative example according to Embodiment 4 will be described with reference to FIG. 18. A substrate 320A for light emitting devices which will be described in the comparative example is different from the substrate 320 for light emitting devices which has been described in Embodiment 4, in that the intermediate layer 311 is replaced with a thermal-sprayed alumina layer 311B and a flattening layer 311C which is an alumina-containing glass layer covering the thermal-sprayed alumina layer 311. For convenience of description, the same reference numerals are used for the members having the same functions as the members shown in the drawings of Embodiment 4 and the description thereof will be omitted.

Figure 18:
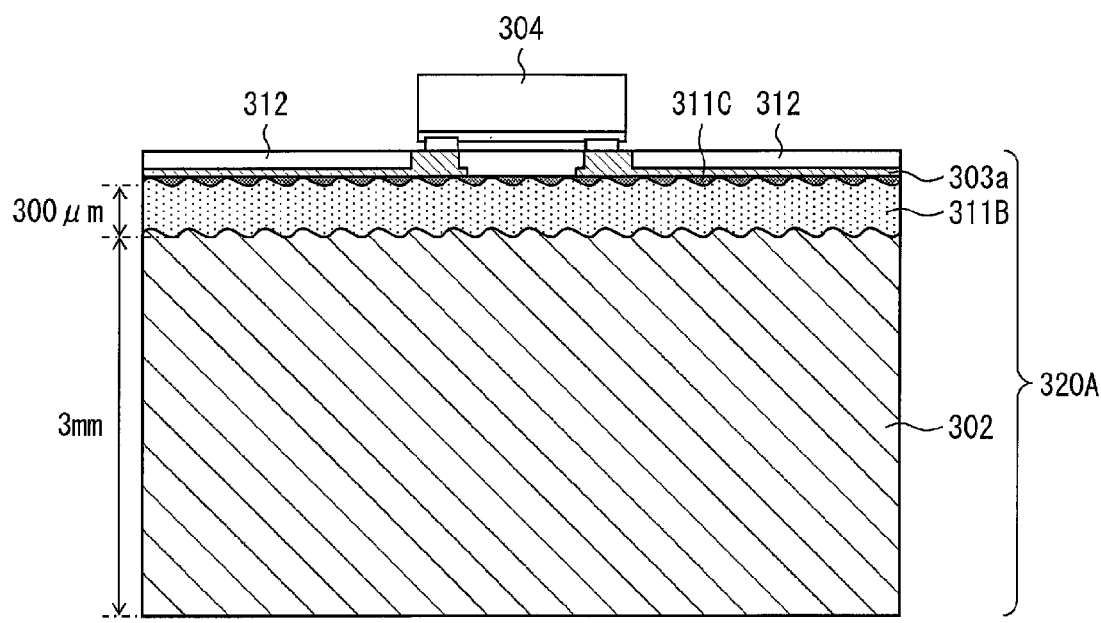
FIG. 18 is a schematic sectional view of a substrate according to a comparative example of Embodiment 4.

FIG. 18 is a diagram schematically showing a cut-out surface of a light emitting device obtained by mounting the light emitting elements 304 which are flip-chip type LED chips on the substrate 320A for light emitting devices.

As shown in FIG. 18, the substrate 320A is different from the substrate 320 shown in FIG. 15 in that the intermediate layer 311 which is an alumina layer formed by using the AD method is replaced with the alumina layer 311B formed by using the thermal spraying and a layer which coats the surface thereof with the flattening layer 311C formed of an alumina-containing glass layer.

The surface of the alumina layer 311B formed by using the thermal spraying is formed to have convex and concave portions, and when the depth of the convex and concave portions is observed, the depth thereof is normally 20 μm to 40 μm or larger. The convex and concave portions of the surface of the alumina layer 311B are embedded for flattening by coating the surface of the alumina layer 311B described above with the flattening layer 311C formed of an alumina-containing glass layer.

An electrode pattern 303a containing the electrode terminal portions for mounting the light emitting elements 304 can be formed in the same manner as in Embodiment 4. By performing flattening of a base surface for forming the electrode pattern 303a which is a copper electrode layer as described above, the formation of the electrode pattern 303a by using etching is stably performed with excellent precision.

Meanwhile, when the electrode pattern is formed by using etching in the same manner as in Embodiment 4, by laminating a copper conductive layer, while leaving the convex and concave portions on the surface of the alumina layer 311B, the etching for forming the electrode pattern is unevenly performed in the vicinity of the boundary of the alumina layer 311B and the conductive layer, and this may cause a short circuit between terminals and electrode defects.

Accordingly, regarding the convex and concave portions on the surface of the alumina layer 311B formed by using the thermal spraying, it is necessary to perform the pretreatment for flattening by forming the flattening layer 311C formed of an alumina-containing glass layer or grinding the surface thereof, before laminating the electrode pattern 303a.

However, when the intermediate layer 311 is formed by laminating an alumina layer by using the AD method as in Embodiment 4 shown in FIG. 15, the surface of the alumina is sufficient flat, and accordingly, it is not necessary to perform the pretreatment for flattening which was necessary for the alumina layer formed by using the thermal spraying. That is, in Embodiment 4 using the AD method, the conductive layer (electrode pattern) can be immediately laminated, without performing the flattening treatment such as grinding, after the formation of the intermediate layer 311, and therefore, there is no risk of contamination of the substrate and the laminated boundary surface due to the grinding.

In Embodiment 4, an outer shape of the base 302 in a base surface direction is hexagon, shown in FIG. 14, but the outer shape of the base 302 is not limited thereto, and arbitrary closed figure shapes can be used. The closed figure shape may be a closed figure shape in which circumference of a closed figure is configured with only a linear line or only a curve, or the closed figure shape may be a closed figure shape in which circumference of a closed figure contains at least a linear portion and at least a curved portion. The closed figure shape is not limited to a convex figure shape and may be a concave figure shape. For example, as an example of a convex polygonal shape configured with only a linear line, shapes of a triangle, a square, a pentagon, an octagon, and the like may be used, or arbitrary concave figure shapes may be used. As an example of a closed figure shape configured with only a curve, a circular shape or a elliptical shape may be used, or a closed figure shape such as a shape having a convex curve or a shape having a concave curve may be used. In addition, a shape of a racetrack may be used as a closed figure shape containing at least a linear portion and at least a curved portion.

Modified Example of Embodiment 4

Figure 22:
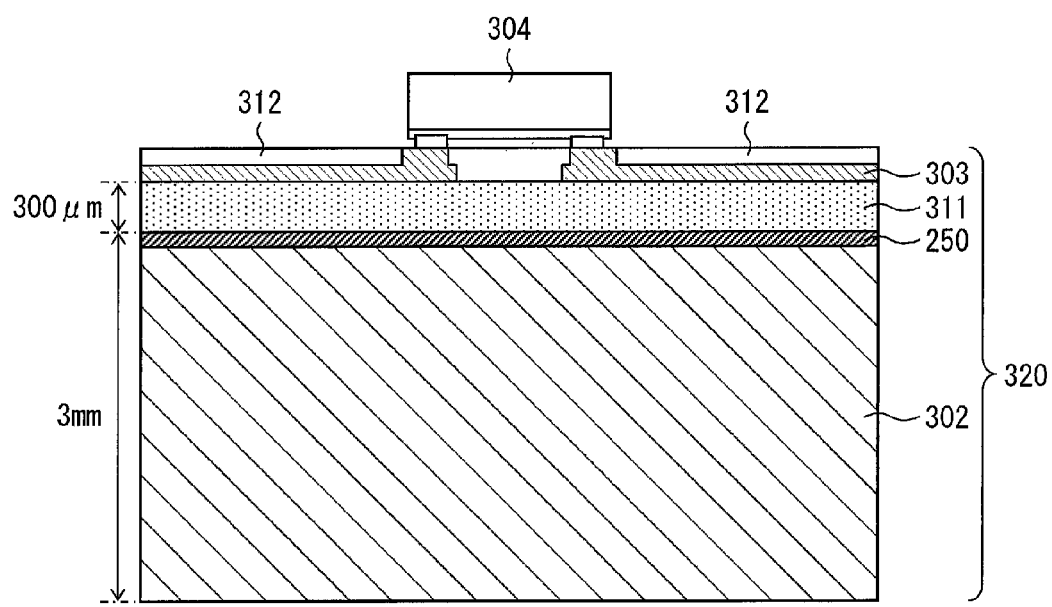
FIG. 22 is a sectional view showing a configuration of a substrate and a light emitting element provided in a light emitting device according to a modification example of Embodiment 4.

A modified example of Embodiment 4 of the invention will be described as follows with reference to FIG. 22. FIG. 22 is a diagram for illustrating a configuration of the substrate 320 according to a modified example of the substrate 320 of Embodiment 4. FIG. 22 is a sectional view showing the configuration of the substrate (substrate for light emitting devices) 320 and the light emitting elements 304 provided in the light emitting device 301 according to the modified example of Embodiment 4.

As shown in FIG. 22, the substrate 320 according to the modified example of Embodiment 4 is different from the substrate 320 according to Embodiment 4 in that the buffer layer 250 is formed between the base 302 and the intermediate layer 311. The other configurations of the substrate 320 according to the modification example of Embodiment 4 are the same as those of the substrate 320 according to Embodiment 4.

In the substrate 320 according to Embodiment 4, the intermediate layer 311 is directly formed on the base 302 formed of metal such as an aluminum plate. In a case where the substrate 320 according to Embodiment 4 is set as the substrate for light emitting devices, particularly, in a case where this substrate is used as a substrate for high-output light emitting devices, the base 302 formed of metal is repeatedly expanded and contracted due to effects of heat generated in the light emitting elements loaded on the substrate 320 according to Embodiment 4. Accordingly, the intermediate layer 311 formed on the base 302 may be peeled off or have deteriorated dielectric strength voltage properties due to mechanical loads received due to a difference in a coefficient of linear expansion between the intermediate layer and the metal base 10. In addition, the light emitting elements loaded on the substrate 320 according to Embodiment 4 may also have a decreased lifetime due to effects of heat history received due to a difference in a coefficient of linear expansion between the intermediate layer and the metal base 302.

Therefore, as shown in FIG. 22, the buffer layer 250 is formed between the base 302 and the insulating reflective layer 24 in the substrate 320 according to the modification example of Embodiment 4.

The base 302 is a substrate formed of a material having high thermal conductivity. The material of the base 302 is not particularly limited, as long as it is a material having high thermal conductivity, and a substrate formed of metal containing aluminum, copper, stainless steel, or iron as a material can be used, for example.

The buffer layer 250 according to the modification example Embodiment 4 is the same as the buffer layer 250 described in the modification example of Embodiment 1, the description has been made in the modification example of Embodiment 1, and therefore, the description herein will be omitted.

Embodiment 5

The buffer layer 250 used in the substrate for light emitting devices shown in the modification example of Embodiments 1 to 4 is not limited to metal or an alloy, and the buffer layer 250 may be formed using a resin formed in a sheet shape or a paste-like resin, instead thereof.

In this case, an additive may be suitably added, in order to adjust physical properties such as thermal conductivity and a coefficient of linear expansion of the buffer layer 250, and ceramic particles, glass fibers, metal particles, and the like are used as an additive.

A resin constituting the buffer layer 250 may be selected from an epoxy resin, a silicone resin, a polyimide resin, and a fluorine resin having excellent heat resistance.

More specifically, a commercially available insulating sheet for a radiation board may be used as the buffer layer 250.

Since an epoxy resin is used as a binder in the ceramic particles, a value of a coefficient of linear expansion of the commercially available insulating sheet for a radiation board is $10 \times 10^{-6}/°$ C. to $15 \times 10^{-6}/°$ C., and the value thereof indicates an intermediate coefficient of linear expansion of the coefficient of linear expansion of aluminum which is $23 \times 10^{-6}/°$ C. and the coefficient of linear expansion of alumina as a representative ceramic material which is $7 \times 10^{-6}/°$ C. In addition, dielectric strength voltage properties with the thermal conductivity of 5 W/(m·K) and a thickness of 100 μm show excellent thermal conductivity and dielectric strength voltage properties in which the thermal conductivity is equal to or greater than 5 kV.

As described above, in a case of using the resin layer as the buffer layer 250, it is also desirable to use a reflective layer containing ceramic particles using a resin binder as the reflective layers 12 and 312. In order to use a glass binder, it is necessary to reduce damage due to heat applied to the resin layer containing the buffer layer 250 by setting the drying and firing temperature to be equal to or lower than 300° C., desirably equal to or lower than 250° C.

[Additional Configuration]

As shown in Embodiments 1 to 4, as advantages of forming a dense high-quality ceramic layer on the metal base by using the AD method, long-term reliability is improved, in addition to heat radiating properties and dielectric strength voltage properties. A ceramic layer functions as a buffer layer for reducing a difference in coefficients of linear expansion between the light emitting element and the metal base, and lifetime of the flip-chip type light emitting elements can be improved.

More specifically, it is possible to prevent a decrease in lifetime of the light emitting elements by interposing a thick ceramic layer formed of alumina between the metal base and the light emitting element. Sapphire or aluminum nitride is used as a base substrate of a blue light emitting element and a green light emitting element, and silicon (Si) or the like is used as a base substrate of a red light emitting element, in many cases. When metal is compared with sapphire, aluminum nitride, and silicon, a difference in coefficients of linear expansion is great. Accordingly, when expansion and contraction of the metal base occurring due to temperature history are transmitted to the face-up type light emitting elements or the flip-chip type light emitting elements mounted on the metal base, loads are applied to light emitting elements and this is a main reason for a decrease in lifetime of the light emitting elements.

However, a difference in coefficients of linear expansion between the ceramic layer, and sapphire, aluminum nitride, and silicon aluminum nitride, and silicon which are base substrates of light emitting elements, is small. Particularly, in a case where an alumina layer is used as the ceramic layer, the coefficient of linear expansion thereof coincides with the coefficient of linear expansion of sapphire which is a base substrate of a blue light emitting element. Accordingly, when a dense high-quality ceramic layer formed on the metal base by using the AD method is interposed between the metal base and the light emitting element, particularly, when a thick ceramic layer is formed, the ceramic layer absorbs expansion and contraction of the metal base and loads of expansion and contraction caused by the metal base are not transmitted to the flip-chip type light emitting elements. As a result, a decrease in lifetime caused by external expansion and contraction does not occur in the light emitting elements and it is possible to ensure long-term reliability of the light emitting device. The thermal conductivity of the ceramic layer formed by using the AD method is higher than the thermal conductivity of the ceramic layer using a binder, and heat radiating properties are not decreased, even with a thick ceramic layer is formed for achieving the objects described above.

In a substrate for light emitting devices using a typical metal base of the related art as a base, it is necessary that sintering is performed at a temperature lower than a melting point of the metal base and an insulator layer is formed on the metal base. Accordingly, it is difficult to obtain a dense high-quality insulator layer without special high-melting-point metal such as molybdenum, tantalum, or tungsten. Therefore, an insulator layer having a comparatively great thickness is formed on the metal base, in order to ensure desired dielectric strength voltage properties. In a case where face-up type light emitting elements are mounted on such a substrate for light emitting devices, heat leaks in the order of the light emitting elements, the insulator layer having a comparatively great thickness, the metal base, and a heat sink for heat radiating including the substrate for light emitting devices mounted thereon, and thus, heat radiating properties are deteriorated due to disturbance of the insulator layer having a comparatively great thickness.

In a case where an electrode pattern for mounting light emitting elements is formed on the substrate for light emitting devices and an electrode pad of flip-chip type light emitting elements is directly bonded to an electrode terminal, heat leaks in the order of the light emitting elements, the electrode of the light emitting element, the wiring pattern, the insulator layer having a comparatively great thickness, and the metal base, and thus, heat radiating properties are deteriorated due to disturbance of the insulator layer having a comparatively great thickness.

The wiring pattern formed on the insulator layer is normally configured with metal paste for an electrode base and a plating layer. In a case of flip-chip type light emitting elements used by mounting the light emitting elements on an electrode pattern, the wiring pattern is not simply a path for supplying power, but a main heat radiating path, as described above. Thermal conductivity of the metal paste for an electrode base is generally low, and accordingly, the wiring pattern configured with the metal paste for the electrode base and the plating layer becomes a reason of an increase in heat resistance of the substrate for light emitting devices.

When flip-chip type light emitting elements are used in the substrate for light emitting devices of the related art using a metal base as a base, the lifetime of the light emitting elements may decrease due to a difference between a coefficient of linear expansion of the metal base and a coefficient of linear expansion of the light emitting element. In order to prevent this problem, a metal having a small coefficient of linear expansion, for example, an expensive metal such as molybdenum can only be used as the metal base.

In order to manufacture a substrate for light emitting devices using a metal base formed of typical metal excluding special high-melting-point metal such as molybdenum, tantalum, or tungsten, as a base, it is necessary that a high-quality insulating layer satisfying both of ensuring of electrical insulating properties and a decrease in heat resistance is formed on the metal base at a temperature which is sufficiently lower than a melting point of the metal used as a base. However, in the substrate for light emitting devices of the related art, it was difficult to satisfy the above-mentioned requirements and to ensure mass productivity of the substrate for light emitting devices.

Meanwhile, in the substrate for light emitting devices and the manufacturing method of the substrate for light emitting devices of the invention, the insulating layer (first insulating layer) formed of ceramic by using the AD method is formed on a surface of at least one side of the base formed of a metal material. The insulating layer (first insulating layer) formed of ceramic by using the AD method has insulating properties and thermal conductivity which are equivalent to those of an insulating layer of the related art which is formed of ceramic obtained by performing sintering. The insulating layer (first insulating layer) formed of ceramic by using the AD method is a dense high-quality ceramic layer, and accordingly, desired dielectric strength voltage properties can be realized with a comparatively small layer thickness.

In the substrate for light emitting devices of the invention, it is possible to further decrease heat resistance of the substrate and ensure excellent heat radiating properties necessary for a substrate for high-intensity light emitting devices, from a thin thickness of the insulating layer (first insulating layer) and high thermal conductivity of the insulating layer (first insulating layer) formed by using the AD method.

By forming a wiring pattern on the first insulating layer, it is possible to realize excellent heat radiating properties without interposing a high-resistivity layer having low thermal conductivity between the first insulating layer and the wiring pattern.

In addition, in the substrate for light emitting devices and the manufacturing method of the substrate for light emitting devices of the invention, regarding the problem of a decrease of the lifetime of the light emitting element due to a difference between a coefficient of linear expansion of the metal base and a coefficient of linear expansion of the light emitting element, the insulating layer (first insulating layer) formed of dense high-quality ceramic by using the AD method is interposed between the light emitting element and the metal base as an intermediate layer, so that the insulating layer (first insulating layer) as the intermediate layer having a coefficient of linear expansion similar to that of the light emitting element formed of a sapphire substrate is operated as a buffer layer, and therefore, it is possible to prevent a decrease in the lifetime of the light emitting element caused by expansion and contraction of the metal base. In addition, a range of selection of kinds of the metal material which can be used as the metal base is widened.

In the substrate for light emitting devices and the manufacturing method of the substrate for light emitting devices of the invention, since the insulating layer (first insulating layer) is formed of ceramic by using the AD method, the dense high-quality insulating layer (first insulating layer) can be formed even on a base formed of a metal material having a melting point lower than a sintering temperature of ceramic. Therefore, it is possible to realize a substrate for light emitting devices having excellent mass productivity and the manufacturing method of the substrate for light emitting devices.

In the substrate for light emitting devices and the manufacturing method of the substrate for light emitting devices of the invention, since a second insulating layer having light reflectivity is formed on the first insulating layer and the wiring pattern is formed on the second insulating layer, it is possible to realize a substrate for light emitting devices having high reflectivity and a manufacturing method of the substrate for light emitting devices.

In the substrate for light emitting devices and the manufacturing method of the substrate for light emitting devices of the invention, since the second insulating layer having light reflectivity which is formed on the first insulating layer and on some parts of the wiring pattern, is formed so that some parts of the wiring pattern are exposed, it is possible to realize a substrate for light emitting devices having high reflectivity and a manufacturing method of the substrate for light emitting devices.

In the substrate for light emitting devices and the manufacturing method of the substrate for light emitting devices of the invention, the insulating layer (first insulating layer) is a layer formed of ceramic, it is possible to realize a substrate for light emitting devices having long-term reliability containing heat resistance and light resistance.

As described above, according to this configuration of the invention, it is possible to realize a substrate for light emitting devices high reflectivity, high heat radiating properties, dielectric strength voltage properties, long-term reliability with heat resistance and light resistance, and excellent mass productivity, and a manufacturing method of the substrate for light emitting devices.

SUMMARY

According to a first aspect of the invention, there is provided a substrate for light emitting devices (substrate 5) including: a base (aluminum base 10) containing a metal material; a first insulating layer (intermediate layer 11) having thermal conductivity which is formed on one surface (front surface) of the base (aluminum base 10); a second insulating layer (reflective layer 12) having light reflectivity which is formed on the first insulating layer (intermediate layer 11); and a wiring pattern (electrode pattern 14) which is formed on the second insulating layer (reflective layer 12), in which the first insulating layer (intermediate layer 11) is formed of ceramic which is formed by using an aerosol deposition method and reinforces dielectric strength voltage properties of the second insulating layer (reflective layer 12).

According to the configuration described above, since the first insulating layer is formed on one surface of the base containing a metal material by using the aerosol deposition method, it is possible to easily form a flat and dense ceramic layer. Accordingly, it is possible to provide a substrate for light emitting devices capable of stably ensuring high dielectric strength voltage properties and light reflectivity with a combination with the second insulating layer and realizing high thermal conductivity with lower heat resistance.

According to a second aspect of the invention, there is provided a substrate for light emitting devices (substrate 5A) including: a base (aluminum base 10) containing a metal material; a first insulating layer (insulating reflective layer 24) having thermal conductivity and light reflectivity which is formed on one surface (front surface) of the base (aluminum base 10); and a wiring pattern (electrode pattern 14) which is formed on the first insulating layer (insulating reflective layer 24), in which the first insulating layer (insulating reflective layer 24) contains ceramic formed by using the aerosol deposition method and an additive of an inorganic material for improving brightness.

According to the configuration described above, since the first insulating layer is formed on one surface of the base containing a metal material by using the aerosol deposition method, it is possible to easily form a flat and dense ceramic layer. Accordingly, it is possible to provide a substrate for light emitting devices capable of stably ensuring high dielectric strength voltage properties and light reflectivity and realizing high thermal conductivity with lower heat resistance.

According to a third aspect of the invention, there is provided a substrate for light emitting devices (substrate 5) including: a base (aluminum base 10) containing a metal material; a first insulating layer (intermediate layer 11) having thermal conductivity which is formed on one surface (front surface) of the base (aluminum base 10); a second insulating layer (reflective layer 12) having thermal conductivity and light reflectivity which is formed on the first insulating layer (intermediate layer 11); and a wiring pattern (electrode pattern 14) which is formed on the second insulating layer (reflective layer 12), in which first insulating layer (intermediate layer 11) is formed of ceramic which is formed by using the aerosol deposition method, the second insulating layer (reflective layer 12) contains ceramic which is formed by using the aerosol deposition method, and the second insulating layer (reflective layer 12) further contains an additive of an inorganic material for improving brightness, or all of a ceramic layer of the second insulating layer (reflective layer 12) which is formed by using the aerosol deposition method is configured with ceramic having high brightness.

According to the configuration described above, since the first insulating layer is formed on one surface of the base containing a metal material by using the aerosol deposition method, it is possible to easily form a flat and dense ceramic layer. Accordingly, it is possible to provide a substrate for light emitting devices capable of stably ensuring high dielectric strength voltage properties and light reflectivity with a combination with the second insulating layer and realizing high thermal conductivity with lower heat resistance.

According to a fourth aspect of the invention, there is provided a substrate for light emitting devices (substrate 5B) including: a base (aluminum base 10) containing a metal material; a first insulating layer (reflective layer 12) having light reflectivity which is formed on one surface (front surface) of the base (aluminum base 10); a second insulating layer (protective insulating layer 25) having light reflectivity which is formed on the other surface (rear surface) of the base (aluminum base 10); and a wiring pattern (electrode pattern 14) which is formed on the first insulating layer (reflective layer 12), in which the second insulating layer (protective insulating layer 25) is formed of ceramic which is formed by using an aerosol deposition method and reinforces dielectric strength voltage properties of the first insulating layer (reflective layer 12).

According to the configuration described above, since the second insulating layer is formed on the other surface of the base containing a metal material by using the aerosol deposition method, it is possible to easily form a flat and dense ceramic layer. Accordingly, it is possible to provide a substrate for light emitting devices capable of stably ensuring high dielectric strength voltage properties and light reflectivity with a combination with the first insulating layer and realizing high thermal conductivity with lower heat resistance.

According to a fifth aspect of the invention, there is provided a substrate for light emitting devices (substrate 320) including: a base (base 302) containing a metal material; a first insulating layer (intermediate layer 311) having thermal conductivity which is formed on one surface (front surface) of the base (base 302); a wiring pattern (electrode pattern 303) which is formed on the first insulating layer (intermediate layer 311); and a second insulating layer (reflective layer 312) having light reflectivity which is formed on the first insulating layer (intermediate layer 311) and on some remaining parts of the wiring pattern (electrode pattern 303) so that some parts of the wiring pattern (electrode pattern 303) are exposed.

According to the configuration described above, according to the configuration described above, since the first insulating layer is formed on one surface of the base containing a metal material by using the aerosol deposition method, it is possible to easily form a flat and dense ceramic layer. Accordingly, it is possible to provide a substrate for light emitting devices capable of stably ensuring high dielectric strength voltage properties and light reflectivity with a combination of the first insulating layer and the second insulating layer and realizing high thermal conductivity with lower heat resistance.

According to a sixth aspect of the invention, in the substrate for light emitting devices (substrate 5, 5A, 5B, 320) according to any one of the first to fifth aspects, a buffer layer 250 formed of a material having a coefficient of linear expansion smaller than that of the base (aluminum base 10) may be formed between the base (aluminum base 10) and the first insulating layer (intermediate layer 11, insulating reflective layer 24, reflective layer 12). According to the configuration described above, since transmission of mechanical loads due to thermal expansion and contraction of the base to the light emitting elements can be significantly reduced, it is possible to increase the lifetime of the light emitting device and to improve reliability. In addition, the buffer layer 250 formed of a material having a coefficient of linear expansion smaller than that of the base and a coefficient of linear expansion greater than that of the first insulating layer (intermediate layer 11, insulating reflective layer 24, reflective layer 12) may be formed.

According to a seventh aspect of the invention, in the substrate for light emitting devices (substrate 5, 5A, 5B, 320) according to any one of the first to sixth aspects, the base (aluminum base 10) may contain an aluminum material or a copper material.

According to the configuration described above, it is possible to obtain a light-weight base having excellent workability and high thermal conductivity.

According to an eighth aspect of the invention, in the substrate for light emitting devices (substrate 5, 5A, 5B, 320) according to any one of the first to fifth aspects, the wiring pattern (electrode pattern 14, 303) may be formed by patterning a metal conductive layer 324 which is formed by using the aerosol deposition method or thermal spraying.

According to the configuration described above, it is possible to simply form the wiring pattern by using the aerosol deposition method or the thermal spraying.

According to a ninth aspect of the invention, in the substrate for light emitting devices (substrate 5, 5A, 5B, 320) according to the eighth aspect, the metal conductive layer 324 may contain copper as a material.

According to the configuration described above, it is possible to obtain a wiring pattern having excellent conductivity.

According to a tenth aspect of the invention, in the substrate for light emitting devices (substrate 5, 5B, 320) according to any one of the first and third to fifth aspects, the thermal conductivity of the first insulating layer (intermediate layer 11, protective insulating layer 25, intermediate layer 311) may be higher than the thermal conductivity of the second insulating layer (reflective layer 12, 312), and the second insulating layer (reflective layer 12, 312) may be a mixed layer of ceramic and a vitreous matter, a mixed layer of ceramic and a resin, or ceramic formed by using an aerosol deposition method or thermal spraying.

According to the configuration described above, the first insulating layer can obtain dielectric strength voltage properties which is equivalent to or higher than that of a layer formed by using a glass binder or a resin binder, without decreasing the original thermal conductivity of the ceramic material.

According to an eleventh aspect of the invention, in the substrate for light emitting devices (substrate 5) according to the first and third aspects, the thickness of the first insulating layer (intermediate layer 11) may be from 50 µm to 1000 µm and the thickness of the second insulating layer (reflective layer 12) may be from 10 µm to 100 µm.

According to the configuration described above, a thickness of the second insulating layer can be set as a minimum thickness necessary for ensuring the light reflecting function, and dielectric strength voltage properties which are insufficiently obtained by only the second insulating layer can be reinforced by the first insulating layer.

According to a twelfth aspect of the invention, in the substrate for light emitting devices (substrate 5A) according to the second aspect, the thickness of the first insulating layer (insulating reflective layer 24) may be from 50 µm to 1000 µm.

According to the configuration described above, it is possible to form the first insulating layer having high reflectivity and excellent dielectric strength voltage properties.

According to a thirteenth aspect of the invention, in the substrate for light emitting devices (substrate 5B) according to the fourth aspect, the thickness of the first insulating layer (protective insulating layer 25) may be equal to or greater than 50 µm, and the thickness of the second insulating layer (reflective layer 12) may be from 10 µm to 100 µm.

According to the configuration described above, it is possible to realize high reflectivity by using the second insulating layer and obtain excellent dielectric strength voltage properties by using the first insulating layer.

According to a fourteenth aspect of the invention, in the substrate for light emitting devices (substrate 320) according to the fifth aspect, the thickness of the first insulating layer (intermediate layer 311) may be from 50 µm to 1000 µm and the thickness of the second insulating layer (reflective layer 312) may be from 10 µm to 300 µm.

According to the configuration described above, it is possible to ensure a light reflecting function of the second insulating layer while realizing dielectric strength voltage properties of the first insulating layer.

According to a fifteenth aspect of the invention, in the substrate for light emitting devices (substrate 5, 5A, 5B, 320) according to any one of the first to fifth aspects, the substrate may further include a protective layer 13 which is formed at least a part of a region other than a region where the first insulating layer (intermediate layer 11, insulating reflective layer 24, protective insulating layer 25) of the base is formed.

According to the configuration described above, durability and corrosion resistance of the base are more reliably obtained.

According to a sixteenth aspect of the invention, in the substrate for light emitting devices (substrate 5, 5A, 5B, 320) according to the fourteenth aspect, the base (aluminum base 10) may be an aluminum material and the protective layer (protective layer 13) may be an alumite layer subjected to sealing treatment.

According to the configuration described above, the aluminum anodic oxidation coating for forming the protective layer is stabilized. Therefore, durability and corrosion resistance of the base are more reliably obtained by using the protective layer.

According to a seventeenth aspect of the invention, in the substrate for light emitting devices (substrate 5, 5B, 320) according to any one of the first and third to fifth aspects, the first insulating layer (intermediate layer 11, 311, protective insulating layer 25) may contain an alumina layer, and the second insulating layer (reflective layer 12, 312) may be formed by covering at least any one of ceramic particles of zirconia particles, titanium oxide particles, alumina particles, and aluminum nitride particles with a vitreous matter.

According to the configuration described above, excellent heat resistance and light resistance and high thermal conductivity are obtained by using a glass binder, compared to a resin binder.

According to an eighteenth aspect of the invention, in the substrate for light emitting devices (substrate 5, 5B, 320) according to any one of the first and third to fifth aspects, the first insulating layer may contain an alumina layer, the second insulating layer may contain a resin containing at least any one of ceramic particles of zirconia particles, titanium oxide particles, alumina particles, and aluminum nitride particles, and the resin may contain any one resin of a silicone resin, a fluorine resin, an epoxy resin, and a polyimide resin.

According to the configuration described above, it is possible to form a second insulating layer having excellent heat resistance and light resistance and high transparency.

According to a nineteenth aspect of the invention, there is provided a light emitting device 4, 301 including: the substrate for light emitting devices (substrate 5, 5A, 5B, 320) according to any one of the first to fifth aspects; light emitting elements 6, 304; lands or connectors (positive electrode connector 17 and negative electrode connector 18) for connecting the light emitting elements 6, 304 to an external wiring or an external device; a frame 8 (light-reflecting resin frame 305) formed of a resin having light reflectivity which is formed so as to surround a region of the substrate for light emitting devices (substrate 5, 5A, 5B, 320) where the light emitting elements 6, 304 are disposed; and a sealing resin 7 (phosphor-containing sealing resin 306) which seals the region surrounded by the frame 8 (light-reflecting resin frame 305).

According to a twentieth aspect of the invention, there is provided a manufacturing method of a substrate for light emitting devices (substrate 5) including: a preparation step of preparing a base (aluminum base 10) containing a metal material; a first insulating layer formation step of forming a first insulating layer (intermediate layer 11) having thermal conductivity on one surface (front surface) of the base (aluminum base 10); a second insulating layer formation step of forming a second insulating layer (reflective layer 12) having light reflectivity on the first insulating layer (intermediate layer 11); and a wiring pattern formation step of forming a wiring pattern (electrode pattern 14) on the second insulating layer (reflective layer 12), in which the first insulating layer (intermediate layer 11) is formed of ceramic formed by using an aerosol deposition method and reinforces dielectric strength voltage properties of the second insulating layer (reflective layer 12).

According to a twenty first aspect of the invention, there is provided a manufacturing method of a substrate for light emitting devices (substrate 5A) including: a preparation step of preparing a base (aluminum base 10) containing a metal material; a first insulating layer formation step of forming a first insulating layer (insulating reflective layer 24) having thermal conductivity and light reflectivity on one surface (front surface) of the base (aluminum base 10); and a wiring pattern formation step of forming a wiring pattern (electrode pattern 14) on the first insulating layer (insulating reflective layer 24), in which the first insulating layer (insulating reflective layer 24) contains ceramic formed by using the aerosol deposition method and an additive of an inorganic material for improving brightness.

According to a twenty second aspect of the invention, there is provided a manufacturing method of a substrate for light emitting devices (substrate 5) including: a preparation step of preparing a base (aluminum base 10) containing a metal material; a first insulating layer formation step of forming a first insulating layer (intermediate layer 11) having thermal conductivity on one surface (front surface) of the base (aluminum base 10); a second insulating layer formation step of forming a second insulating layer (reflective layer 12) having thermal conductivity and light reflectivity on the first insulating layer (intermediate layer 11); and a wiring pattern formation step of forming a wiring pattern (electrode pattern 14) on the second insulating layer (reflective layer 12), in which the first insulating layer (intermediate layer 11) is formed of ceramic formed by using an aerosol deposition method, the second insulating layer (reflective layer 12) contains ceramic which is formed by using the aerosol deposition method, and the second insulating layer (reflective layer 12) further contains an additive of an inorganic material for improving brightness, or all of a ceramic layer of the second insulating layer (reflective layer 12) which is formed by using the aerosol deposition method is configured with ceramic having high brightness.

According to a twenty third aspect of the invention, there is provided a manufacturing method of a substrate for light emitting devices (substrate 5B) including: a preparation step of preparing a base (aluminum base 10) containing a metal material; a first insulating layer formation step of forming a first insulating layer (protective insulating layer 25) having thermal conductivity on one surface (rear surface) of the base (aluminum base 10); a second insulating layer formation step of forming a second insulating layer (reflective layer 12) having light reflectivity on the other surface (front surface) of the base (aluminum base 10); and a wiring pattern formation step of forming a wiring pattern (electrode pattern 14) on the second insulating layer (reflective layer 12), the first insulating layer (protective insulating layer 25) is formed of ceramic which is formed by using an aerosol deposition method and reinforces dielectric strength voltage properties of the second insulating layer (reflective layer 12).

According to a twenty fourth aspect of the invention, there is provided a manufacturing method of a substrate for light emitting devices (substrate 320) including: a preparation step of preparing a base 302 containing a metal material; a first insulating layer formation step of forming a first insulating layer (intermediate layer 311) having thermal conductivity on one surface (front surface) of the base 302; a wiring pattern formation step of forming a wiring pattern (electrode pattern 303) on the first insulating layer (intermediate layer 311); and a second insulating layer formation step of forming a second insulating layer (reflective layer 312) having light reflectivity on the first insulating layer (intermediate layer 311) and on some remaining parts of the wiring pattern (electrode pattern 303) so that some parts of the wiring pattern (electrode pattern 303) are exposed, in which the first insulating layer is formed of ceramic which is formed by using an aerosol deposition method.

According to a twenty fifth aspect of the invention, in the manufacturing method of the substrate for light emitting devices (substrate 5, 5A, 5B, 320) according to any one of the twentieth to twenty fourth aspects, the first insulating layer (intermediate layer 11, 311, insulating reflective layer 24, protective insulating layer 25) may contain alumina, and the first insulating layer (intermediate layer 11, 311, insulating reflective layer 24, protective insulating layer 25) may be formed by using the aerosol deposition method in the first insulating layer formation step.

According to a twenty sixth aspect of the invention, in the manufacturing method of the substrate for light emitting devices (substrate 5, 5A, 5B, 320) according to any one of the twentieth to twenty fourth aspects, the wiring pattern (electrode pattern 14, 303) may be formed by patterning a metal conductive layer which is formed by using the aerosol deposition method or thermal spraying, and the metal conductive layer may contain copper or silver.

According to a twenty seventh aspect of the invention, in the manufacturing method of the substrate for light emitting devices (substrate 5, 5B, 320) according to any one of the twentieth, twenty third, and twenty fourth aspects, the second insulating layer (reflective layer 12, 312) may be a mixed layer of ceramic particles and a vitreous matter and the vitreous matter may be formed by a sol-gel reaction of a glass raw material.

According to a twenty eighth aspect of the invention, in the manufacturing method of the substrate for light emitting devices (substrate 5, 5B, 320) according to any one of the twentieth, twenty third, and twenty fourth aspects, the second insulating layer (reflective layer 12, 312) may be a mixed layer of ceramic particles and the vitreous matter, and the vitreous matter may be formed by melting and re-hardening of the vitreous matter.

According to a twenty ninth aspect of the invention, in the manufacturing method of the substrate for light emitting devices (substrate 5, 5B, 320) according to any one of the twentieth, twenty third, and twenty fourth aspects, the second insulating layer (reflective layer 12, 312) may be a mixed layer of ceramic particles and a resin, and the mixed layer may be formed by printing or applying and then hardening a resin containing ceramic particles.

According to a thirtieth aspect of the invention, there is provided a lighting device 1 including: the light emitting device 4, 301 according to the nineteenth aspect; a heat sink 2 for radiating heat generated from the light emitting device 4, 301; and a reflector 3 which reflects light emitted from the light emitting device 4, 301.

The first insulating layer and the second insulating layer are an electric insulating layer.

The invention is not limited to the embodiments described above, various modifications can be performed within a range shown in claims, and embodiments obtained by suitably combining technical means disclosed in different embodiments are contained in the technical scope of the invention. In addition, new technical features can be formed by combining technical means disclosed in the embodiments.

INDUSTRIAL APPLICABILITY

The substrate for light emitting devices according to the invention can be used as a substrate for various light emitting devices. The light emitting device according to the invention can be used, particularly, as a high-intensity LED light emitting device. In the manufacturing method of the substrate for light emitting devices according to the invention, the substrate for light emitting devices having excellent dielectric strength voltage properties and heat radiating properties can be manufactured by using a method having excellent productivity.

REFERENCE SIGNS LIST

1 LIGHTING DEVICE
2 HEAT SINK
3 REFLECTOR
4 LIGHT EMITTING DEVICE
5 SUBSTRATE (SUBSTRATE FOR LIGHT EMITTING DEVICES)
6 LIGHT EMITTING ELEMENT
7 SEALING RESIN
7 FRAME
10 ALUMINUM BASE (BASE)
11 INTERMEDIATE LAYER (FIRST INSULATING LAYER)
12 REFLECTIVE LAYER (SECOND INSULATING LAYER, FIRST INSULATING LAYER)
13 PROTECTIVE LAYER
14 ELECTRODE PATTERN (WIRING PATTERN)
15 POSITIVE ELECTRODE PATTERN (WIRING PATTERN)
16 NEGATIVE ELECTRODE PATTERN (WIRING PATTERN)
17 POSITIVE ELECTRODE CONNECTOR
18 NEGATIVE ELECTRODE CONNECTOR
19 BASE CIRCUIT PATTERN
24 INSULATING REFLECTIVE LAYER (FIRST INSULATING LAYER)
25 PROTECTIVE INSULATING LAYER (SECOND INSULATING LAYER)
250 BUFFER LAYER

The invention claimed is:

1. A substrate for light emitting devices, comprising:
a base containing a metal material;
a first insulating layer which is formed on one surface of the base; and
a wiring pattern which is formed on the first insulating layer, wherein
the first insulating layer is formed of ceramic which is formed by using an aerosol deposition method,
a buffer layer formed of a material having a coefficient of linear expansion smaller than that of the base is formed between the base and the first insulating layer, and
the first insulating layer has thermal conductivity and contains an additive of an inorganic material for improving brightness.

2. A substrate for light emitting devices, comprising:
a base containing a metal material;
a first insulating layer which is formed on one surface of the base;
a wiring pattern which is formed on the first insulating layer,
a second insulating layer having thermal conductivity and light reflectivity which is formed between the first insulating layer and the wiring pattern, wherein
the first insulating layer is formed of ceramic which is formed by using an aerosol deposition method,
a buffer layer formed of a material having a coefficient of linear expansion smaller than that of the base is formed between the base and the first insulating layer,
the first insulating layer has thermal conductivity,
the second insulating layer contains ceramic which is formed by using the aerosol deposition method, and
the second insulating layer further contains an additive of an inorganic material for improving brightness which is formed by using the aerosol deposition method and which is contained in the second insulating layer and is entirely ceramic having high brightness.

3. A substrate for light emitting devices, comprising:
a base containing a metal material;
a first insulating layer which is formed on one surface of the base; and
a wiring pattern which is formed on the first insulating layer,
a second insulating layer having light reflectivity which is formed between the first insulating layer and the wiring pattern, wherein
the first insulating layer is formed of ceramic which is formed by using an aerosol deposition method,
a buffer layer formed of a material having a coefficient of linear expansion smaller than that of the base is formed between the base and the first insulating layer,
the first insulating layer has thermal conductivity and reinforces dielectric strength voltage properties of the second insulating layer, and
the thermal conductivity of the first insulating layer is higher than the thermal conductivity of the second insulating layer, and
the second insulating layer is a mixed layer of ceramic and a vitreous matter or a mixed layer of ceramic and a resin.

4. A substrate for light emitting devices, comprising:
a base containing a metal material;
a first insulating layer having light reflectivity which is formed on one surface of the base;
a second insulating layer having thermal conductivity which is formed on the other surface of the base; and
a wiring pattern which is formed on the first insulating layer, wherein
the second insulating layer is formed of ceramic which is formed by using an aerosol deposition method and reinforces dielectric strength voltage properties of the first insulating layer,
a buffer layer formed of a material having a coefficient of linear expansion smaller than that of the base is formed between the base and the first insulating layer,
the thermal conductivity of the first insulating layer is higher than the thermal conductivity of the second insulating layer, and the second insulating layer is a mixed layer of ceramic and a vitreous matter or a mixed layer of ceramic and a resin.

* * * * *